US012527069B2

(12) United States Patent
Kim et al.

(10) Patent No.: US 12,527,069 B2
(45) Date of Patent: Jan. 13, 2026

(54) SEMICONDUCTOR DEVICE AND METHOD OF FABRICATING THE SAME

(71) Applicant: Samsung Electronics Co., Ltd., Suwon-si (KR)

(72) Inventors: Cheol Kim, Hwaseong-si (KR); Jongchul Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 911 days.

(21) Appl. No.: 17/683,589

(22) Filed: Mar. 1, 2022

(65) Prior Publication Data

US 2023/0028875 A1 Jan. 26, 2023

(30) Foreign Application Priority Data

Jul. 21, 2021 (KR) .......... 10-2021-0095982

(51) Int. Cl.
*H10D 84/03* (2025.01)
*H10D 84/01* (2025.01)
*H10D 84/85* (2025.01)

(52) U.S. Cl.
CPC ....... *H10D 84/038* (2025.01); *H10D 84/0172* (2025.01); *H10D 84/0184* (2025.01); *H10D 84/85* (2025.01)

(58) Field of Classification Search
CPC ............ H10D 84/038; H10D 84/0172; H10D 84/0184; H10D 84/85; H10D 30/43; H10D 30/6735; H10D 62/121; H10D 84/83; H10D 84/834; H10D 84/0193; H10D 84/0151; H10D 84/0135; H10D 84/0147; H10D 84/853; H10D 84/907; H10D 89/213; H10D 84/859; B82Y 10/00

USPC ......................................................... 257/369
See application file for complete search history.

(56) References Cited

U.S. PATENT DOCUMENTS

| | | |
|---|---|---|
| 8,946,793 B2 | 2/2015 | Xie et al. |
| 9,536,980 B1 | 1/2017 | Huang et al. |
| 10,217,869 B2 | 2/2019 | Cai et al. |
| 10,971,601 B2 | 4/2021 | Basker et al. |
| 2014/0363960 A1 | 12/2014 | Kim et al. |

(Continued)

FOREIGN PATENT DOCUMENTS

| | | |
|---|---|---|
| KR | 20140142957 A | 12/2014 |
| KR | 20150137428 A | 12/2015 |
| KR | 20160028077 A | 3/2016 |

*Primary Examiner* — Mohammad M Hoque
(74) *Attorney, Agent, or Firm* — Wolf, Greenfield & Sacks, P.C.

(57) ABSTRACT

A semiconductor device includes a substrate including a first active pattern and a second active pattern, a gate electrode including a first gate electrode on the first active pattern and a second gate electrode on the second active pattern, a gate cutting pattern between the first and second gate electrodes, gate spacers on opposing side surfaces of the gate electrode, and a gate capping pattern on top surfaces of the gate electrode, the gate cutting pattern, and the gate spacers and extending in the first direction. The gate cutting pattern includes a first and second side surfaces, which are opposite to each other in a second direction crossing the first direction. The first and side surfaces are in contact with respective ones of the gate spacers, and the top surface of the gate cutting pattern is closer to the substrate than the top surfaces of the pair of gate spacers.

19 Claims, 49 Drawing Sheets

(56) References Cited

U.S. PATENT DOCUMENTS

| | | |
|---|---|---|
| 2015/0349073 A1 | 12/2015 | Kang |
| 2016/0033619 A1 | 2/2016 | Calvarese et al. |
| 2016/0064378 A1 | 3/2016 | Kwon et al. |
| 2016/0086947 A1* | 3/2016 | Park ................ H10D 89/10 257/369 |
| 2016/0276224 A1 | 9/2016 | Gan et al. |
| 2016/0336194 A1 | 11/2016 | Yeh et al. |
| 2017/0025511 A1* | 1/2017 | Lee ................ H10D 84/83 |
| 2020/0043945 A1 | 2/2020 | Kim et al. |
| 2020/0058785 A1* | 2/2020 | Tsai ................ H01L 21/76805 |
| 2020/0091345 A1 | 3/2020 | Chiu et al. |
| 2020/0168720 A1* | 5/2020 | Kwak ................ H10D 84/038 |
| 2020/0395356 A1 | 12/2020 | Shu et al. |
| 2021/0050350 A1* | 2/2021 | Hung ................ H10D 84/0151 |
| 2021/0119034 A1 | 4/2021 | Lian et al. |
| 2021/0233906 A1* | 7/2021 | Chen ................ H10D 84/0151 |
| 2022/0293600 A1 | 9/2022 | Kim et al. |
| 2024/0379819 A1* | 11/2024 | Wang ................ H10D 30/6211 |

* cited by examiner

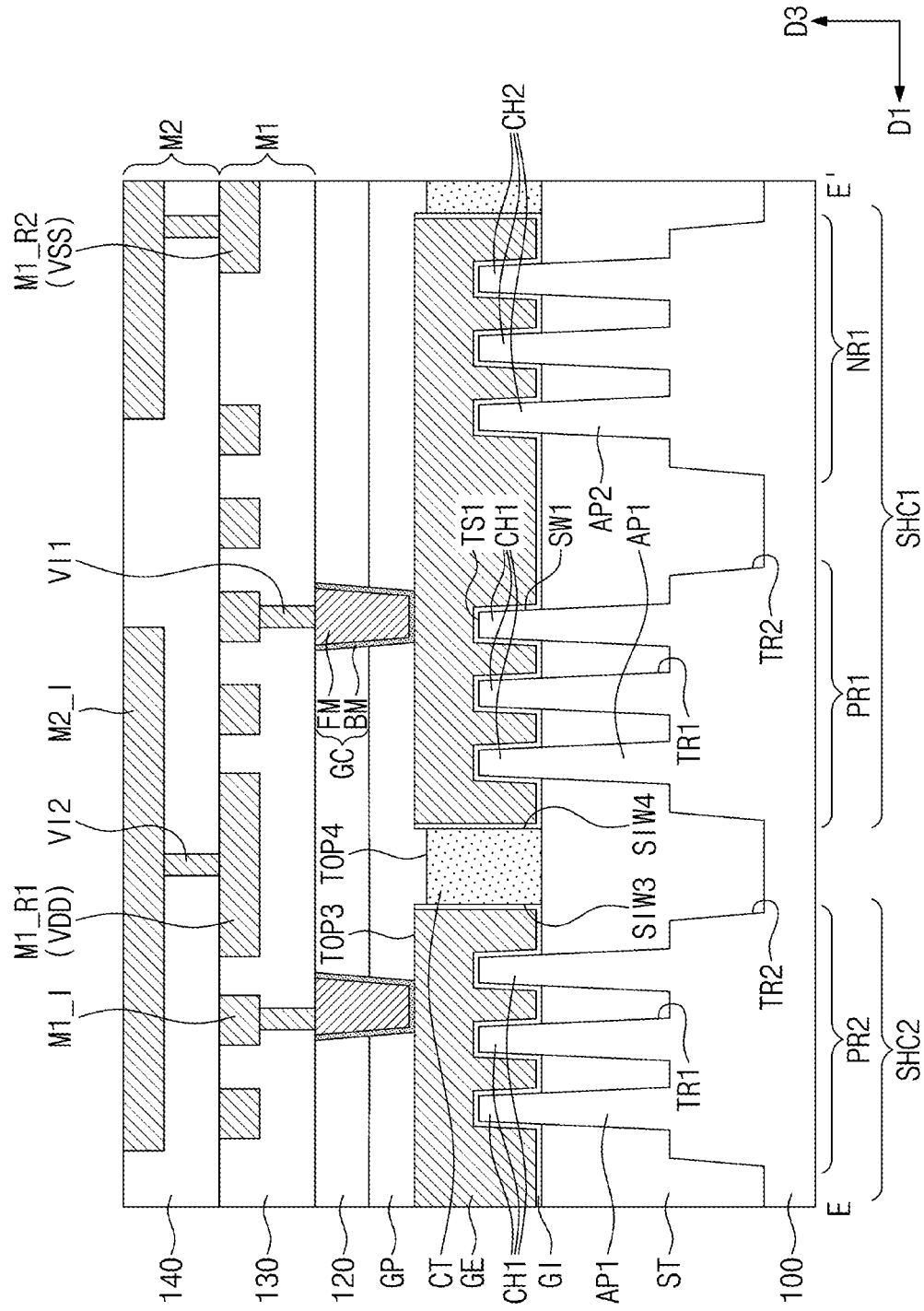

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0095982, filed on Jul. 21, 2021, in the Korean Intellectual Property Office, the entire contents of which are hereby incorporated by reference.

FIELD

The present disclosure relates to a semiconductor device and a method of fabricating the same, and in particular, to a semiconductor device including a field effect transistor and a method of fabricating the same.

BACKGROUND

Due to their small-size, multifunctionality, and/or low-cost characteristics, semiconductor devices are important elements in the electronics industry. Semiconductor devices can be classified into a semiconductor memory device for storing data, a semiconductor logic device for processing data, and a hybrid semiconductor device including both of memory and logic elements. As the electronic industry advances, there may be increasing demand for semiconductor devices with improved characteristics. For example, there may be increasing demand for semiconductor devices with high reliability, high performance, and/or multiple functions. To meet this demand, complexity and/or integration density of semiconductor devices may be increased.

SUMMARY

An embodiment of the inventive concept provides a semiconductor device with improved reliability and a method of fabricating the same.

According to an embodiment of the inventive concept, a semiconductor device may include a substrate comprising a first active pattern and a second active pattern; a gate electrode extending in a first direction crossing the first and second active patterns, the gate electrode comprising a first gate electrode on the first active pattern and a second gate electrode on the second active pattern; a gate cutting pattern extending between the first and second gate electrodes; gate spacers on opposing side surfaces of the gate electrode; and a gate capping pattern on a top surface of the gate electrode, a top surface of the gate cutting pattern, and top surfaces of the gate spacers and extending in the first direction. The gate cutting pattern comprises first and second side surfaces that are opposite to each other in a second direction crossing the first direction, and are in contact with respective ones of the gate spacers. The top surface of the gate cutting pattern is closer to the substrate than the top surfaces of the gate spacers.

According to an embodiment of the inventive concept, a semiconductor device may include a substrate comprising a first logic cell and a second logic cell adjacent to each other in a first direction; a first active pattern on the first logic cell and a second active pattern on the second logic cell; a first gate electrode on the first active pattern and a second gate electrode on the second active pattern, the second gate electrode being aligned with the first gate electrode in the first direction; a gate cutting pattern adjacent a boundary between the first and second logic cells and extending between the first and second gate electrodes; gate spacers extending in the first direction; and a gate capping pattern on the first and second gate electrodes and the gate cutting pattern, and extending in the first direction. The gate spacers extend on opposing side surfaces of the first gate electrode, opposing side surfaces of the second gate electrode, and opposing side surfaces of the gate cutting pattern. The gate capping pattern extends on a top surface of the first gate electrode, a top surface of the second gate electrode, and a top surface of the gate cutting pattern. Each of the gate spacers comprises a first gate spacer and a second gate spacer having a dielectric constant higher than the first gate spacer. The first gate spacer is between the gate cutting pattern and the second gate spacer, and the gate capping pattern is on a top surface of the first gate spacer and a top surface of the second gate spacer.

According to an embodiment of the inventive concept, a semiconductor device may include a substrate comprising a logic cell having a PMOSFET region and an NMOSFET region separated from each other in a first direction, a periphery of the logic cell comprising first and second boundaries opposite to each other in a second direction crossing the first direction, and third and fourth boundaries opposite to each other in the first direction; a device isolation layer on the substrate and defining a first active pattern on the PMOSFET region and a second active pattern on the NMOSFET region, the first and second active patterns extending in the second direction, an upper portion of each of the first and second active patterns protruding away from the substrate and beyond the device isolation layer; a gate electrode extending in the first direction and crossing the first and second active patterns; first and second source/drain patterns on the first and second active patterns, respectively; gate spacers on opposing side surfaces of the gate electrode and extending in the first direction; a division structure adjacent at least one of the first or second boundaries; a gate cutting pattern adjacent at least one of the third or fourth boundaries, wherein the gate cutting pattern extends between the gate spacers; a gate insulating layer between the gate electrode and the first and second active patterns and between the gate electrode and the gate cutting pattern; a gate capping pattern on a top surface of the gate electrode, a top surface of the gate cutting pattern, and top surfaces of the gate spacers and extending in the first direction; an interlayer insulating layer on the gate capping pattern; an active contact that penetrates the interlayer insulating layer and is electrically connected to at least one of the first or second source/drain patterns; a gate contact that penetrates the interlayer insulating layer and the gate capping pattern and is electrically connected to the gate electrode; a first metal layer on the interlayer insulating layer, the first metal layer comprising a power line vertically overlapping the gate cutting pattern, and first interconnection lines electrically connected to the active and gate contacts, respectively; and a second metal layer on the first metal layer. The second metal layer comprises second interconnection lines electrically connected to the first metal layer, the gate cutting pattern comprises a first side surface and a second side surface, which are opposite to each other in the second direction and are in contact with respective ones of the gate spacers, and the top surface of the gate cutting pattern is closer to the substrate than the top surfaces of the gate spacers.

According to an embodiment of the inventive concept, a method of fabricating a semiconductor device may include forming a first active pattern and a second active pattern on a substrate; forming a sacrificial pattern that cross the first and second active patterns and extend in a first direction; forming gate spacers on opposing side surfaces of the sacrificial pattern, each of the gate spacers comprising a first gate spacer and a second gate spacer having a dielectric constant higher than the first gate spacer; recessing the sacrificial pattern; recessing the first gate spacer that is exposed by the recessing of the sacrificial pattern; forming a gate cutting pattern to penetrate the sacrificial pattern; replacing the sacrificial pattern with a gate electrode; recessing the second gate spacer and the gate cutting pattern; and forming a gate capping pattern on the gate electrode, the gate cutting pattern, the first gate spacer, and the second gate spacer.

BRIEF DESCRIPTION OF THE DRAWINGS

FIGS. 5A, 5B, 5C, 5D, and 5E are sectional views, which are respectively taken along lines A-A', B-B', C-C', D-D', and E-E' of FIG. 4.

DETAILED DESCRIPTION

Example embodiments of the inventive concepts will now be described more fully with reference to the accompanying drawings, in which example embodiments are shown.

Figure 1:
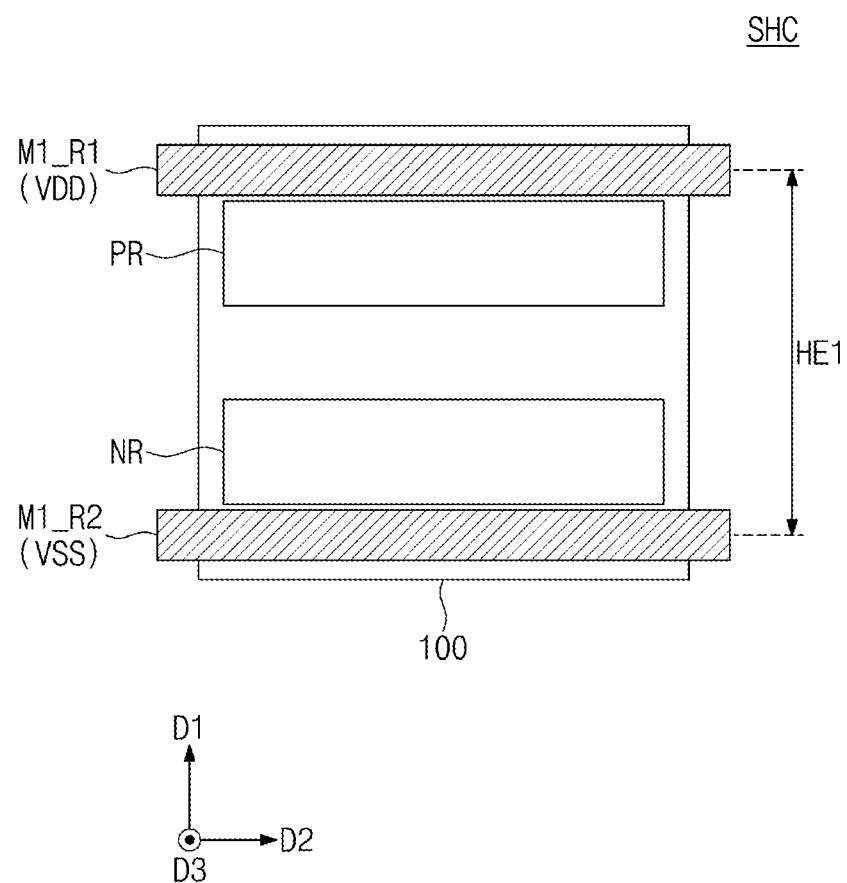
FIGS. 1 to 3 are conceptual diagrams illustrating logic cells of a semiconductor device according to an embodiment of the inventive concept.
Figure 2:
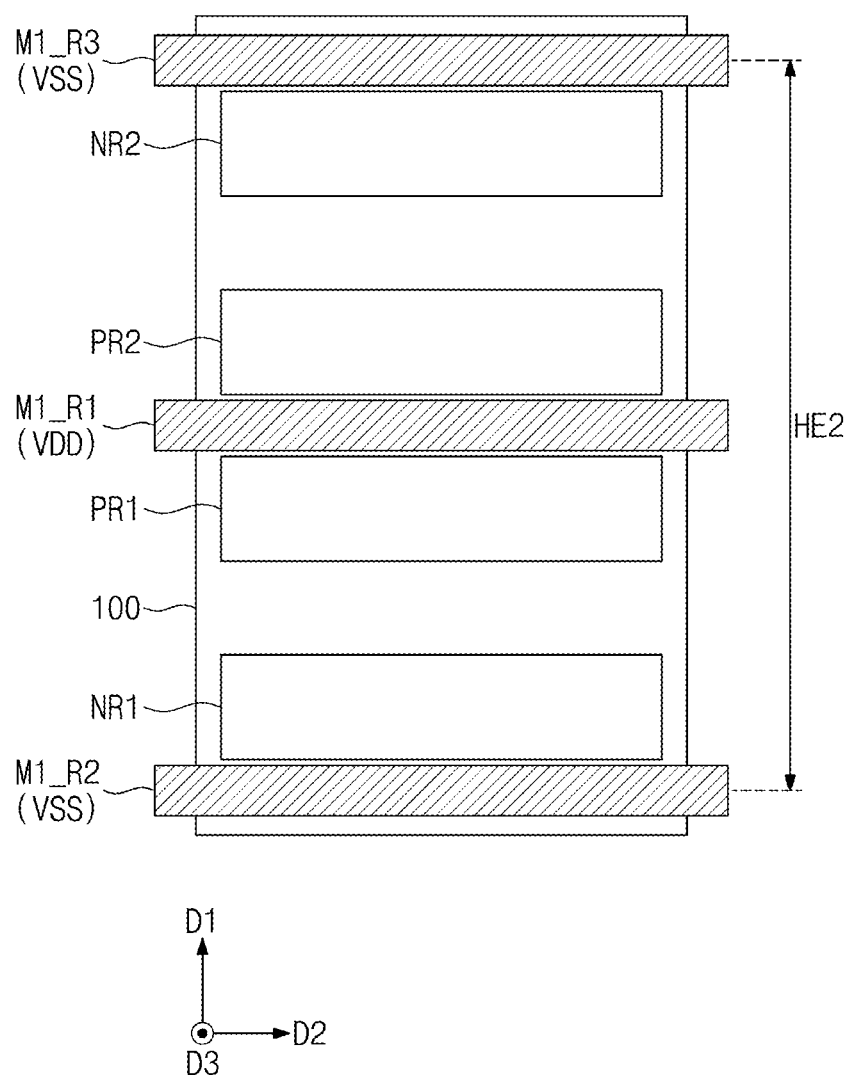
Figure 3:
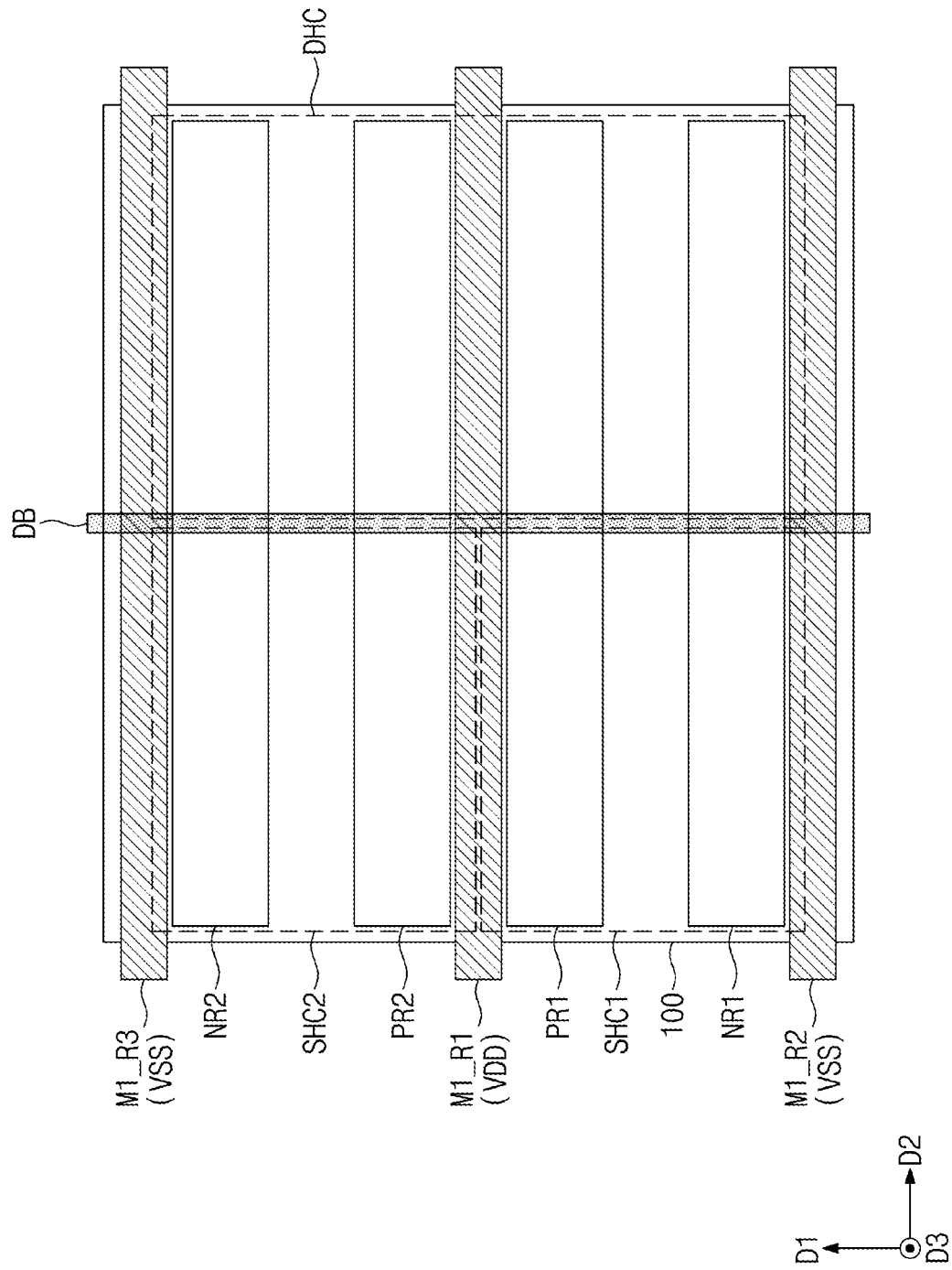

FIGS. 1 to 3 are conceptual diagrams illustrating logic cells of a semiconductor device according to an embodiment of the inventive concept.

Referring to FIG. 1, a single height cell SHC may be provided. In detail, a first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided. The terms first, second, third, etc. may be used herein merely to distinguish one element from another.

The single height cell SHC may be defined between the first power line M1_R1 and the second power line M1_R2. The single height cell SHC may include one PMOSFET region PR and one NMOSFET region NR. In other words, the single height cell SHC may have a CMOS structure provided between the first and second power lines M1_R1 and M1_R2.

In an embodiment, the PMOSFET region PR and the NMOSFET region NR may have the same width in a first direction D1. In an embodiment, the PMOSFET region PR and the NMOSFET region NR may have different widths from each other in the first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, the first power line M1_R1, the second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the drain voltage VSS is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region.

Thus, a channel size of a PMOS transistor of the double height cell DHC may be greater than a channel size of a PMOS transistor of the single height cell SHC previously described with reference to FIG. 1. For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and a double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
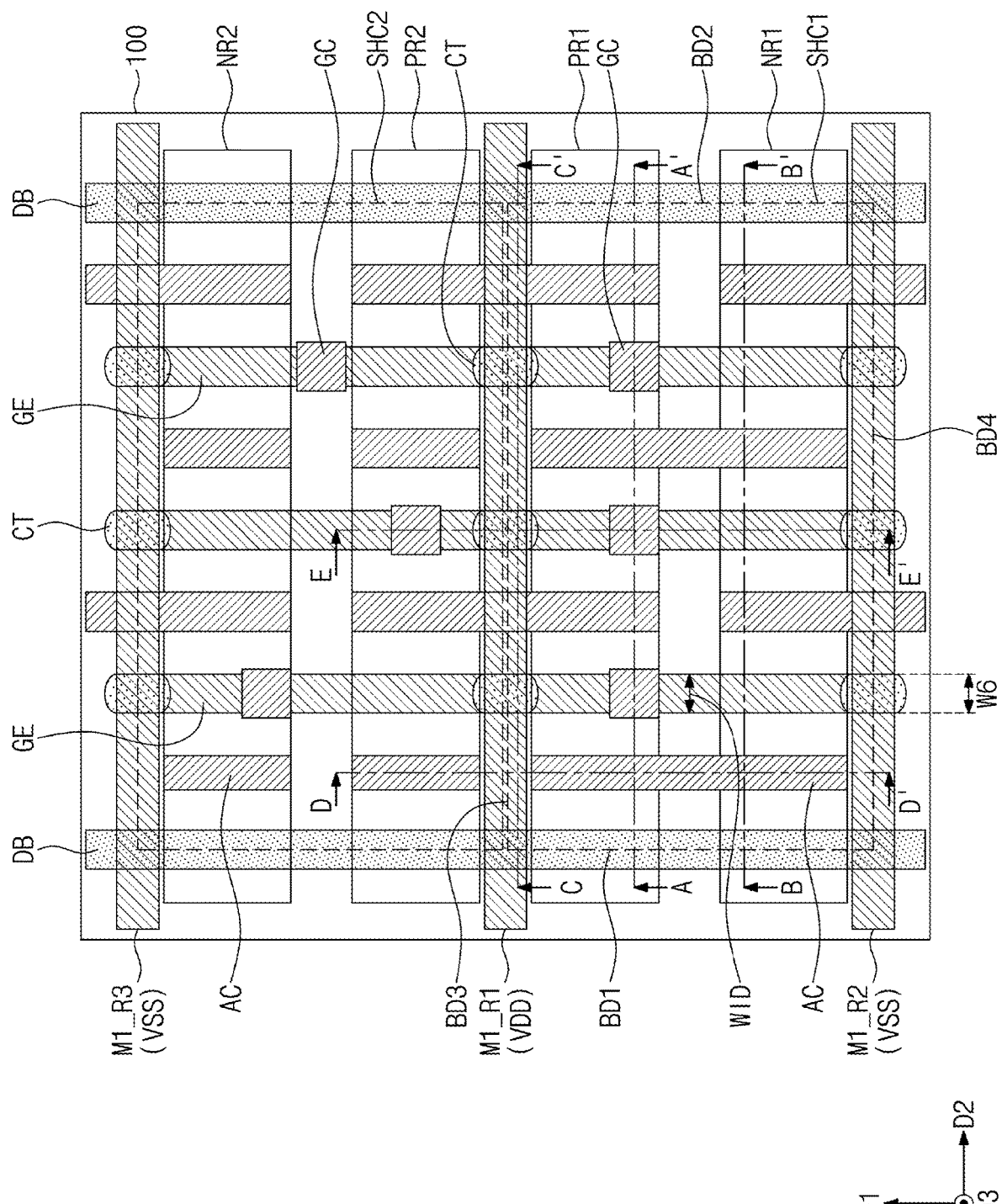
FIG. 4 is a plan view illustrating a semiconductor device according to an embodiment of the inventive concept.

FIG. 4 is a plan view illustrating a semiconductor device according to an embodiment of the inventive concept. FIGS. 5A to 5E are sectional views, which are respectively taken along lines A-A', B-B', C-C', D-D', and E-E' of FIG. 4. FIG. 6A is an enlarged sectional view illustrating a portion 'M' of FIG. 5B, and FIG. 6B is an enlarged sectional view illustrating a portion 'N' of FIG. 5C. FIG. 6C is a top plan view taken along a line P-P' of FIG. 5C. FIGS. 4 and 5A to 5E illustrate an example of a detailed structure of the first and second single height cells SHC1 and SHC2 of FIG. 3.

Referring to FIGS. 4 and 5A to 5E, the first and second single height cells SHC1 and SHC2 may be provided on the substrate 100. Logic transistors constituting the logic circuit may be disposed on each of the first and second single height cells SHC1 and SHC2. The substrate 100 may be a semiconductor substrate including silicon, germanium, silicon-germanium, or the like or a compound semiconductor substrate. In an embodiment, the substrate 100 may be a silicon wafer.

The substrate 100 may have the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may extend in the second direction D2.

The first PMOSFET region PR1, the second PMOSFET region PR2, the first NMOSFET region NR1, and the second NMOSFET region NR2 may be defined by a second trench TR2, which is formed in an upper portion of the substrate 100. For example, the second trench TR2 may be located between the first NMOSFET region NR1 and the first PMOSFET region PR1. The second trench TR2 may be located between the first and second PMOSFET regions PR1 and PR2. The second trench TR2 may be located between the second PMOSFET region PR2 and the second NMOSFET region NR2.

First active patterns AP1 may be provided on each of the first and second PMOSFET regions PR1 and PR2. Second active patterns AP2 may be provided on each of the first and second NMOSFET regions NR1 and NR2.

The first and second active patterns AP1 and AP2 may extend in the second direction D2 to be parallel to each other. Each of the first and second active patterns AP1 and AP2 may be a vertically-protruding portion of the substrate 100. A first trench TR1 may be defined between adjacent ones of the first active patterns AP1 and between adjacent ones of the second active patterns AP2. The first trench TR1 may be shallower than the second trench TR2.

A device isolation layer ST may be provided to fill the first and second trenches TR1 and TR2. The device isolation layer ST may include a silicon oxide layer. An upper portion of each of the first and second active patterns AP1 and AP2 may be a protruding pattern, which is vertically extended higher than (i.e., relative to the substrate 100) or above the device isolation layer ST (e.g., see FIG. 5E). The upper portion of each of the first and second active patterns AP1 and AP2 may have a fin shape. The device isolation layer ST may not cover the upper portion of each of the first and second active patterns AP1 and AP2. The device isolation layer ST may cover a lower side surface of each of the first and second active patterns AP1 and AP2. As used herein, the terms "surround" or "cover" may not require complete coverage.

First source/drain patterns SD1 may be provided on each of the first and second PMOSFET regions PR1 and PR2. The first source/drain patterns SD1 may be provided in the upper portion of each of the first active patterns AP1. The first source/drain patterns SD1 may be impurity regions of a first conductivity type (e.g., p-type). A first channel pattern CH1 may be interposed between each pair of the first source/drain patterns SD1, which are adjacent to each other in the second direction D2.

Second source/drain patterns SD2 may be provided on each of the first and second NMOSFET regions NR1 and NR2. The second source/drain patterns SD2 may be provided in the upper portion of each of the second active patterns AP2. The second source/drain patterns SD2 may be impurity regions of a second conductivity type (e.g., n-type). A second channel pattern CH2 may be interposed between each pair of the second source/drain patterns SD2, which are adjacent to each other in the second direction D2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain pattern SD1 may include a semiconductor material (e.g., SiGe) having a lattice constant greater than that of the substrate 100. In this case, the pair of the first source/drain patterns SD1 may exert a compressive stress on the first channel pattern CH1 therebetween. In an embodiment, the second source/drain pattern SD2 may be formed of or include the same semiconductor material (e.g., Si) as the substrate 100.

Gate electrodes GE may be provided to cross the first and second active patterns AP1 and AP2 and to extend in the first direction D1. The gate electrodes GE may be arranged at a first pitch in the second direction D2. The gate electrodes GE may be vertically overlapped (e.g., along the third direction D3) with the first and second channel patterns CH1 and CH2. Each of the gate electrodes GE may be provided to face a top surface and opposing side surfaces of each of the first and second channel patterns CH1 and CH2.

Referring back to FIG. 5E, the gate electrode GE may be provided on a first top surface TS1 and at least one of first side surfaces SW1 of the channel pattern CH1 or CH2. In other words, the transistor according to the present embodiment may be a three-dimensional field-effect transistor (e.g., FinFET), in which the gate electrode GE is provided to three-dimensionally surround the channel pattern CH1 or CH2.

Referring back to FIGS. 4 and 5A to 5E, the first single height cell SHC1 may have a first border BD1 and a second border BD2, which are opposite to each other in the second direction D2. The first and second borders BD1 and BD2 may extend in the first direction D1. The first single height cell SHC1 may have a third border BD3 and a fourth border BD4, which are opposite to each other in the first direction D1. The third and fourth borders BD3 and BD4 may extend in the second direction D2. It will be understood that the borders (e.g., BD1-BD4) described herein may not be physical structures, but rather, represent respective boundaries or peripheries of the respective cells described herein. Thus, the term "boundary" and "border" may be used interchangeably herein.

Gate cutting patterns CT may be disposed on a border, which is parallel to the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may be disposed to be overlapped with the gate electrodes GE, respectively.

Referring to FIG. 5E, the gate cutting pattern CT may extend from the device isolation layer ST to a gate capping pattern GP in a third direction D3. In an embodiment, a top surface TOP4 of the gate cutting pattern CT may be lower than (i.e., closer to the substrate 100) a top surface TOP3 of the gate electrode GE. The top surface TOP4 of the gate cutting pattern CT may be in direct contact with a bottom surface of the gate capping pattern GP. Elements or layers described as being in "direct" contact or "directly" on other elements or layers are free of intervening elements or layers therebetween. The gate cutting pattern CT may be formed of or include at least one of insulating materials (e.g., silicon nitride, silicon oxide, or combinations thereof).

The gate electrode GE on the first single height cell SHC1 may be separated from the gate electrode GE on the second single height cell SHC2 by the gate cutting pattern CT. The gate cutting pattern CT may be interposed between the gate electrodes GE on the first and second single height cells SHC1 and SHC2 which are aligned to each other in the first direction D1. In other words, the gate electrode GE extending in the first direction D1 may be divided or separated into a plurality of the gate electrodes GE by the gate cutting patterns CT.

A pair of gate spacers GS may be disposed on opposite or opposing side surfaces of each of the gate electrodes GE. The gate spacers GS may extend along the gate electrodes GE and in the first direction D1. A top surface of the gate spacer GS may be higher than a top surface of the gate electrode GE adjacent thereto. The top surface of the gate spacer GS may be lower than a top surface of the gate capping pattern GP be described below. The top surface of the gate spacer GS may be lower than a top surface of the gate cutting pattern CT.

The gate spacer GS may be formed of or include at least one of SiCN, SiOCN, or SiN. In an embodiment, referring to FIG. 6A, the gate spacer GS may have a multi-layered structure including a first gate spacer GS1 and a second gate spacer GS2. The first and second gate spacers GS1 and GS2 may include different materials from each other. For example, the first gate spacer GS1 may be formed of or include a low-k dielectric material (e.g., having a lower dielectric constant than silicon oxide, such as SiOCN), the second gate spacer GS2 may be formed of or include a material having a good etch resistance property (e.g., SiN). A dielectric constant of the first gate spacer GS1 may be smaller than a dielectric constant of the second gate spacer GS2. A thickness of the first gate spacer GS1 in the second direction D2 may be larger than a thickness of the second gate spacer GS2 in the second direction D2.

Referring back to FIGS. 4 and 5A to 5E, the gate capping pattern GP may be provided on each of the gate electrodes GE. The gate capping pattern GP may extend along the gate electrode GE or in the first direction D1. The gate capping pattern GP may cover the top surface TOP3 of the gate electrode GE and the top surface TOP4 of the gate cutting pattern CT. The gate capping pattern GP may also cover the top surface of the gate spacer GS, as illustrated in FIGS. 6A and 6B.

The gate capping pattern GP may be formed of or include a material having an etch selectivity with respect to first and second interlayer insulating layers 110 and 120, which will be described below. For example, the gate capping pattern GP may be formed of or include at least one of SiON, SiCN, SiOCN, or SiN.

A gate insulating layer GI may be interposed between the gate electrode GE and the first active pattern AP1 and between the gate electrode GE and the second active pattern AP2. The gate insulating layer GI may extend along a bottom surface of the gate electrode GE thereon. As an example, the gate insulating layer GI may cover the first top surface TS1 and the first side surface SW1 of the channel pattern CH1 or CH2. The gate insulating layer GI may cover a top surface of the device isolation layer ST below the gate electrode GE (e.g., see FIG. 5E).

In an embodiment, the gate insulating layer GI may be formed of or include a high-k dielectric material whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate. The gate insulating layer GI may have a multi-layered structure, in which a silicon oxide layer and a high-k dielectric layer are stacked.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), or yttrium (Y).

In the case where the dopants are aluminum (Al), a content of aluminum in the ferroelectric layer may range from about 3 at % to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from about 2 at % to 10 at %. In the case where the dopants are yttrium (Y), a content of yttrium in the ferroelectric layer may range from about 2 at % to 10 at %. In the case where the dopants are gadolinium (Gd), a content of gadolinium in the ferroelectric layer may range from about 1 at % to 7 at %. In the case where the dopants are zirconium (Zr), a content of zirconium in the ferroelectric layer may range from about 50 at % to 80 at %.

The paraelectric layer may have the paraelectric property. The paraelectric layer may be formed of or include, for example, silicon oxide and/or high-k metal oxides. The metal oxides, which can be used as the paraelectric layer, may include, for example, hafnium oxide, zirconium oxide, and/or aluminum oxide, but the inventive concept is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from about 0.5 to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI to be adjacent to the first and second channel patterns CH1 and CH2. The first metal pattern may include a work-function metal, which can be used to adjust a threshold voltage of the transistor. By adjusting a thickness and/or composition of the first metal pattern, it may be possible to realize a transistor having a desired threshold voltage.

The first metal pattern may include a metal nitride layer. For example, the first metal pattern may include at least one metallic material, such as titanium (Ti), tantalum (Ta), aluminum (Al), tungsten (W) and molybdenum (Mo), and nitrogen (N). The first metal pattern may further include carbon (C). The first metal pattern may include a plurality of stacked work-function metal layers.

The second metal pattern may be formed of or include a metallic material whose resistance is lower than the first metal pattern. For example, the second metal pattern may be formed of or include at least one metallic material, such as tungsten (W), aluminum (Al), titanium (Ti), and tantalum (Ta).

A first interlayer insulating layer 110 may be provided on the substrate 100. The first interlayer insulating layer 110 may cover the gate spacers GS and the first and second source/drain patterns SD1 and SD2. A top surface of the first interlayered insulating layer 110 may be substantially coplanar with top surfaces of the gate capping patterns GP.

A second interlayer insulating layer 120 may be provided on the first interlayer insulating layer 110 to cover the gate capping patterns GP and the gate cutting patterns CT. A third interlayer insulating layer 130 may be provided on the second interlayer insulating layer 120. A fourth interlayer insulating layer 140 may be provided on the third interlayer insulating layer 130. As an example, each of the first to fourth interlayer insulating layers 110 to 140 may include a silicon oxide layer.

A pair of division structures DB may be provided at both opposing sides of each of the first and second single height cells SHC1 and SHC2 to be opposite to each other in the second direction D2. For example, the pair of the division structures DB may be, respectively, provided on the first and second borders BD1 and BD2 of the first single height cell SHC1. The division structure DB may extend in the first direction D1 and parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may extend into the first and second active patterns AP1 and AP2. The division structure DB may be provided to penetrate an upper portion of each of the first and second active patterns AP1 and AP2. The division structure DB may electrically separate an active region of each of the first and second single height cells SHC1 and SHC2 from an active region of a neighboring cell.

Active contacts AC may be provided to penetrate the first and second interlayer insulating layers 110 and 120 and may be electrically connected to the first and second source/drain patterns SD1 and SD2, respectively. Each of the active contacts AC may be provided between a pair of the gate electrodes GE. When viewed in a plan view, each of the active contacts AC may be a bar- or line-shaped pattern extending in the first direction D1.

The active contact AC may be a self-aligned contact. For example, the active contact AC may be formed by a self-alignment process using the gate capping pattern GP and the gate spacer GS. In an embodiment, the active contact AC may cover at least a portion of the side surface of the gate spacer GS. Although not shown, the active contact AC may cover a portion of the top surface of the gate capping pattern GP.

Silicide patterns SC may be respectively interposed between the active contacts AC and the first and second source/drain patterns SD1 and SD2. The active contacts AC may be electrically connected to the first and second source/drain patterns SD1 and SD2, respectively, through the silicide patterns SC. The silicide pattern SC may be formed of or include at least one of metal silicide materials (e.g., titanium silicide, tantalum silicide, tungsten silicide, nickel silicide, and/or cobalt silicide).

Referring back to FIG. 5D, at least one of the active contacts AC on the first single height cell SHC1 may electrically connect the first source/drain pattern SD1 of the first PMOSFET region PR1 to the second source/drain pattern SD2 of the first NMOSFET region NR1. The active contact AC may extend from the second source/drain pattern SD2 of the first NMOSFET region NR1 to the first source/drain pattern SD1 of the first PMOSFET region PR1 in the first direction D1. The active contact AC may include a first body portion BP1 on the first source/drain pattern SD1 and a second body portion BP2 on the second source/drain pattern SD2. The first body portion BP1 may be connected to the top surface of the first source/drain pattern SD1 through the silicide pattern SC, and the second body portion BP2 may be connected to the top surface of the second source/drain pattern SD2 through the silicide pattern SC. A first active contact AC1 may further include a protruding portion PRP interposed between the first and second body portions BP1 and BP2. The protruding portion PRP may be provided on the device isolation layer ST between the first PMOSFET region PR1 and the first NMOSFET region NR1.

The protruding portion PRP may extend from the first body portion BP1 toward the device isolation layer ST along a slanted side surface of the first source/drain pattern SD1. The protruding portion PRP may extend from the second body portion BP2 toward the device isolation layer ST along a slanted side surface of the second source/drain pattern SD2. The protruding portion PRP may have a bottom surface that is lower than a bottom surface of each of the first and second body portions BP1 and BP2. The bottom surface of the protruding portion PRP may be located at a level higher than the device isolation layer ST. In other words, the protruding portion PP may be spaced apart from the device isolation layer ST with the first interlayer insulating layer 110 interposed therebetween.

In an embodiment, the active contact AC may be connected to the top surface of the first source/drain pattern SD1 through the first body portion BP1 and may also be connected to the slanted side surface of the first source/drain pattern SD1 through the protruding portion PRP. In other words, the protruding portion PRP may increase a contact area between the active contact AC and the first source/drain pattern SD1. Thus, a resistance between the active contact AC and the first source/drain pattern SD1 may be reduced. Similarly, the protruding portion PRP may decrease a resistance between the active contact AC and the second source/drain pattern SD2. As a result, it may be possible to improve an operation property (e.g., an operation speed) of the semiconductor device according to an embodiment of the inventive concept.

Gate contacts GC may be provided to penetrate the second interlayer insulating layer 120 and the gate capping pattern GP and may be electrically connected to the gate electrodes GE, respectively. When viewed in a plan view, the gate contacts GC on the first single height cell SHC1 may be disposed to be overlapped with the first PMOSFET region PR1. In other words, the gate contacts GC on the first single height cell SHC1 may be provided on the first active pattern AP1 (e.g., see FIG. 5A).

The gate contact GC may be freely disposed on the gate electrode GE, without any limitation in its position. For example, the gate contacts GC on the second single height cell SHC2 may be respectively disposed on the second PMOSFET region PR2, the second NMOSFET region NR2, and the device isolation layer ST filling the second trench TR2 (e.g., see FIG. 4).

Figure 5A:
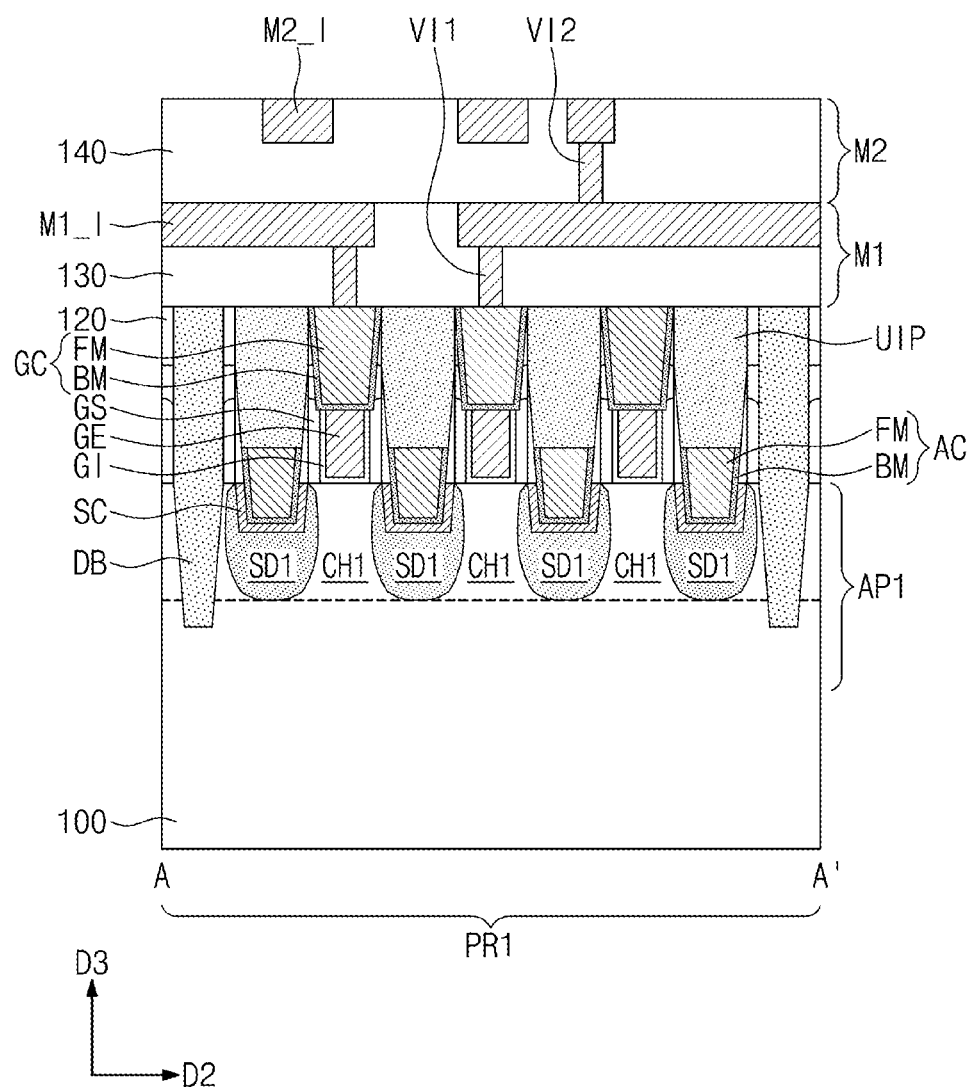
Figure 5B:
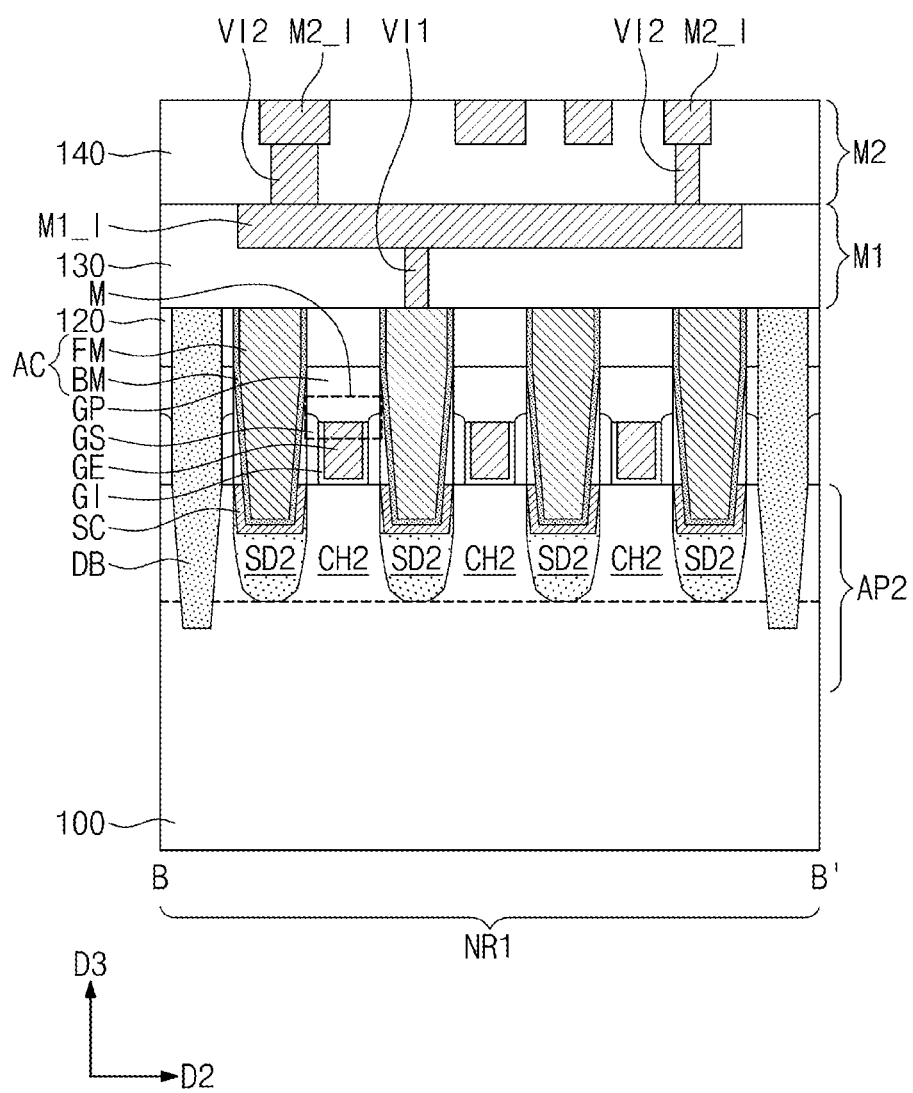
Figure 5C:
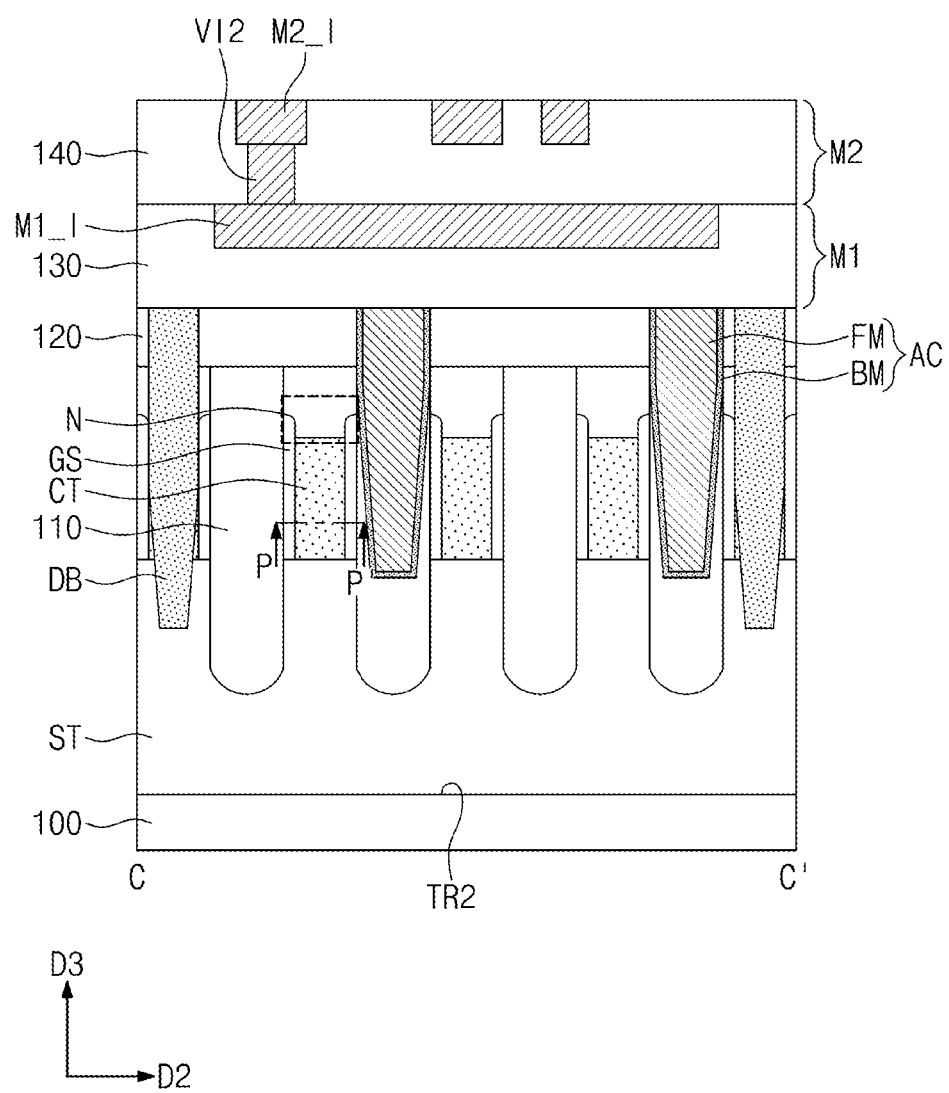
Figure 5D:
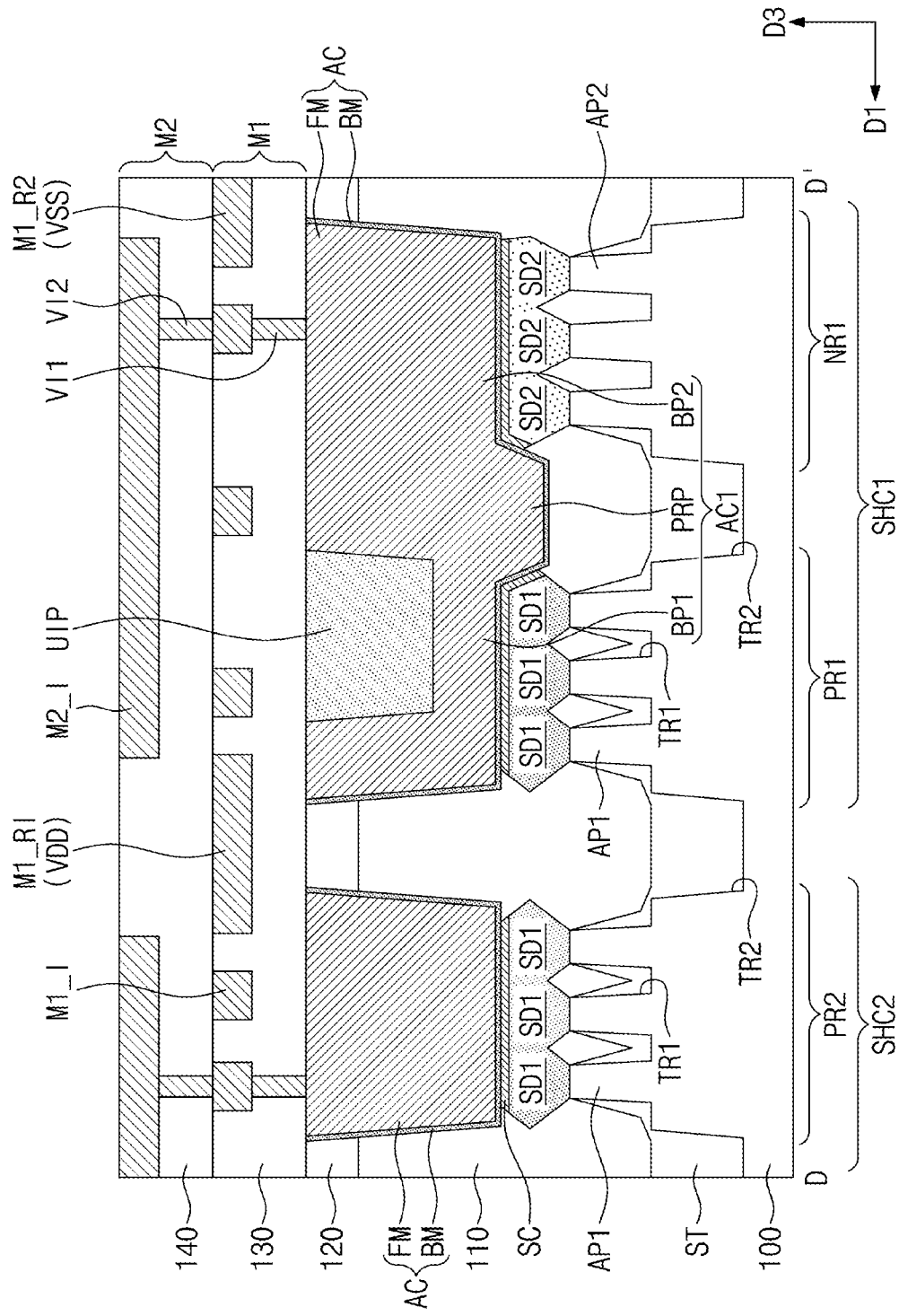
Figure 6A:
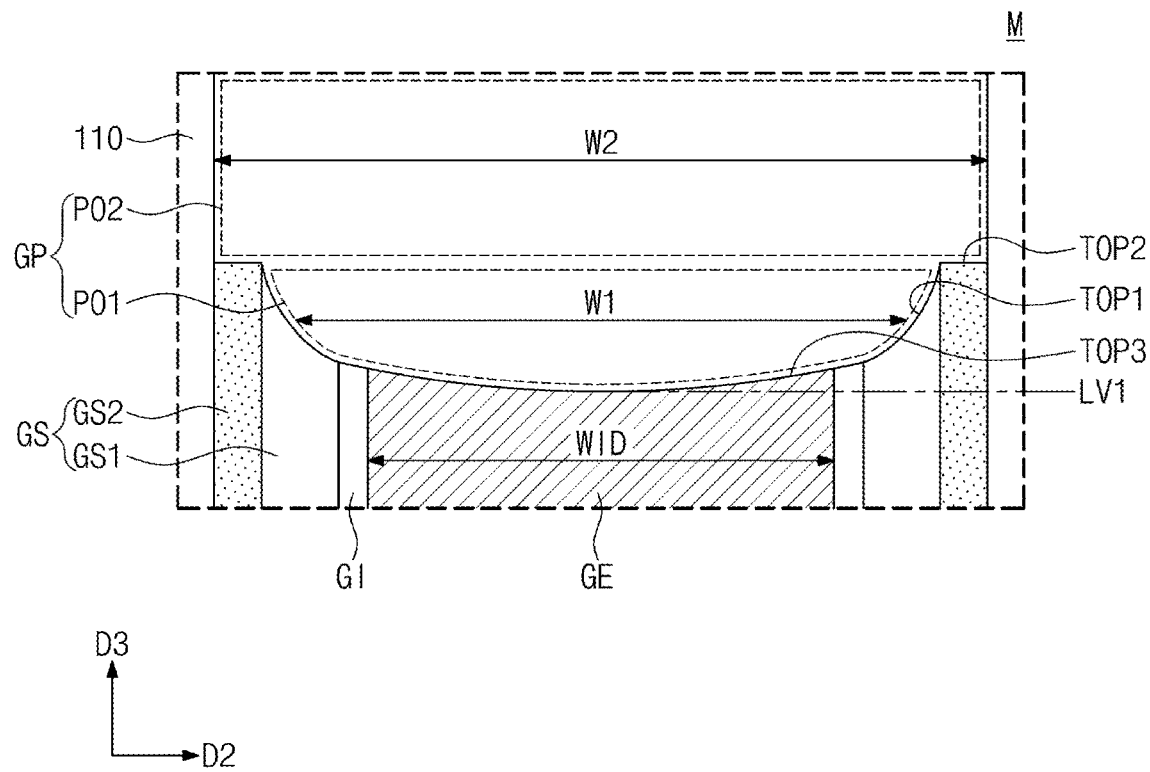
FIG. 6A is an enlarged sectional view illustrating a portion 'M' of FIG. 5B.
Figure 6B:
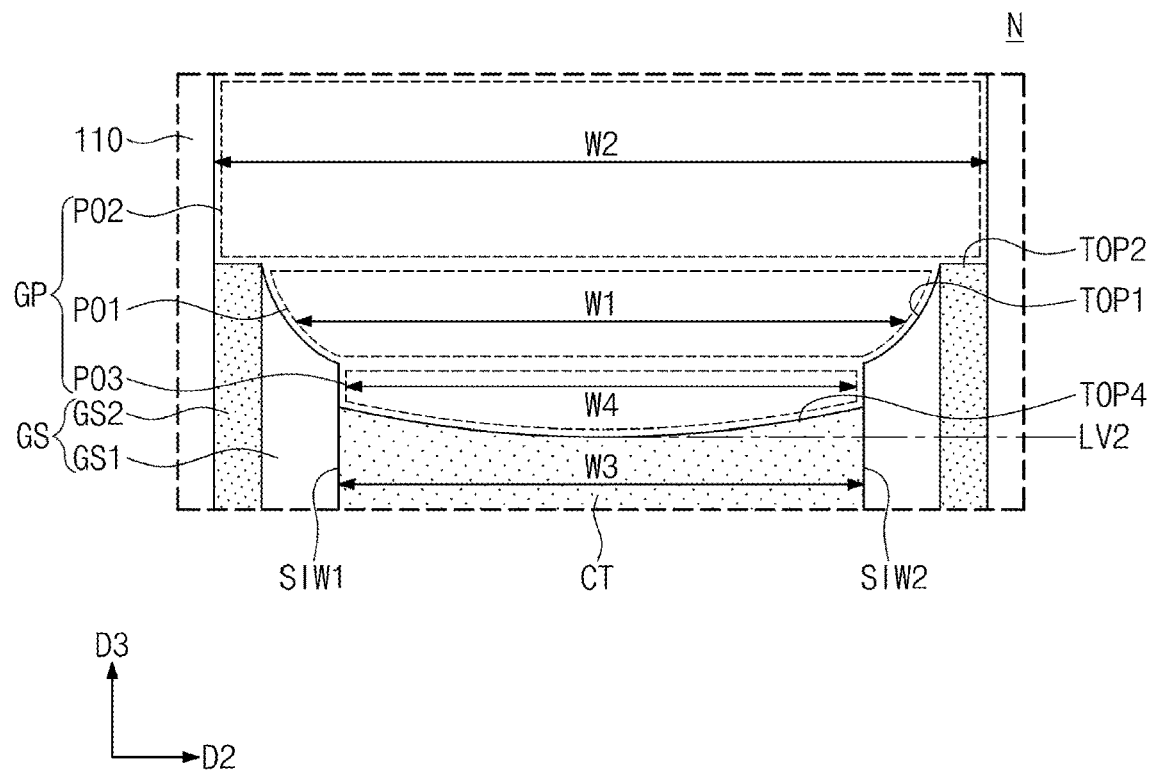
FIG. 6B is an enlarged sectional view illustrating a portion 'N' of FIG. 5C.
Figure 6C:
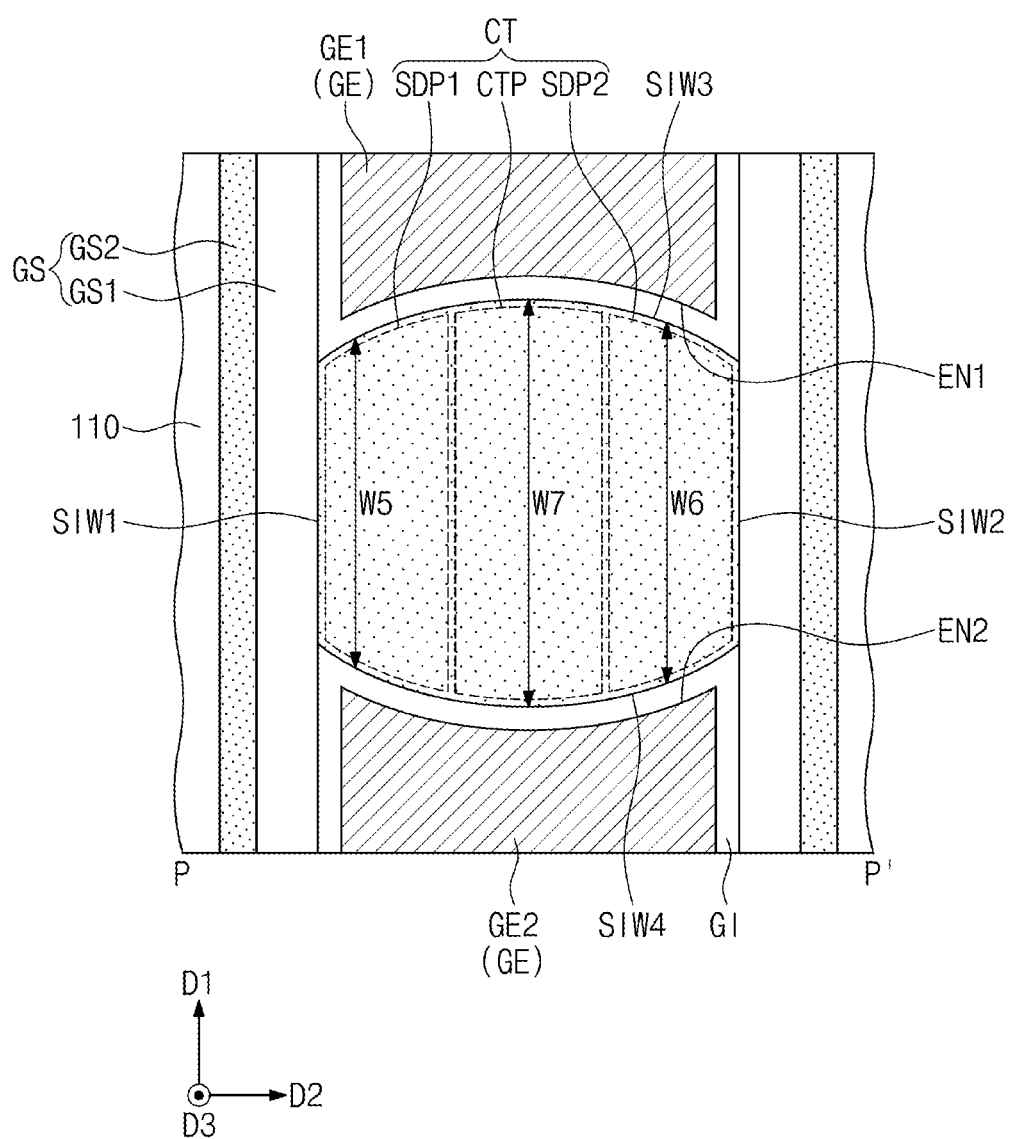
FIG. 6C is a top plan view taken along a line P-P' of FIG. 5C.
Figure 7:
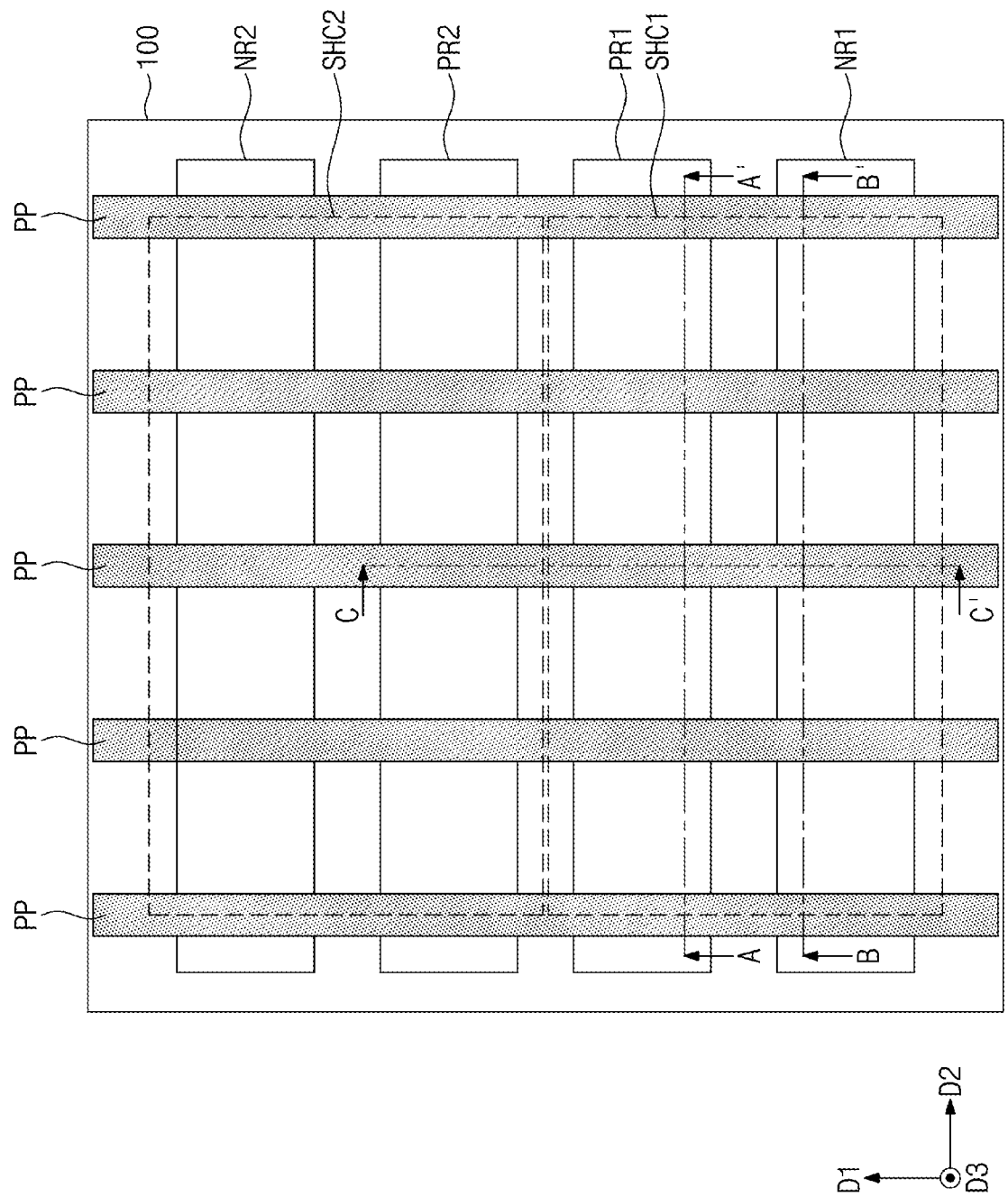
FIGS. 7, 9, 11, 13, 15, and 17 are plan views illustrating a method of fabricating a semiconductor device, according to an embodiment of the inventive concept.
Figure 8A:
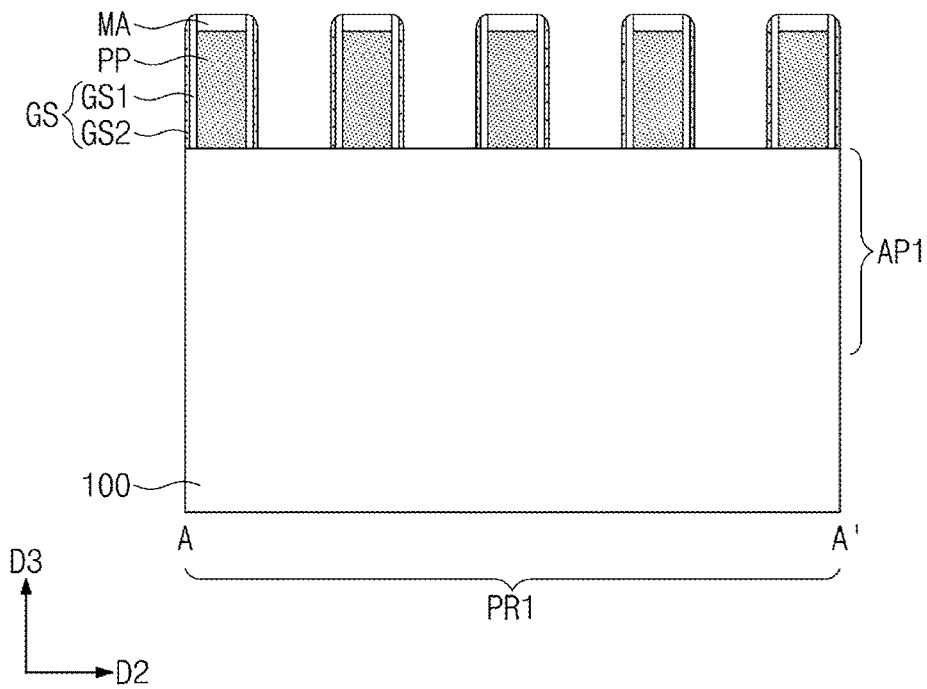
FIGS. 8A, 10A, 12A, 14A, 16A, and 18A are sectional views which are respectively taken along lines A-A' of FIGS. 7, 9, 11, 13, 15, and 17.
Figure 8B:
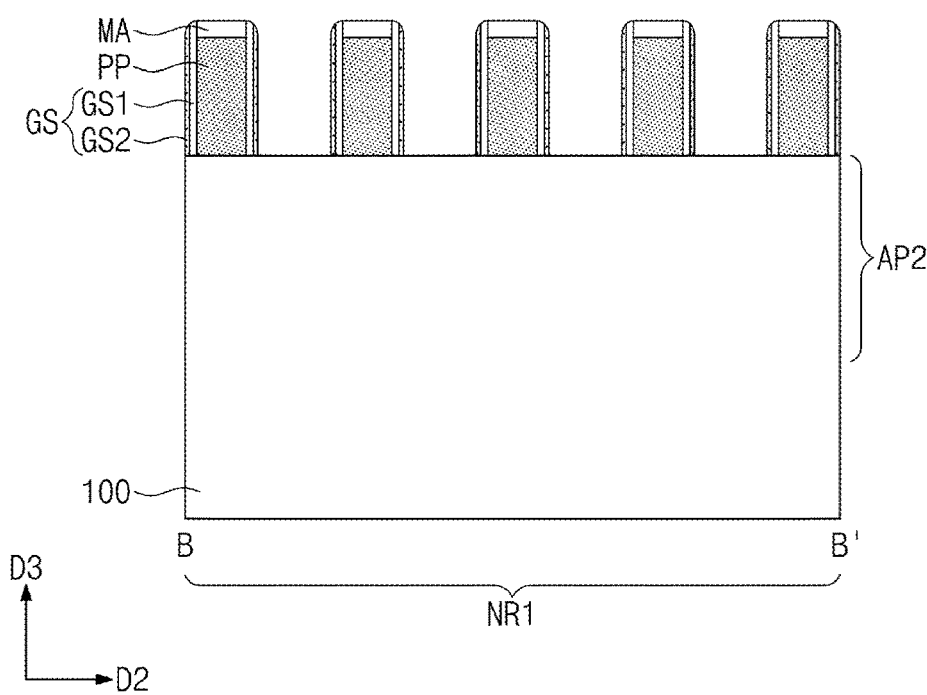
FIGS. 8B, 10B, 12B, 14B, 16B, and 18B are sectional views which are respectively taken along lines B-B' of FIGS. 7, 9, 11, 13, 15, and 17.
Figure 8C:
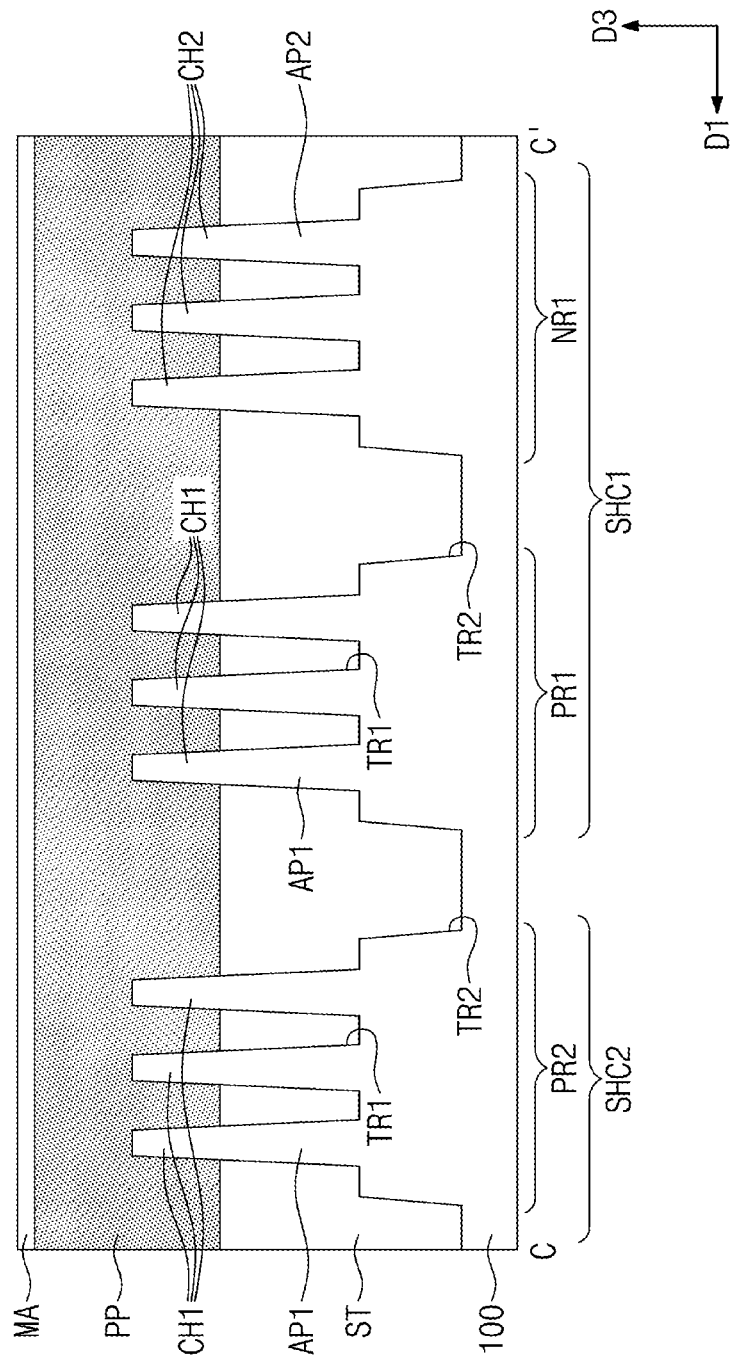
FIGS. 8C, 10C, 12C, 14C, 16C, and 18C are sectional views which are respectively taken along lines C-C' of FIGS. 7, 9, 11, 13, 15, and 17.
Figure 9:
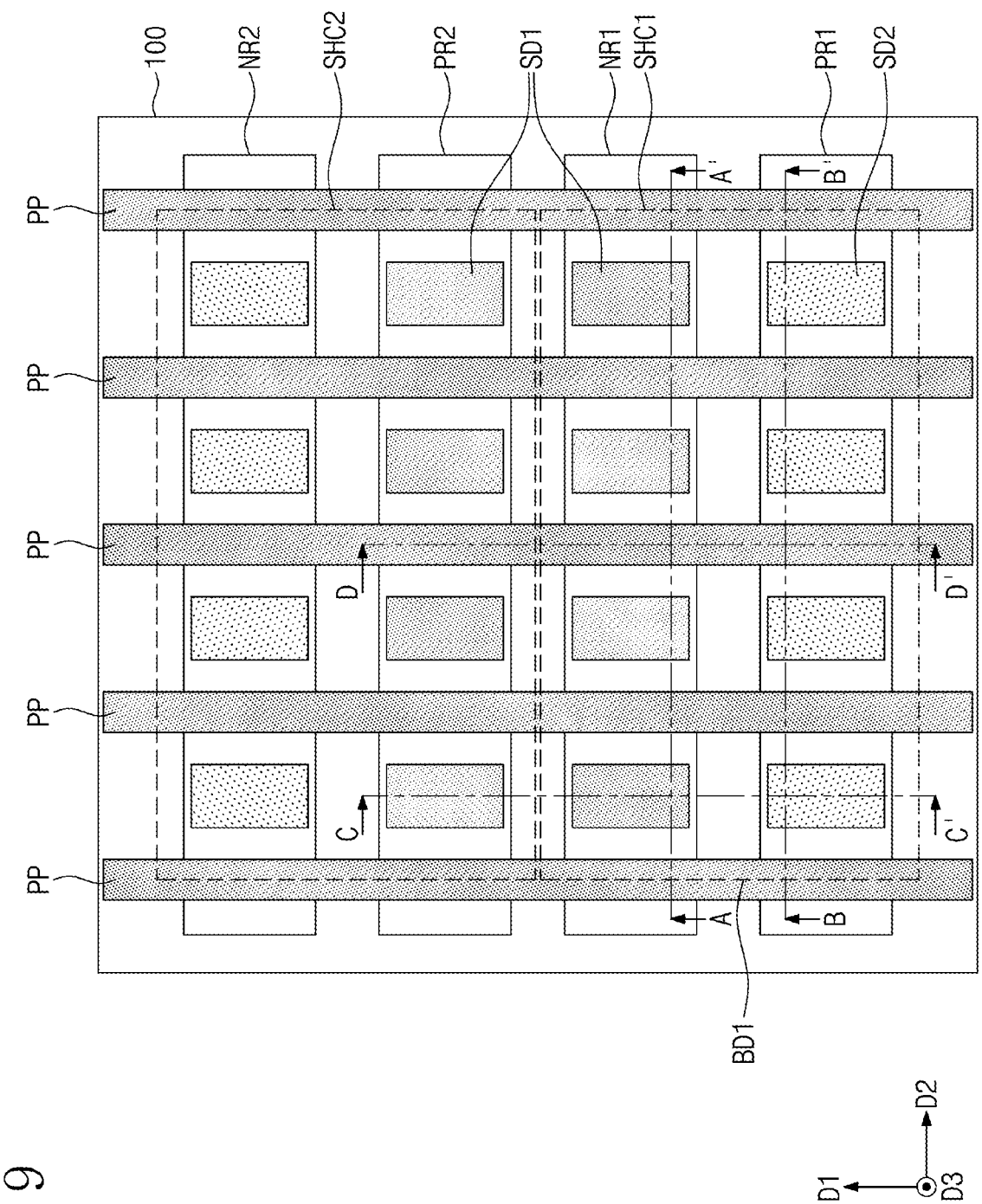
Figure 10A:
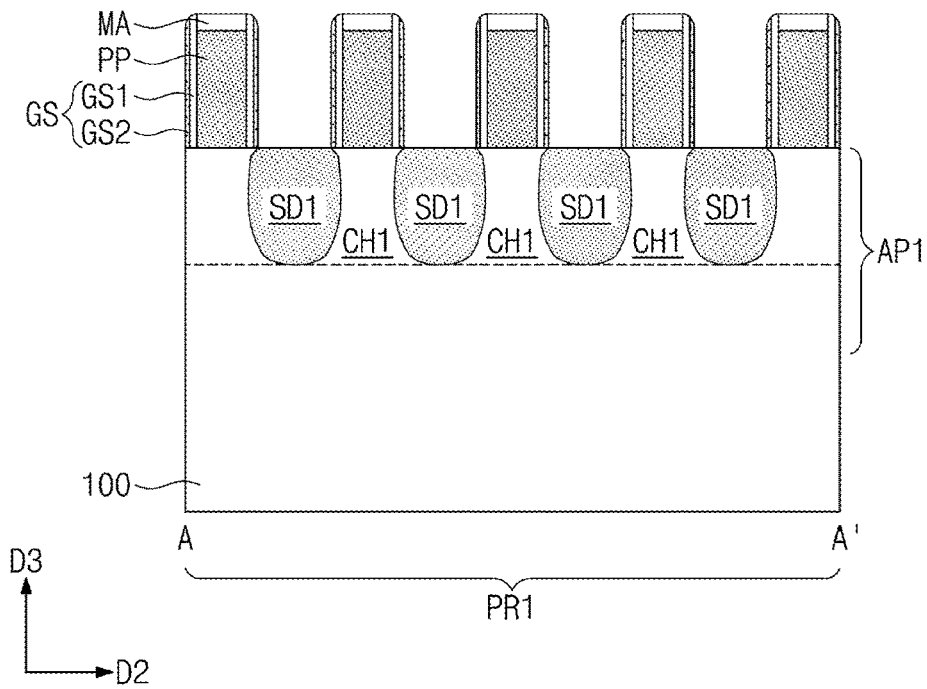
Figure 10B:
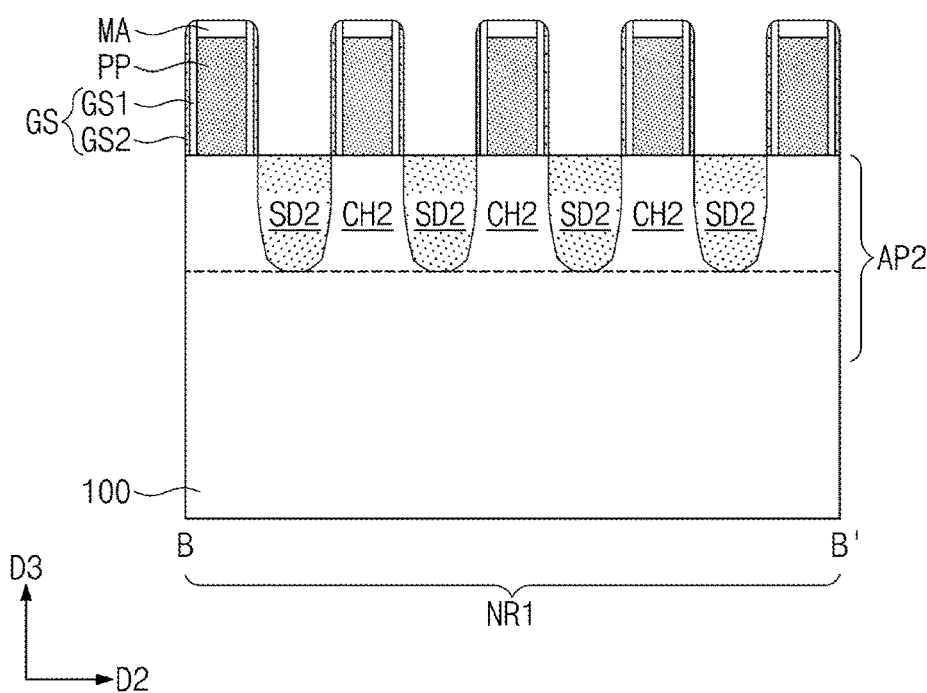
Figure 10C:
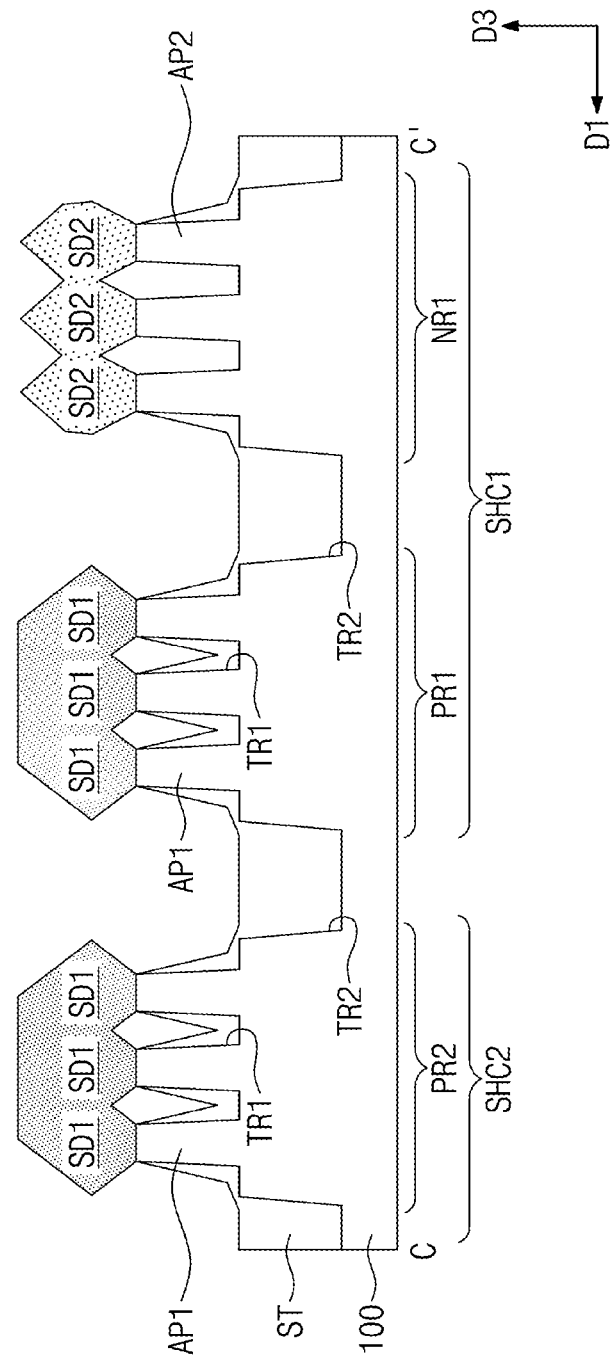
Figure 10D:
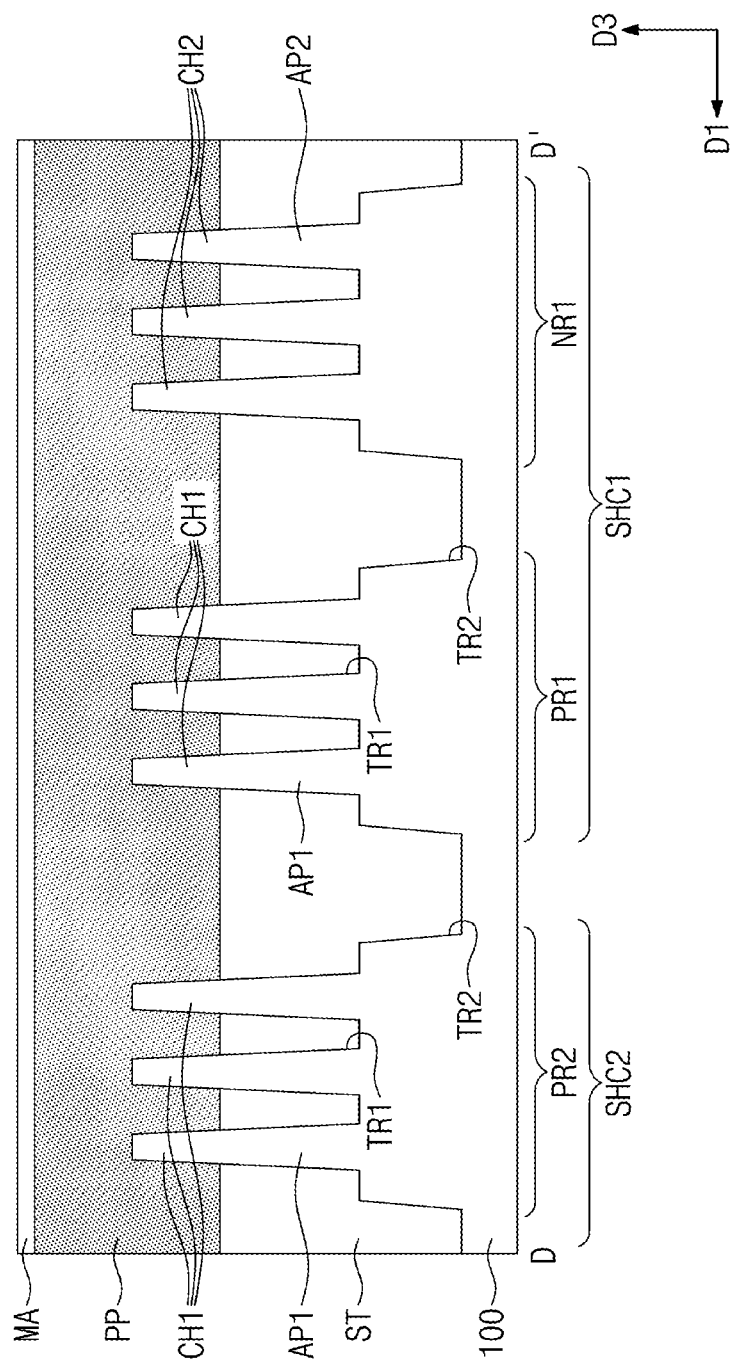
FIGS. 10D, 12D, 14D, 16D, and 18D are sectional views which are respectively taken along lines D-D' of FIGS. 9, 11, 13, 15, and 17.
Figure 11:
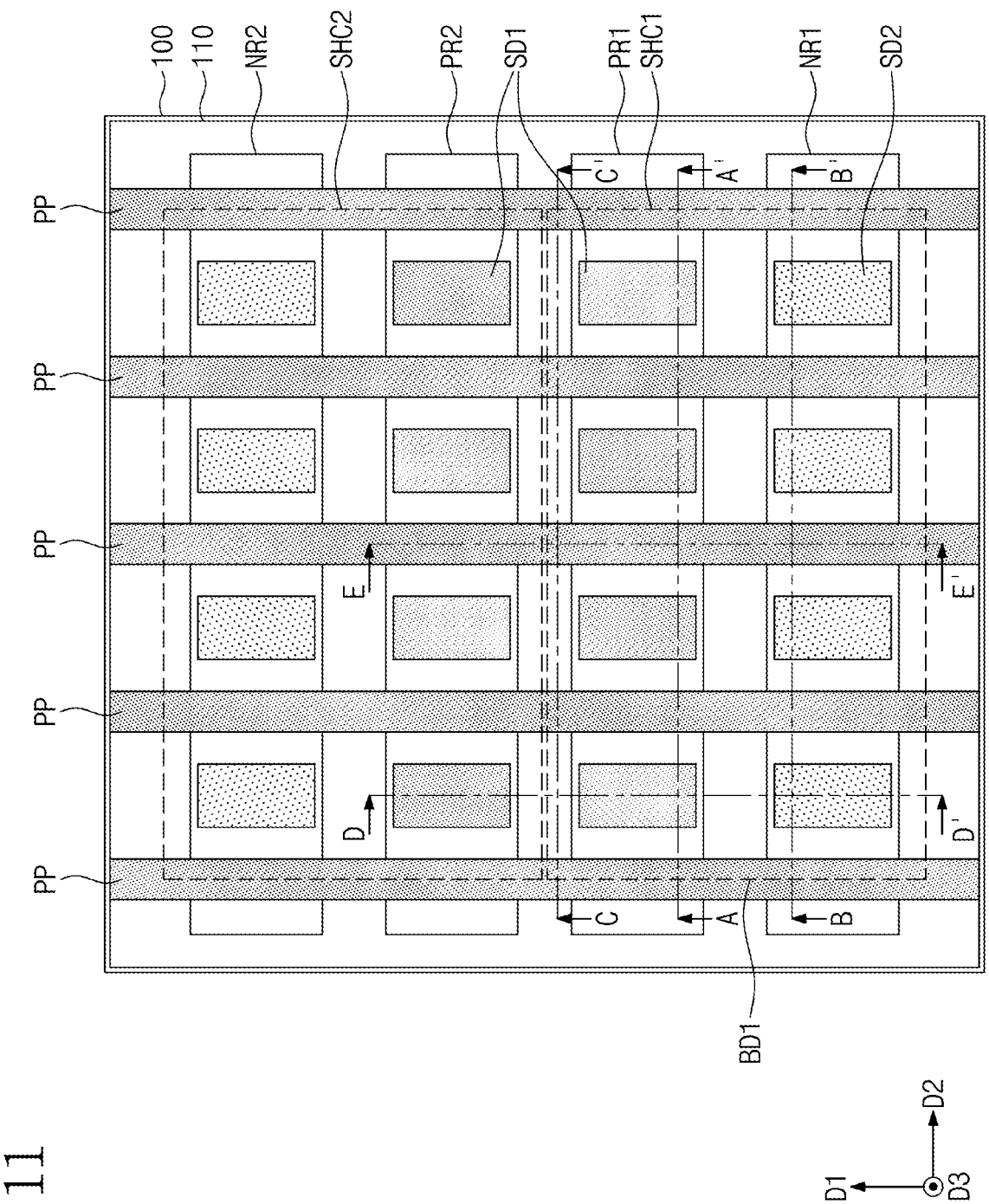

In an embodiment, referring to FIGS. 5A and 5D, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. "Levels" as described herein are relative to a frame of reference, for example, the substrate 100. Accordingly, it may be possible to prevent the gate contact GC and the active contact AC, which are adjacent to each other, from being in contact with each other and thereby to prevent a short circuit issue from occurring therebetween.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, and/or cobalt). The barrier pattern BM may be provided to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include the first power line M1_R1, the second power line M1_R2, the third power line M1_R3, and first interconnection lines M1_I. The interconnection lines M1_R1, M1_R2, M1_R3, and M1_I of the first metal layer M1 may extend in the second direction D2 to be parallel to each other.

In detail, the first and second power lines M1_R1 and M1_R2 may be provided on the third and fourth borders BD3 and BD4 of the first single height cell SHC1, respectively. The first power line M1_R1 may extend along the third border BD3 and in the second direction D2. The second power line M1_R2 may extend along the fourth border BD4 and in the second direction D2.

The first interconnection lines M1_I of the first metal layer M1 may be arranged at a second pitch in the first direction D1. The second pitch may be smaller than the first pitch. A line width of each of the first interconnection lines M1_I may be smaller than a line width of each of the first to third power lines M1_R1, M1_R2, and M1_R3.

The first metal layer M1 may further include first vias VI1. The first vias VI1 may be respectively provided below the interconnection lines M1_R1, M1_R2, M1_R3, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern extending in the first direction D1. In other words, the second interconnection lines M2_I may extend in the first direction D1 and parallel to each other.

The second metal layer M2 may further include second vias VI2, which are respectively provided below the second interconnection lines M2_I. The interconnection line of the first metal layer M1 and the interconnection line of the second metal layer M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from that of the second metal layer M2. For example, the interconnection lines of the first and second metal layers M1 and M2 may be formed of or include at least one of metallic materials (e.g., aluminum, copper, tungsten, molybdenum, and/or cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

Hereinafter, the gate electrode GE, the gate spacer GS, and the gate capping pattern GP according to an embodiment of the inventive concept will be described in more detail with reference to FIG. 6A. The gate spacer GS may include the first and second gate spacers GS1 and GS2, which are disposed in the second direction D2 and are parallel to each other. The first gate spacer GS1 may have a first top surface TOP1, and the second gate spacer GS2 may have a second top surface TOP2. The gate electrode GE may have the third top surface TOP3. The second top surface TOP2 may be higher (i.e., farther from the substrate 100) than the first top surface TOP1. The first top surface TOP1 may be higher than the third top surface TOP3 of the gate electrode GE.

In an embodiment, a level of the first top surface TOP1 of the first gate spacer GS1 may increase in a direction from the gate electrode GE toward the second gate spacer GS2. The first top surface TOP1 of the first gate spacer GS1 may not be flat and may be concavely curved. In an embodiment, the third top surface TOP3 of the gate electrode GE may not be flat and may be concavely curved. The lowermost point of the third top surface TOP3 may be located at a first level LV1.

The gate capping pattern GP may include a first portion PO1 and a second portion PO2. The first portion PO1 may be interposed between a pair of first gate spacers GS1 which are adjacent to each other. The first portion PO1 may cover the first top surface TOP1 of the first gate spacer GS1, the top surface TOP3 of the gate electrode GE, and the top surface of the gate insulating layer GI. A first width W1 of the first portion PO1 in the second direction D2 may gradually increase in the third direction D3.

The second portion PO2 may be located on the first portion PO1. The second portion PO2 may cover the second top surface TOP2 of the second gate spacer GS2. A second width W2 of the second portion PO2 in the second direction D2 may be larger than the first width W1 of the first portion PO1. Each of the first and second widths W1 and W2 of the gate capping pattern GP may be larger than a width WID of the gate electrode GE in the second direction D2.

Hereinafter, an upper structure of the gate cutting pattern CT according to an embodiment of the inventive concept will be described in more detail with reference to FIG. 6B. The gate spacer GS adjacent to the gate cutting pattern CT may have substantially the same structure as the gate spacer GS adjacent to the gate electrode GE, previously described with reference to FIG. 6A.

The gate cutting pattern CT may be interposed between a pair of the first gate spacers GS1 which are adjacent to each other. The gate cutting pattern CT may have the fourth top surface TOP4. The fourth top surface TOP4 may be lower (i.e., closer to the substrate 100) than the first top surface TOP1 of the first gate spacer GS1. The lowermost point of the fourth top surface TOP4 may be located at a second level LV2. The second level LV2 may be lower than the first level LV1 previously described with reference to FIG. 6A. In other words, the fourth top surface TOP4 of the gate cutting pattern CT may be lower than the third top surface TOP3 of the gate electrode GE.

The gate cutting pattern CT may have a third width W3 in the second direction D2, and the third width W3 may be larger than the width WID of the gate electrode GE in the second direction D2. This may be because the gate insulating layer GI is omitted from a region between the gate cutting pattern CT and the first gate spacer GS1.

The gate capping pattern GP on the gate cutting pattern CT may further include a third portion PO3, which is provided below the first portion PO1, in addition to the first and second portions PO1 and PO2. The third portion PO3 may be interposed between side surfaces of the pair of the first gate spacers GS1. The third portion PO3 may cover the top surface TOP4 of the gate cutting pattern CT.

The third portion PO3 may have a fourth width W4 in the second direction D2, and the fourth width W4 may be substantially equal to the third width W3. The first width W1 of the first portion PO1 may be larger than the fourth width W4 of the third portion PO3.

In an embodiment, the gate capping pattern GP may be provided to fully cover the top surface of the gate spacer GS. In a process of fabricating a semiconductor device, the gate spacer GS may be previously formed before the formation of the gate capping pattern GP and may experience various subsequent processes. During this process, the gate spacer GS may be damaged, thereby having low durability. According to an embodiment of the inventive concept, since the gate capping pattern GP is formed on the top surface of the damaged gate spacer GS, the gate capping pattern GP, instead of the gate spacer GS, may protect the gate electrode GE. The gate capping pattern GP may effectively prevent an etching material from infiltrating into the gate electrode GE when the active contact AC adjacent to the gate electrode GE is formed, and thus, it may be possible to form a self-aligned contact structure, without or with reduced likelihood of a process failure.

According to a comparative example, a conventional gate spacer GS may be formed to have a top surface that is coplanar with a top surface of a gate capping pattern CP, and thus, a metal-containing portion of the gate electrode GE extended along a side surface of the gate spacer GS may be exposed externally or to the outside at a level higher than the gate capping pattern CP. In the case where the metal-containing portion of the gate electrode GE is exposed externally or to the outside at a level higher than the gate capping pattern CP, there may be a process failure, in which the exposed metal-containing portion is in contact with the active contact AC adjacent thereto.

However, according to an embodiment of the inventive concept, the top surfaces TOP1 and TOP2 of the gate spacer GS may be located at a lowered level that is close or closer to the top surface TOP3 of the gate electrode GE and the top surface TOP4 of the gate cutting pattern CT. Accordingly, it may be possible to reduce or prevent a process failure, in which the metal-containing portion of the gate electrode GE is exposed externally or to the outside at a level higher than the gate capping pattern CP, and thereby to improve reliability of the semiconductor device.

A plan view or planar structure of the gate electrode GE, the gate spacer GS, and the gate capping pattern GP according to an embodiment of the inventive concept will be described in more detail with reference to FIG. 6C. The gate cutting pattern CT and the gate electrode GE may be provided between the pair of the gate spacers GS. The gate electrode GE may include a first gate electrode GE1 and a second gate electrode GE2, and the gate cutting pattern CT may be interposed between the first gate electrode GE1 and the second gate electrode GE2. The gate cutting pattern CT may separate the first gate electrode GE1 and the second gate electrode GE2 from each other.

A width (i.e., W3 of FIG. 6B) of the gate cutting pattern CT in the second direction D2 may be substantially equal to a distance between the pair of the first gate spacers GS1. The width (i.e., W3 of FIG. 6B) of the gate cutting pattern CT in the second direction D2 may be larger than a width (i.e., WID of FIG. 6A) of the gate electrode GE in the second direction D2.

The gate cutting pattern CT may include a first side surface SIW1 and a second side surface SIW2, which are opposite to each other in the second direction D2. Each of the first and second side surfaces SIW1 and SIW2 of the gate cutting pattern CT may be in direct contact with the respective first gate spacer GS1 adjacent thereto.

The gate cutting pattern CT may include a third side surface SIW3 and a fourth side surface SIW4, which are opposite to each other in the first direction D1. Each of the third and fourth side surfaces SIW3 and SIW4 may be covered with the gate insulating layer GI. The third and fourth side surfaces SIW3 and SIW4 may face the first and second gate electrodes GE1 and GE2, respectively, with the gate insulating layer GI interposed therebetween.

The gate cutting pattern CT may include a center portion CTP and first and second side portions SDP1 and SDP2, which are disposed at both opposing sides of the center portion CTP. The first and second side portions SDP1 and SDP2 may be spaced apart from each other in the second direction D2, with the center portion CTP interposed therebetween. The first side portion SDP1 may be a portion of the gate cutting pattern CT having the first side surface SIW1, and the second side portion SDP2 may be a portion of the gate cutting pattern CT having the second side surface SIW2. As an example, the center portion CTP, the first side portion SDP1, and the second side portion SDP2 may be defined by dividing the gate cutting pattern CT into three equal portions in the second direction D2. In other words, the center portion CTP, the first side portion SDP1, and the second side portion SDP2 may have the same width or length in the second direction D2.

The first side portion SDP1 may have a fifth width W5 in the first direction D1, the second side portion SDP2 may have a sixth width W6 in the first direction D1, and the center portion CTP may have a seventh width W7 in the first direction D1. The seventh width W7 may be larger than each of the fifth width W5 and the sixth width W6. That is, according to an embodiment of the inventive concept, the width of the gate cutting pattern CT in the first direction D1 may be increased in a direction away from the first side surface SIW1, may have the largest value at the center of the gate cutting pattern CT, and then may be decreased in a direction toward the second side surface SIW2.

The third side surface SIW3 of the gate cutting pattern CT may be convex toward the first gate electrode GE1, and the fourth side surface SIW4 may be convex toward the second gate electrode GE2. A first end EN1 of the first gate electrode GE1 may have a concave shape corresponding to the convex profile of the third side surface SIW3. A second end EN2 of the second gate electrode GE2 may have a concave shape corresponding to the convex profile of the fourth side surface SIW4.

Figure 12A:
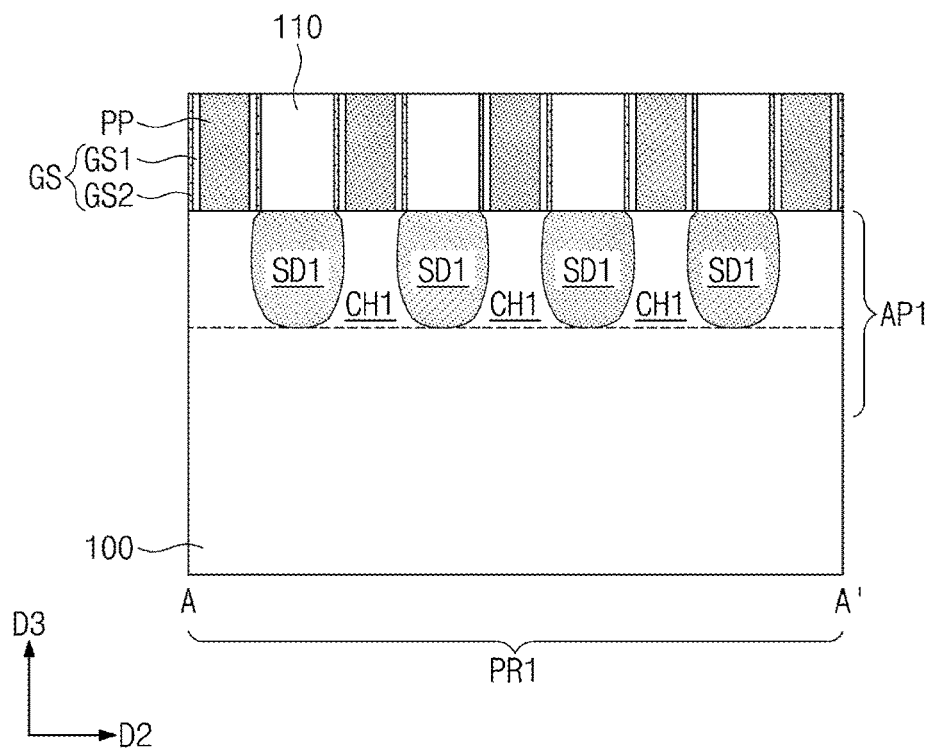
Figure 12B:
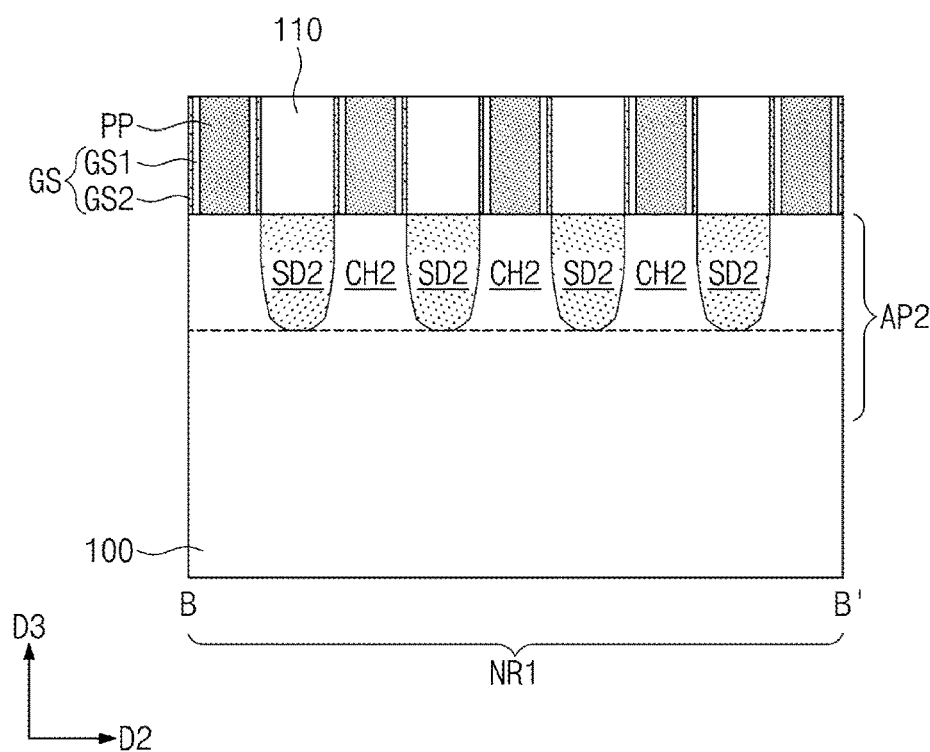
Figure 12C:
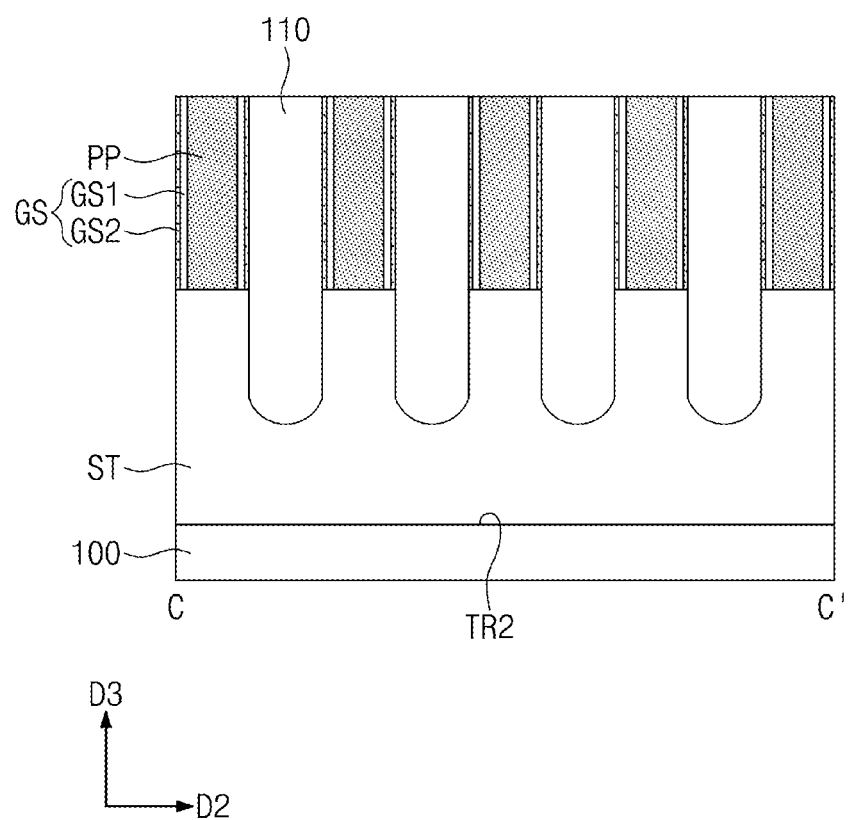
Figure 12D:
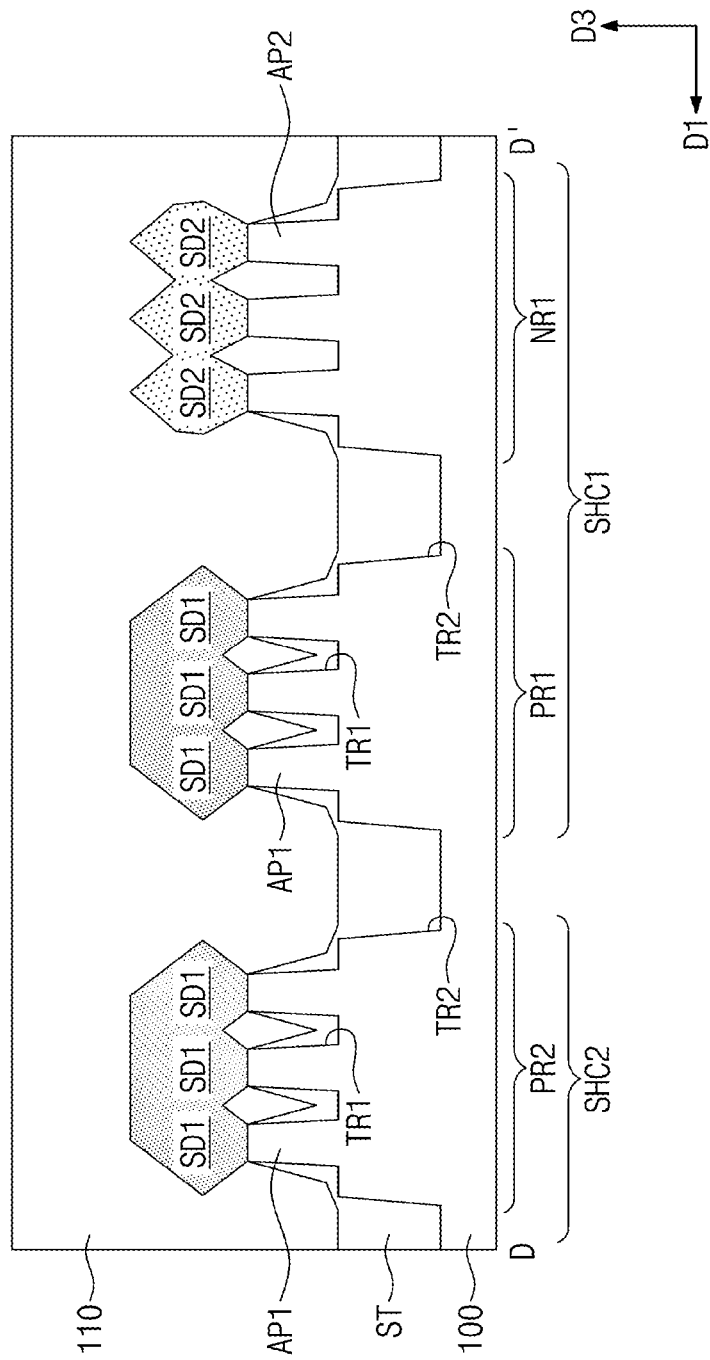
Figure 12E:
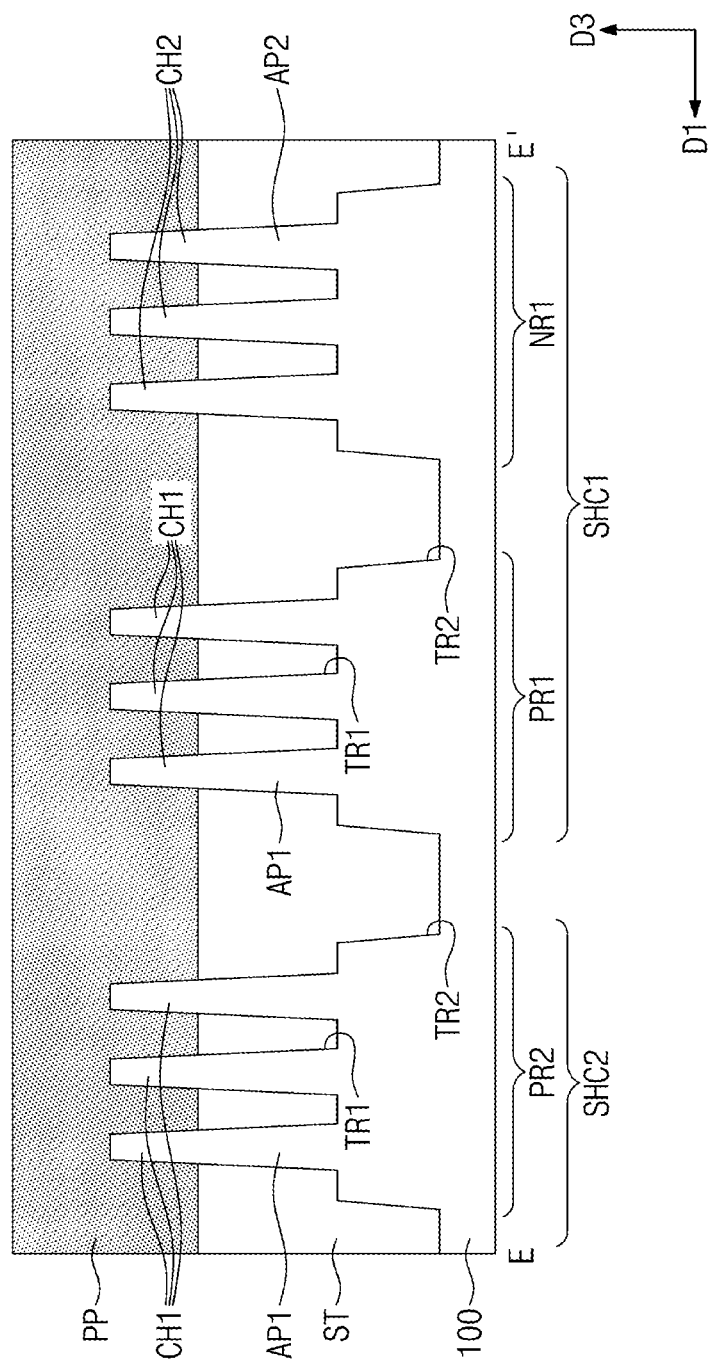
FIG. 12E is a sectional view taken along a line E-E' of FIG. 11.
Figure 13:
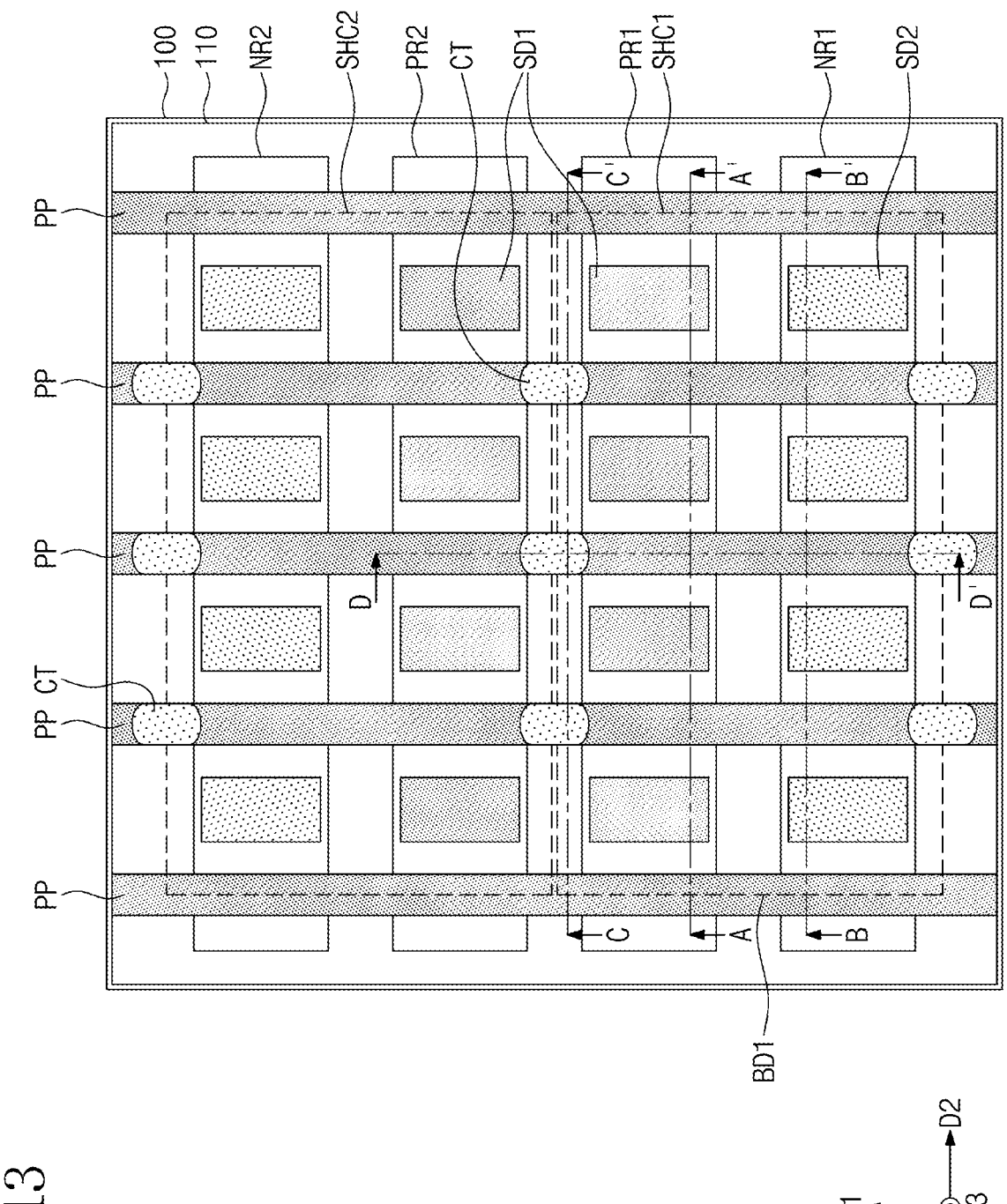
Figure 14A:
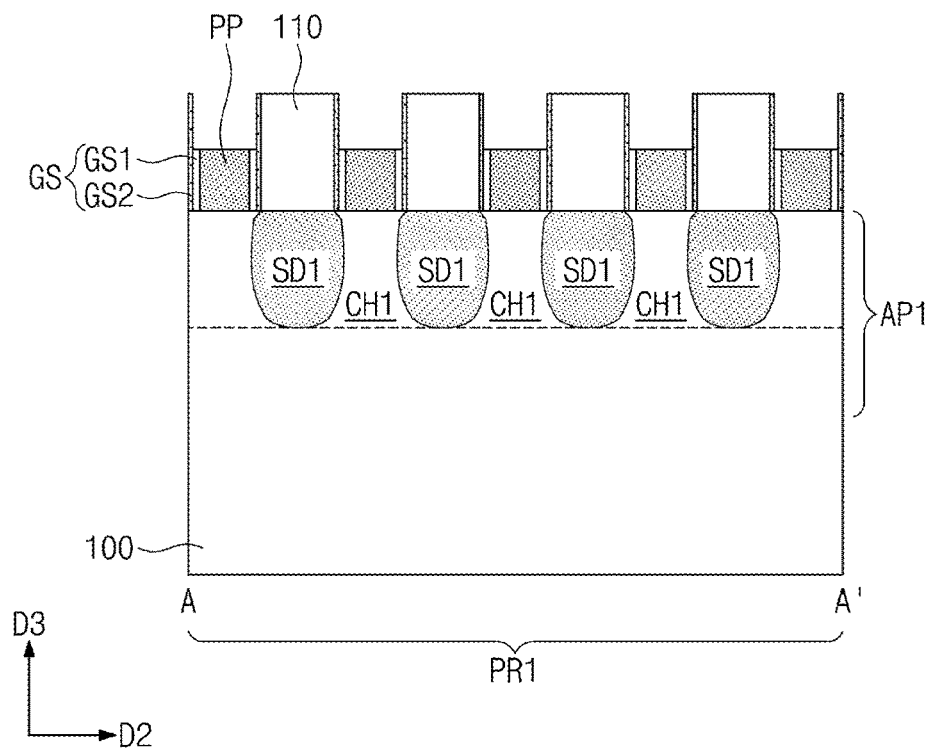
Figure 14B:
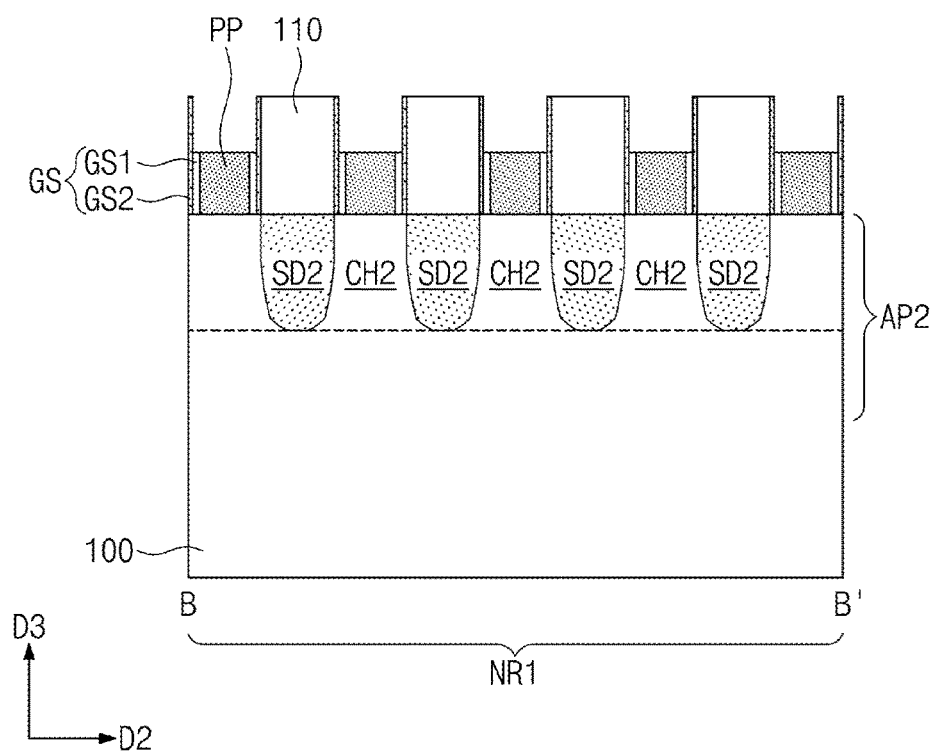
Figure 14C:
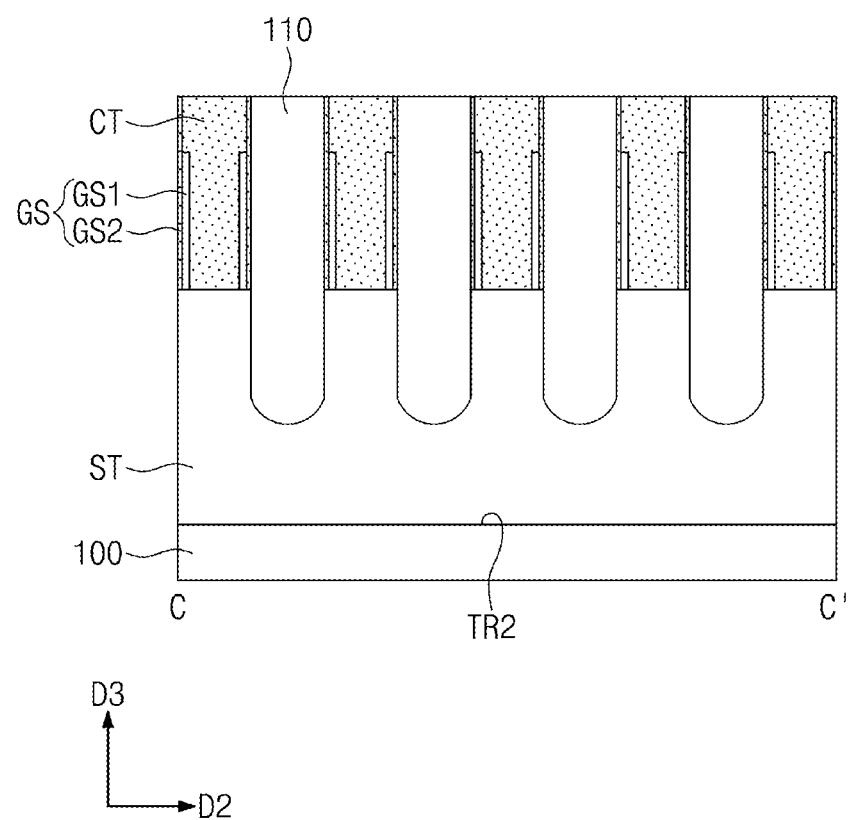
Figure 14D:
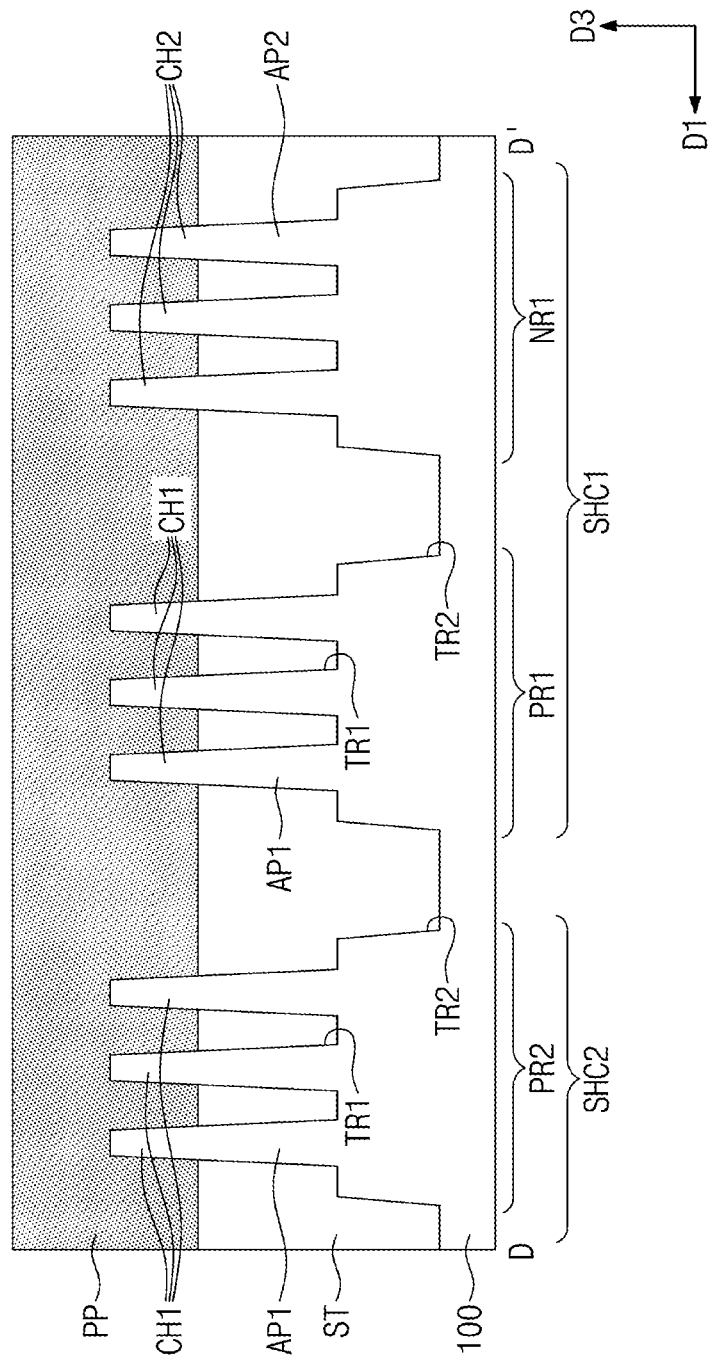
Figure 15:
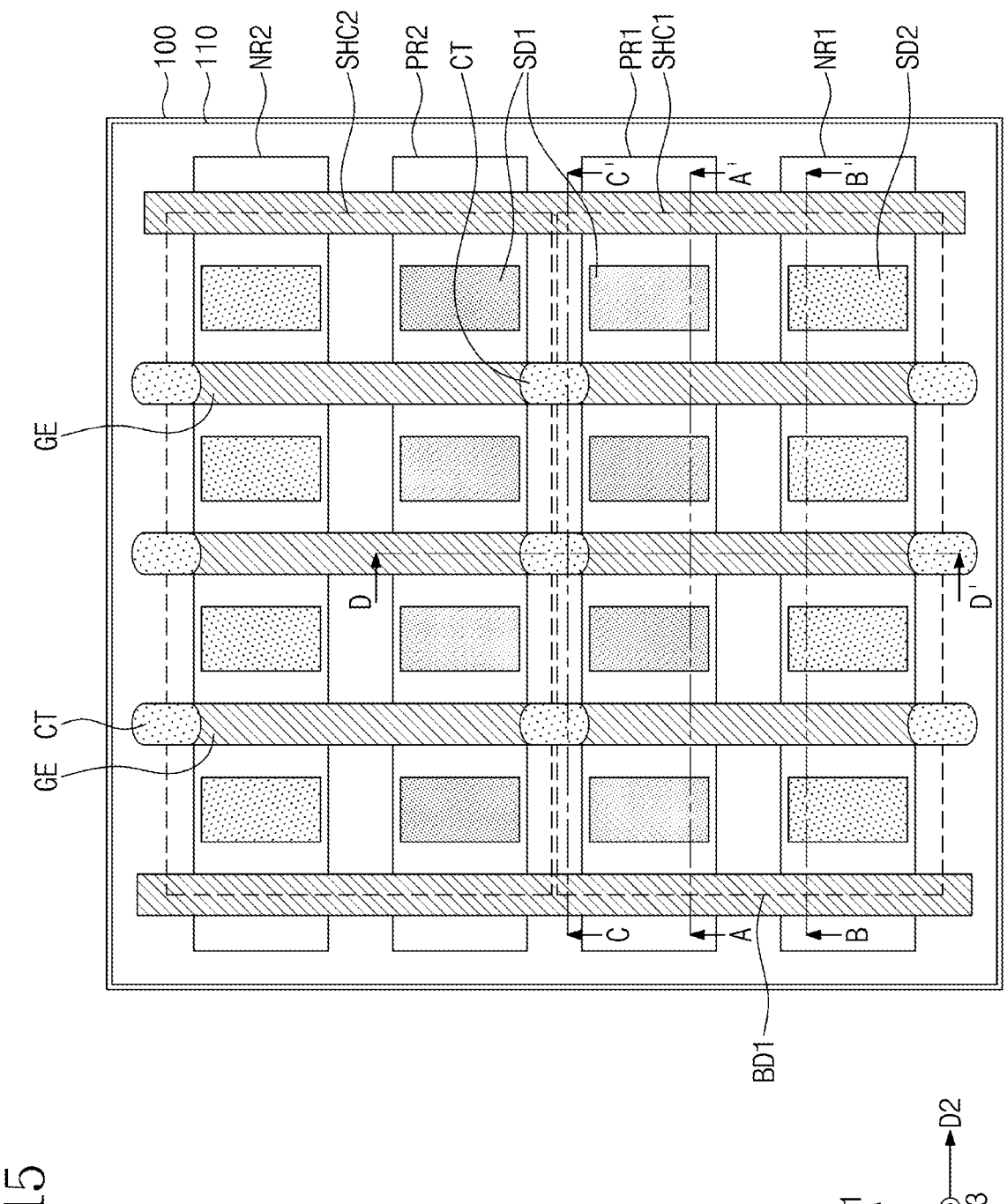
Figure 16A:
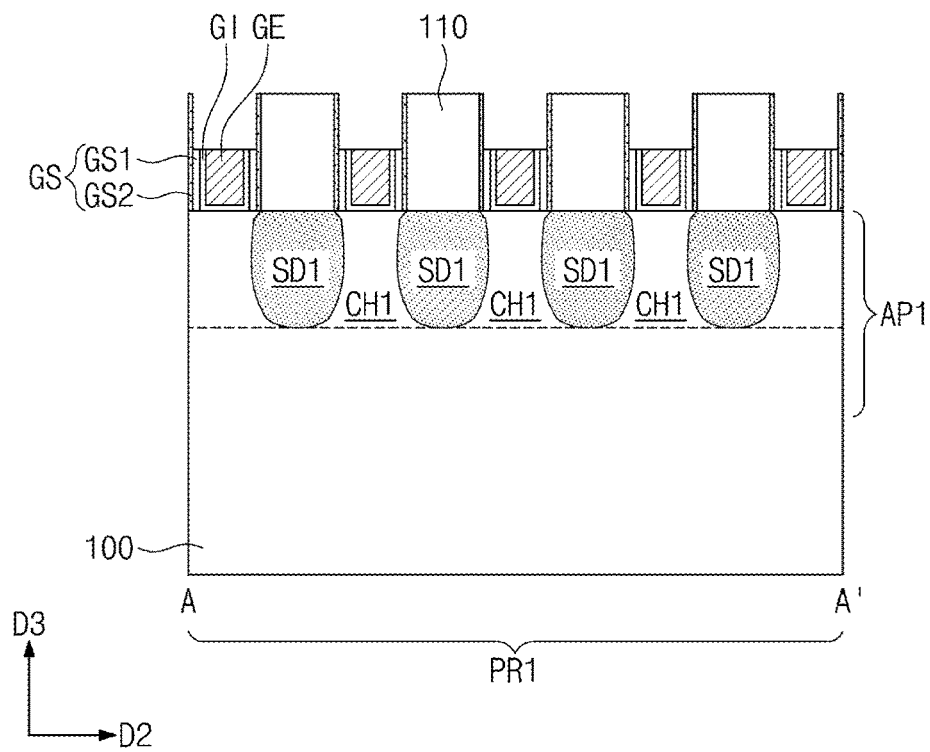
Figure 16B:
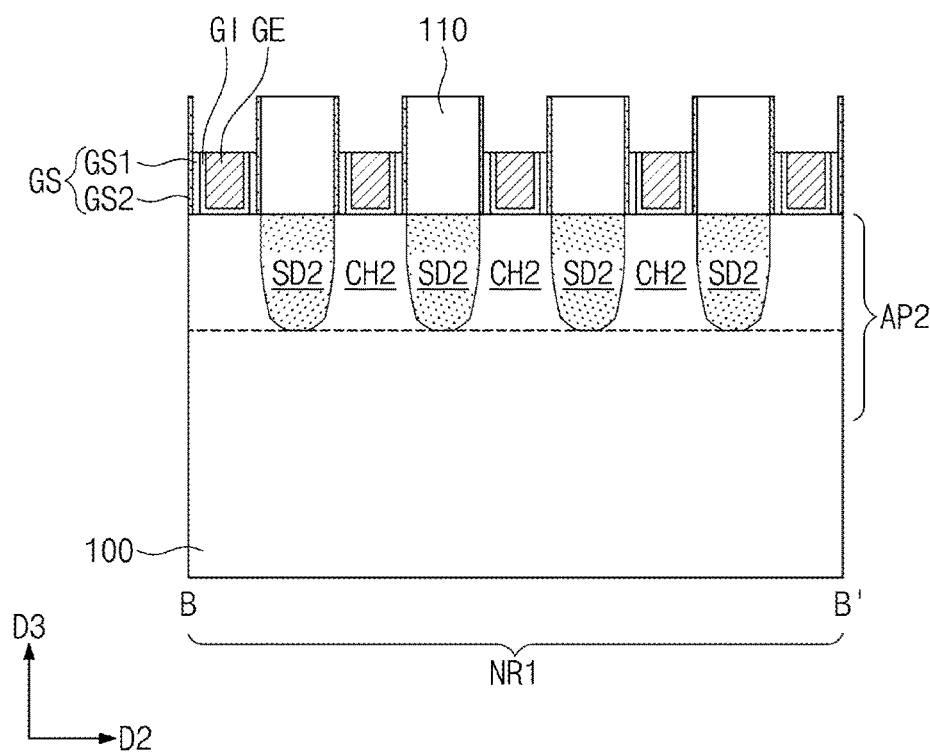
Figure 16C:
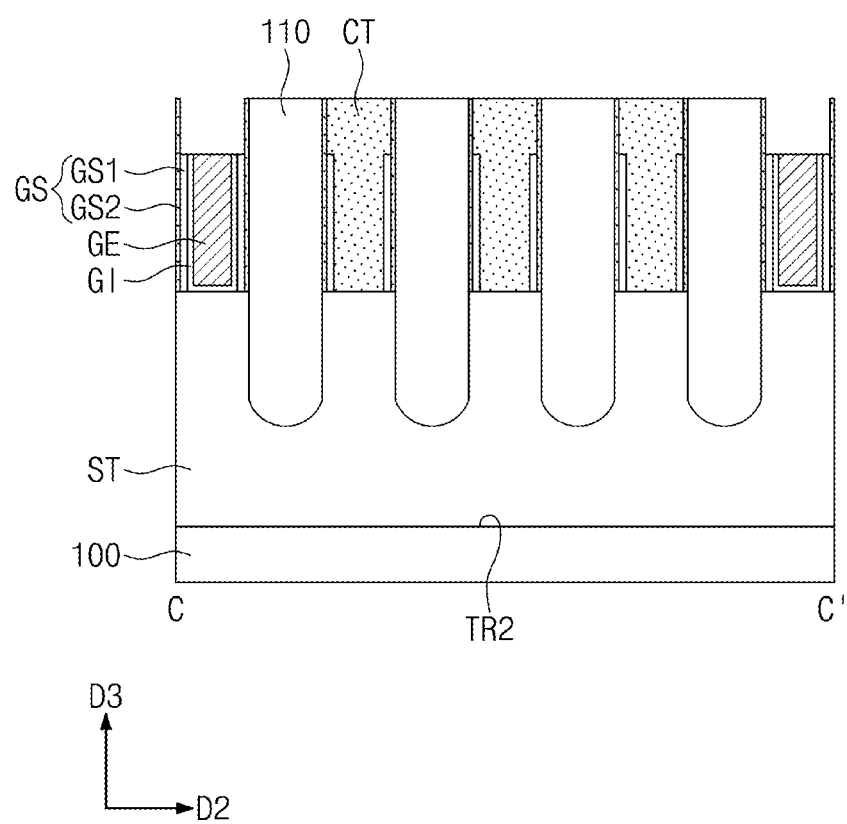
Figure 16D:
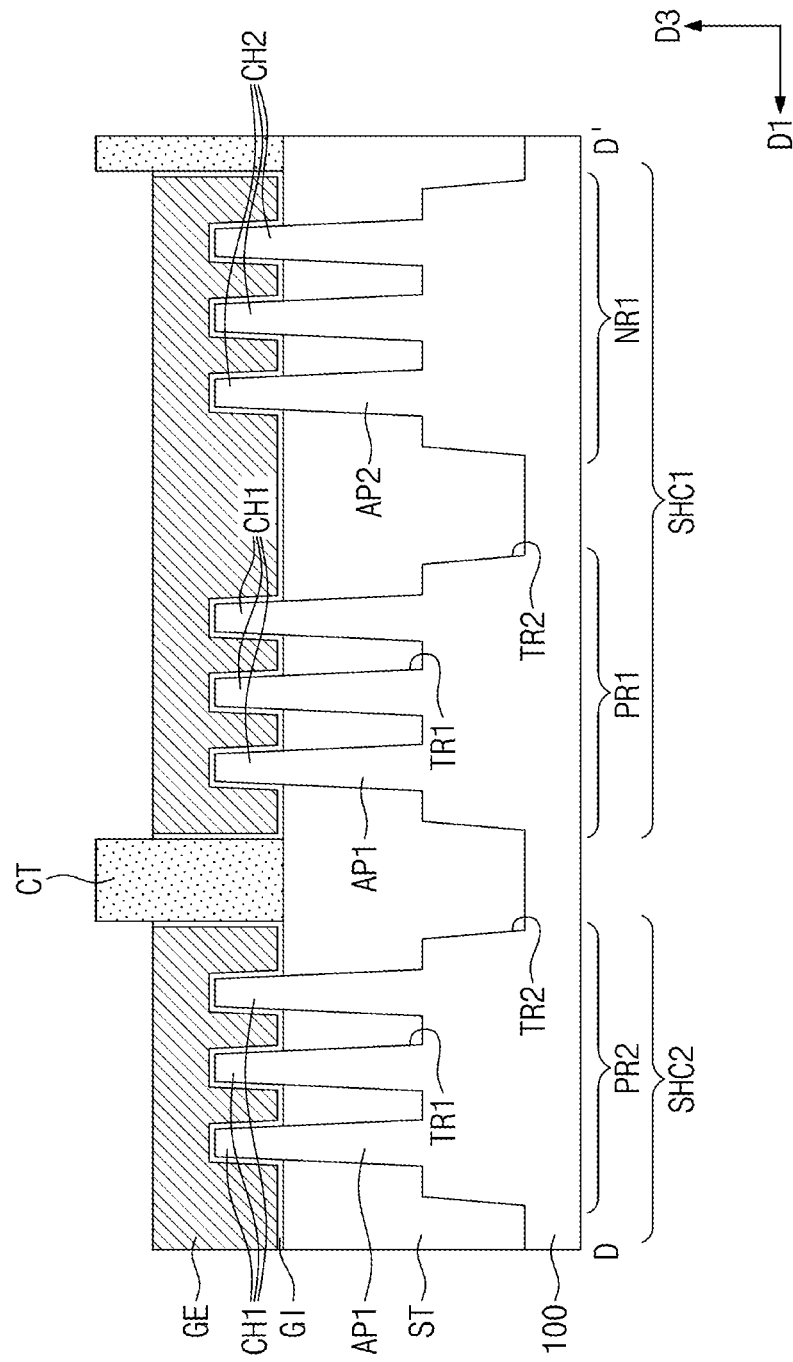
Figure 17:
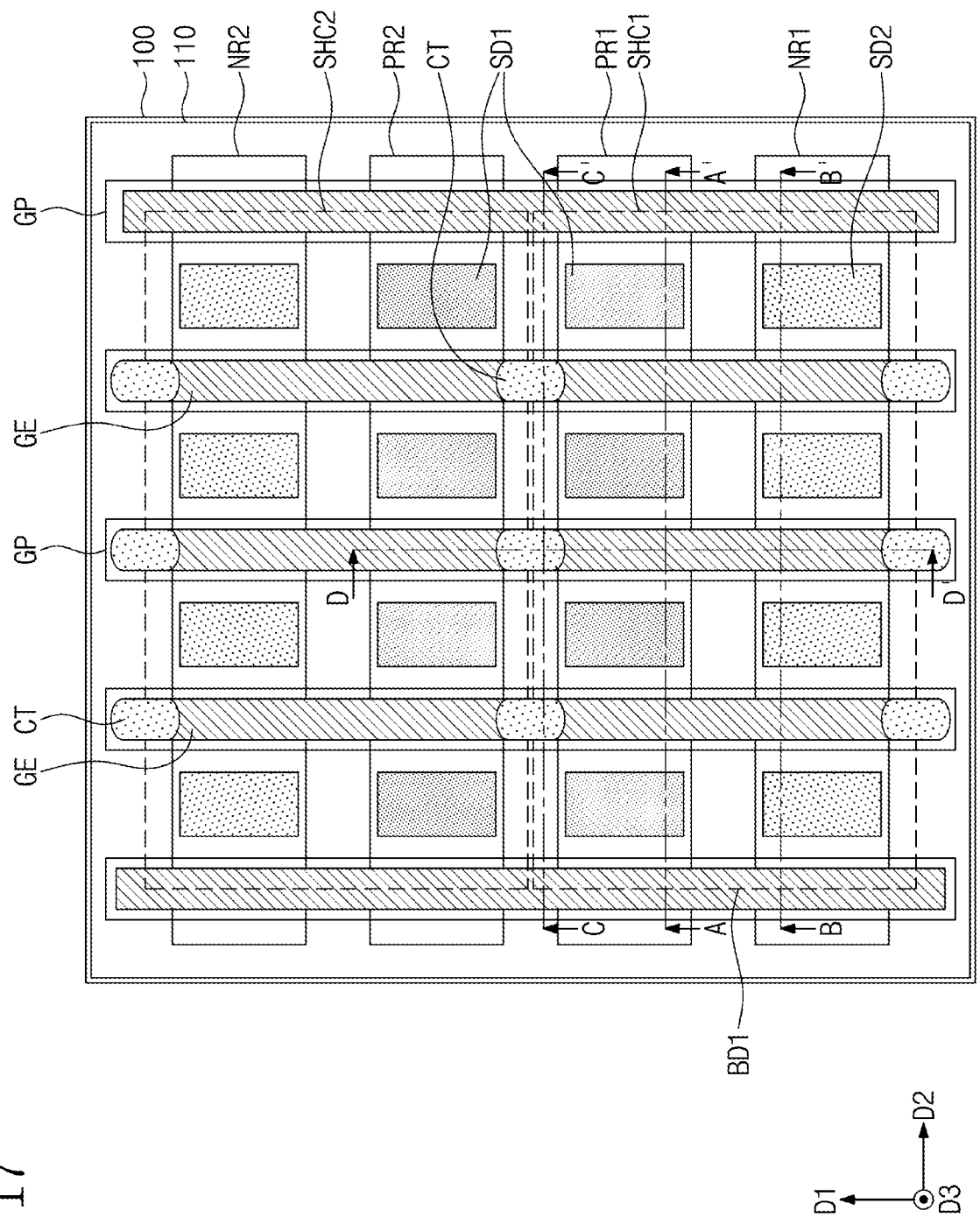
Figure 18A:
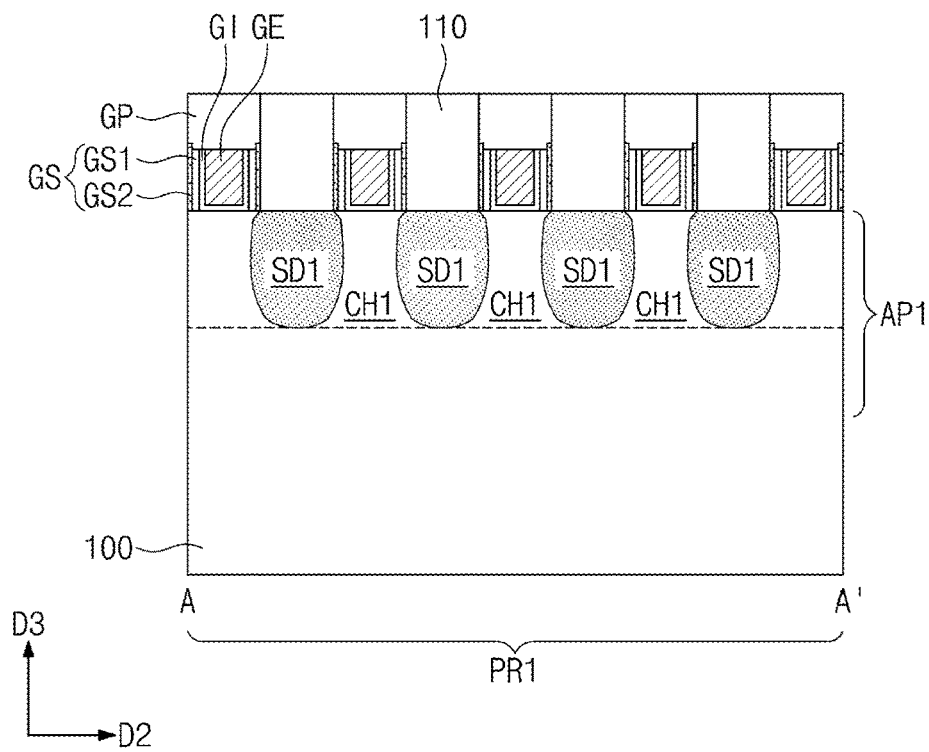
Figure 18B:
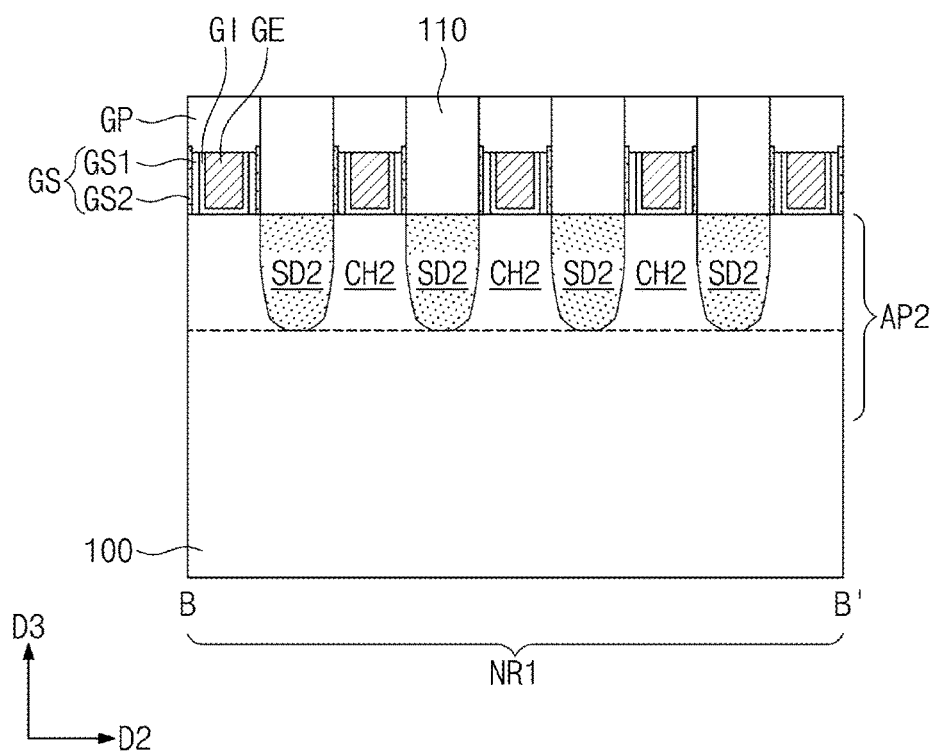
Figure 18C:
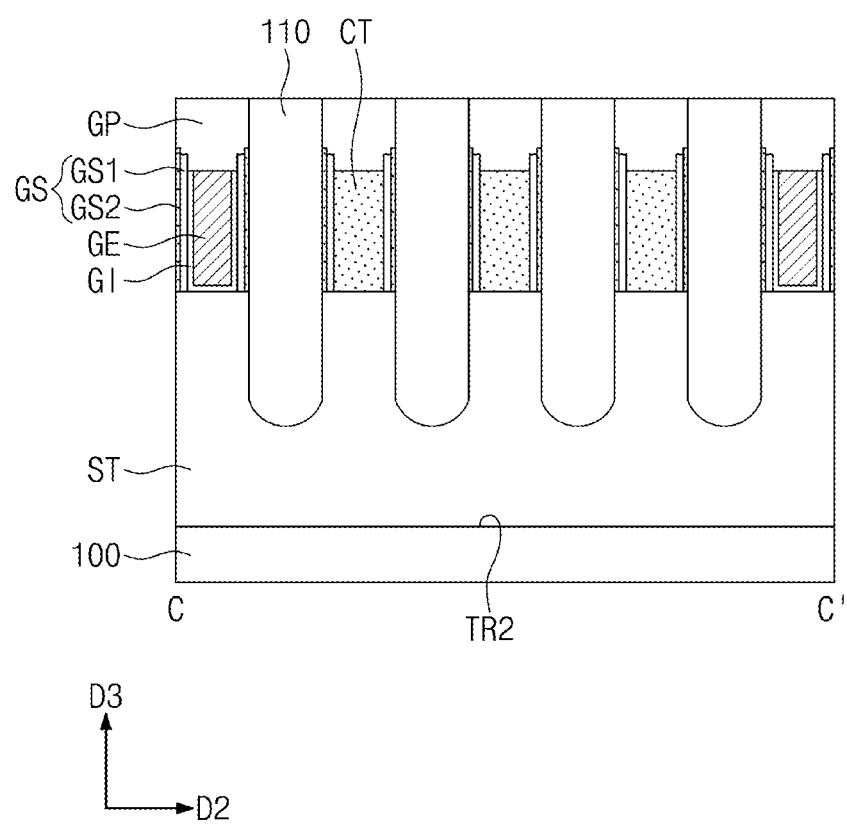
Figure 18D:
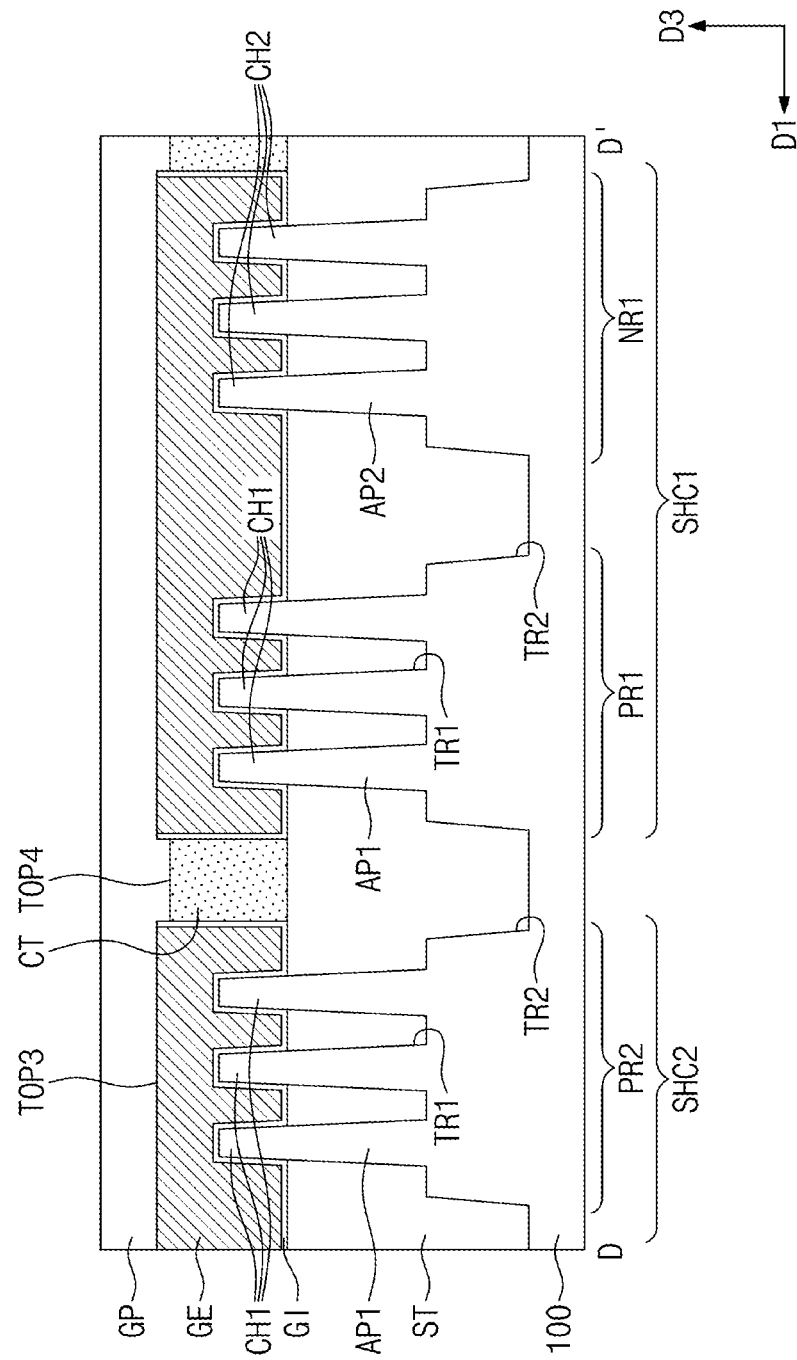

FIGS. 7, 9, 11, 13, 15, and 17 are plan views illustrating a method of fabricating a semiconductor device, according to an embodiment of the inventive concept. FIGS. 8A, 10A, 12A, 14A, 16A, and 18A are sectional views which are respectively taken along lines A-A' of FIGS. 7, 9, 11, 13, 15, and 17. FIGS. 8B, 10B, 12B, 14B, 16B, and 18B are sectional views which are respectively taken along lines B-B' of FIGS. 7, 9, 11, 13, 15, and 17. FIGS. 8C, 10C, 12C, 14C, 16C, and 18C are sectional views which are respectively taken along lines C-C' of FIGS. 7, 9, 11, 13, 15, and 17. FIGS. 10D, 12D, 14D, 16D, and 18D are sectional views which are respectively taken along lines D-D' of FIGS. 9, 11, 13, 15, and 17. FIG. 12E is a sectional view taken along a line E-E' of FIG. 11.

Referring to FIGS. 7 and 8A to 8C, the substrate 100 having the first PMOSFET region PR1, the second PMOSFET region PR2, the first NMOSFET region NR1, and the second NMOSFET region NR2 may be provided. The first NMOSFET region NR1 and the first PMOSFET region PR1 may define the first single height cell SHC1, and the second NMOSFET region NR2 and the second PMOSFET region PR2 may define the second single height cell SHC2.

The substrate 100 may be patterned to form the first and second active patterns AP1 and AP2. The first active patterns AP1 may be formed on each of the first and second PMOSFET regions PR1 and PR2. The second active patterns AP2 may be formed on each of the first and second NMOSFET regions NR1 and NR2.

The device isolation layer ST may be formed on the substrate 100. The device isolation layer ST may be formed of or include at least one of insulating materials (e.g., silicon oxide). The device isolation layer ST may be recessed to expose an upper portion of each of the first and second active patterns AP1 and AP2. Thus, the upper portion of each of the first and second active patterns AP1 and AP2 may protrude vertically above the device isolation layer ST.

Sacrificial patterns PP may be formed to cross the first and second active patterns AP1 and AP2. The sacrificial patterns PP may be formed to have a line or bar shape extending in the first direction D1.

In detail, the formation of the sacrificial patterns PP may include forming a first sacrificial layer on the substrate 100, forming mask patterns MA on the first sacrificial layer, and patterning the first sacrificial layer using the mask patterns MA as an etch mask. The first sacrificial layer may be formed of or include polysilicon.

According to an embodiment of the inventive concept, the patterning process to form the sacrificial patterns PP may include a lithography process using an extreme ultraviolet (EUV) light. In the present specification, the EUV light may have a wavelength ranging from about 4 nm to 124 nm and, in particular, from about 4 nm to 20 nm and may be, for example, an ultraviolet light having a wavelength of about 13.5 nm. The EUV light may have an energy of about 6.21 eV to 124 eV and, in particular, of about 90 eV to 95 eV.

The lithography process using the EUV light may include performing an exposing process of irradiating the EUV light onto a photoresist layer and performing a developing process. As an example, the photoresist layer may be an organic photoresist layer containing an organic polymer (e.g., polyhydroxystyrene). The organic photoresist layer may further include a photosensitive compound which can be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have a line shape extending in a specific direction, an island shape, a zigzag shape, a honeycomb shape, or a circular shape, but the inventive concept is not limited to these examples.

The mask patterns MA may be formed by patterning at least one layer, which is disposed therebelow, using the photoresist patterns as an etch mask. Thereafter, desired patterns (i.e., the sacrificial patterns PP) may be formed on a wafer by patterning a target layer (i.e., the sacrificial layer) using the mask patterns MA as an etch mask.

In a comparative example, to form fine-pitch patterns on the wafer, it may be necessary to perform a multi-patterning technology (VIPT) using two or more photomasks. By contrast, in the case where the EUV lithography process according to an embodiment of the inventive concept is performed, the sacrificial patterns PP may be formed to have a fine pitch, using just one photomask.

For example, the minimum pitch between the sacrificial patterns PP, which are realized by the EUV lithography process according to the present embodiment, may be less than or equal to about 45 nm. In other words, the EUV lithography process may be performed to precisely and finely form the sacrificial patterns PP, without a multi-patterning technology.

In an embodiment, the EUV lithography process may be used in the patterning process for forming not only the sacrificial patterns PP but also the first and second active patterns AP1 and AP2 described above, but the inventive concept is not limited to this example.

A pair of the gate spacers GS may be formed on opposing side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiOCN, or SiN.

The gate spacer GS may have a multi-layered structure including the first and second gate spacers GS1 and GS2, as previously described with reference to FIG. 6A. The first gate spacer GS1 may be formed of or include a low-k dielectric material (e.g., SiOCN). The second gate spacer GS2 may be formed of or include a material (e.g., SiN) having a good etch resistant property. The first gate spacer GS1 may be formed to be thicker than the second gate spacer GS2.

Referring to FIGS. 9 and 10A to 10D, the first source/drain patterns SD1 may be formed on or in upper portions of each of the first active patterns AP1. A pair of the first source/drain patterns SD1 may be formed at both opposing sides of each of the sacrificial patterns PP.

In detail, first recesses may be formed by etching the upper portion of the first active pattern AP1 using the mask patterns MA and the gate spacers GS as an etch mask. The device isolation layer ST between the first active patterns AP1 may be recessed during the etching of the upper portion of the first active pattern AP1 (e.g., see FIG. 10C).

The first source/drain pattern SD1 may be formed by performing a selective epitaxial growth process using an inner surface of the first recess of the first active pattern AP1 as a seed layer. As a result of the formation of the first source/drain patterns SD1, the first channel pattern CH1 may be defined between each pair of the first source/drain patterns SD1. As an example, the selective epitaxial growth process may include a chemical vapor deposition (CVD) process or a molecular beam epitaxy (MBE) process. The first source/drain patterns SD1 may be formed of or include a semiconductor material (e.g., SiGe) having a lattice constant greater than that of the substrate 100. Each of the first source/drain patterns SD1 may be a multi-layered structure including a plurality of semiconductor layers.

In an embodiment, the first source/drain patterns SD1 may be doped in an in-situ manner during a selective epitaxial growth process. In another embodiment, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed on the second active pattern AP2. A pair of the second source/drain patterns SD2 may be formed at both opposing sides of each of the sacrificial patterns PP. In detail, second recesses may be formed by etching an upper portion of the second active pattern AP2 using the mask patterns MA and the gate spacers GS as an etch mask. The second source/drain pattern SD2 may be formed by performing a selective epitaxial growth process using an inner surface of the second recess of the second active pattern AP2 as a seed layer. As a result of the formation of the second source/drain patterns SD2, the second channel pattern CH2 may be defined between each pair of the second source/drain patterns SD2. The second source/drain patterns SD2 may be formed of or include the same semiconductor material (e.g., Si) as the substrate 100. The second source/drain patterns SD2 may be doped to have a second conductivity type (e.g., n-type).

The first and second source/drain patterns SD1 and SD2 may be sequentially formed through different processes. In other words, the first source/drain patterns SD1 and the second source/drain patterns SD2 may not be formed at the same time.

Referring to FIGS. 11 and 12A to 12E, the first interlayer insulating layer 110 may be formed to cover the first and second source/drain patterns SD1 and SD2, the mask patterns MA, and the gate spacers GS. As an example, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. In an embodiment, the mask patterns MA may be fully removed during the planarization process. As a result, the top surface of the first interlayer insulating layer 110 may be coplanar with the top surfaces of the sacrificial patterns PP and the top surfaces of the gate spacers GS.

Referring to FIGS. 13 and 14A to 14D, the exposed sacrificial patterns PP may be selectively recessed. As a result of the recess of the sacrificial patterns PP, a top surface of each of the sacrificial patterns PP may be located at a level lower than the top surface of the first interlayer insulating layer 110.

The exposed first gate spacers GS1 may be selectively recessed. As a result of the recess of the first gate spacers GS1, a top surface of each of the first gate spacers GS1 may be located at a level lower than the top surface of the first interlayer insulating layer 110. The top surface of the first gate spacer GS1 may be located at a level which is substantially equal or similar to the top surface of the sacrificial pattern PP adjacent thereto.

During the afore-described process of recessing the sacrificial pattern PP and the first gate spacer GS1, the second gate spacer GS2 may not be recessed or etched. For example, the second gate spacer GS2 may be left or may remain as it is, even when the recessing process is finished.

The gate cutting patterns CT may be formed on borders or adjacent boundaries, which are parallel to the second direction D2, of each of the first and second single height cells SHC1 and SHC2. In detail, a mold layer may be formed on the recessed sacrificial pattern PP. A photolithography process may be performed to form a mask layer having openings, which define positions and shapes of the gate cutting patterns CT. An etching process may be performed to selectively remove the mold layer, which is exposed by the opening, and the sacrificial pattern PP, which is disposed below the mold layer. The gate cutting pattern CT may be formed by filling regions, which are formed by removing the mold layer and the sacrificial pattern PP thereunder, with an insulating material. Meanwhile, the mold layer covered with the mask layer and the sacrificial pattern PP disposed thereunder may not be removed and may be left or may remain. Thereafter, the mask layer and the mold layer may be selectively removed.

Referring back to FIG. 14C, a top surface of the gate cutting pattern CT may be formed at substantially the same level as the top surface of the second gate spacer GS2. An upper portion of the gate cutting pattern CT may cover the top surface of the first gate spacer GS1. The upper portion of the gate cutting pattern CT may be in contact with an inner side surface of the second gate spacer GS2. A width of an upper portion of the gate cutting pattern CT may be larger than a width of a lower portion of the gate cutting pattern CT.

Referring to FIGS. 15 and 16A to 16D, the left or remaining sacrificial patterns PP may be replaced with the gate electrodes GE. In detail, an empty space may be formed by selectively removing the exposed sacrificial pattern PP. The gate insulating layer GI and the gate electrode GE may be formed in the empty space.

The gate insulating layer GI may be formed to directly cover the first and second channel patterns CH1 and CH2 exposed through the empty space. The formation of the gate insulating layer GI may include forming a silicon oxide layer on the first and second channel patterns CH1 and CH2 and forming a high-k dielectric on the silicon oxide layer.

The gate electrode GE may be formed on the gate insulating layer GI. The gate electrode GE may include a first metal pattern and a second metal pattern on the first metal pattern. The first metal pattern may be formed of a work function metal, which is used to adjust a threshold voltage of a transistor, and the second metal pattern may be formed of a metallic material having a low resistance.

The gate insulating layer GI and the gate electrode GE, which are formed in the empty space, may be recessed. The gate electrode GE may be recessed until its top surface is located at a level that is equal to or lower than the top surface of the first gate spacer GS1. In an embodiment, the gate cutting pattern CT may not be recessed during the recessing of the gate insulating layer GI and the gate electrode GE and may be left or may remain as it is.

Referring to FIGS. 17 and 18A to 18D, the second gate spacer GS2 and the gate cutting pattern CT may be selectively recessed, after the recessing of the gate electrode GE. The recess process may include selectively etching a material (e.g., silicon nitride) constituting the second gate spacer GS2 and the gate cutting pattern CT. The second gate spacer GS2 may be recessed to have a top surface lower than the top surface of the first interlayer insulating layer 110. The gate cutting pattern CT may be recessed to have a top surface lower than the top surface of the gate electrode GE.

The gate capping pattern GP may be formed on the recessed gate electrode GE, the recessed gate spacer GS, and the recessed gate cutting pattern CT. The gate capping pattern GP may be formed to cover the top surface of the recessed gate electrode GE, the top surface of the recessed gate spacer GS, and the top surface of the recessed gate cutting pattern CT. The gate capping pattern GP may be formed of or include at least one of SiON, SiCN, SiOCN, or SiN. For example, the gate capping pattern GP may be formed of SiN.

Referring back to FIGS. 4 and 5A to 5E, the second interlayer insulating layer 120 may be formed on the first interlayer insulating layer 110. The second interlayer insulating layer 120 may include a silicon oxide layer. A pair of the division structures DB may be respectively formed at both opposing sides of the first single height cell SHC1. The division structures DB may be respectively overlapped with the gate electrodes GE that are formed at both opposing sides of the first single height cell SHC1. For example, the formation of the division structures DB may include forming a hole to penetrate the first and second interlayer insulating layers 110 and 120 and the gate electrode GE and to extend into the first and second active patterns AP1 and AP2 and then filling the hole with an insulating layer.

The active contacts AC may be formed to penetrate the second interlayer insulating layer 120 and the first interlayer insulating layer 110 and to be electrically connected to the first and second source/drain patterns SD1 and SD2. The upper insulating pattern UIP may be formed by replacing an upper portion of each of the active contacts AC with an insulating material. The gate contact GC may be formed to penetrate the second interlayer insulating layer 120 and the gate capping pattern GP and to be electrically connected to the gate electrode GE.

In the present embodiment, the gate capping pattern GP may be formed in an expanded structure covering both of the top surface of the recessed gate spacer GS and the top surface of the recessed gate cutting pattern CT. Since the active contact AC is formed in a self-aligned manner using the gate capping pattern GP as a mask, the active contact AC according to the present embodiment may be stably formed without a process failure.

The third interlayer insulating layer 130 may be formed on the second interlayer insulating layer 120. The first metal layer M1 may be formed in the third interlayer insulating layer 130. The formation of the first metal layer M1 may include forming the first power line M1_R1, the second power line M1_R2, the third power line M1_R3, and the first interconnection lines M1_I.

The fourth interlayer insulating layer 140 may be formed on the first metal layer M1. The second metal layer M2 may be formed in the fourth interlayer insulating layer 140. The formation of the second metal layer M2 may include forming the second interconnection lines M2_I. As an example, the second interconnection lines M2_I may be formed by a dual damascene process.

In an embodiment, the formation of the interconnection lines in the first metal layer M1 and/or the second metal layer M2 may include a lithography process using an EUV light. The EUV lithography process in the process of forming the interconnection lines (i.e., in a BEOL process) may be performed in substantially the same manner as the formation of the sacrificial patterns PP. For example, the minimum pitch between the first interconnection lines M1_I, which are realized by the EUV lithography process according to the present embodiment, may be less than or equal to about 45 nm.

Figure 19:
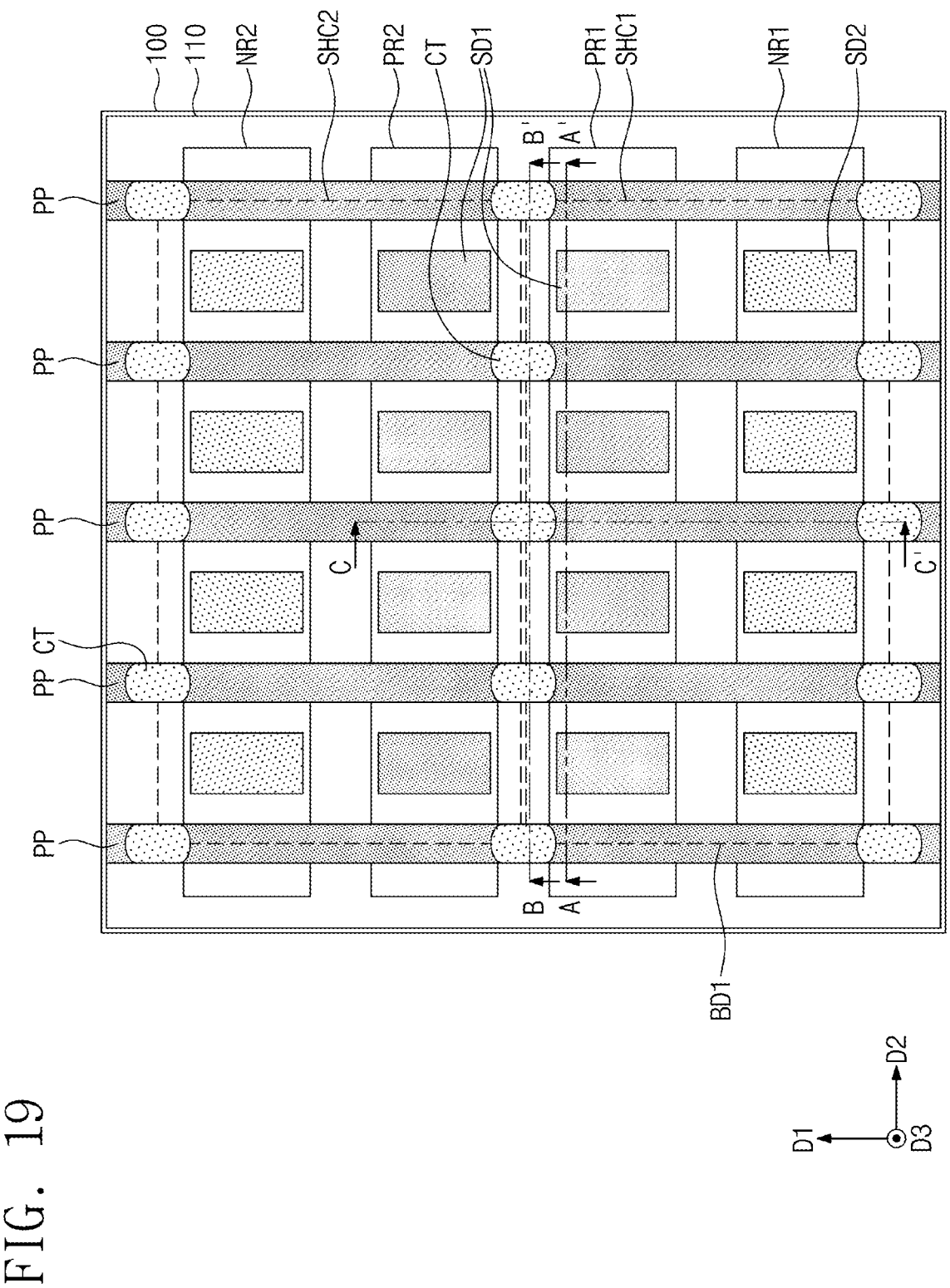
FIGS. 19, 21, and 23 are plan views illustrating a method of fabricating a semiconductor device, according to a comparative example.
Figure 20A:
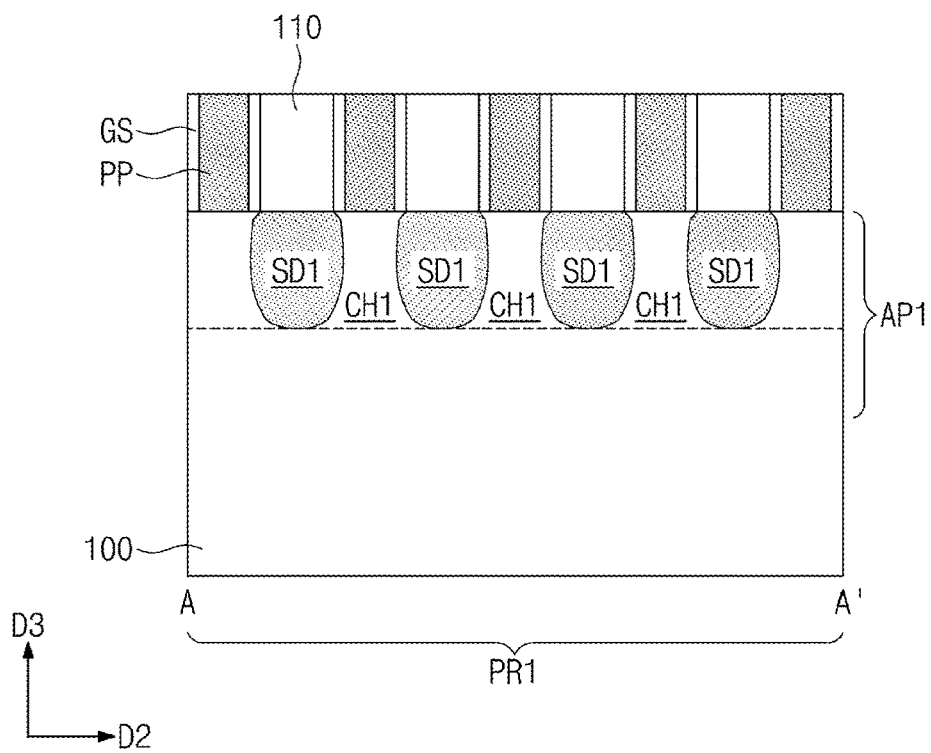
FIGS. 20A, 22A, and 24 are sectional views which are respectively taken along lines A-A' of FIGS. 19, 21, and 23.
Figure 20B:
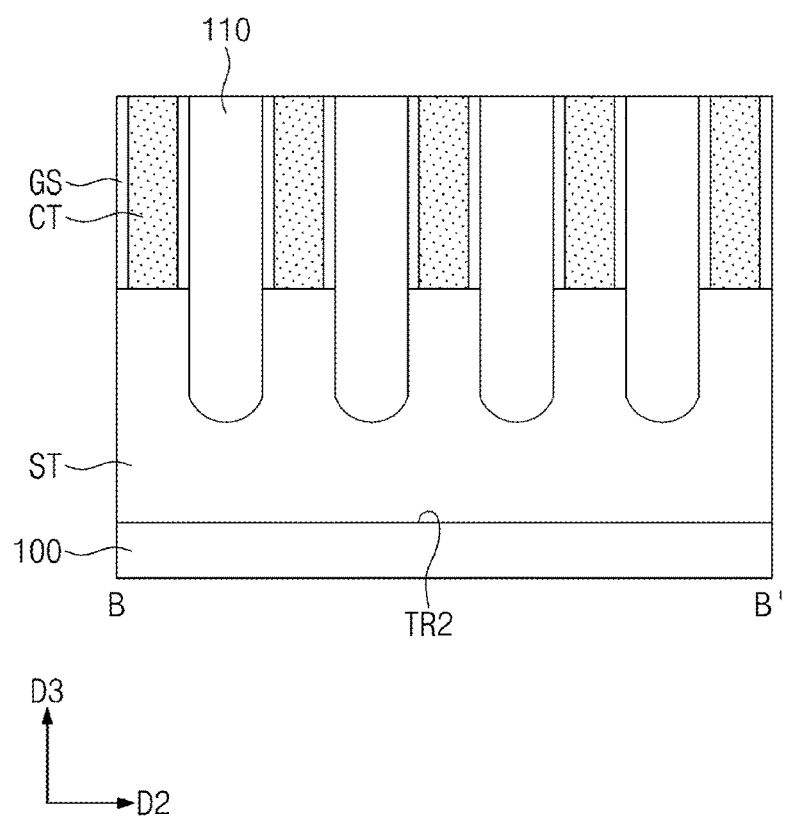
FIGS. 20B and 22B are sectional views which are respectively taken along lines B-B' of FIGS. 19 and 21.
Figure 20C:
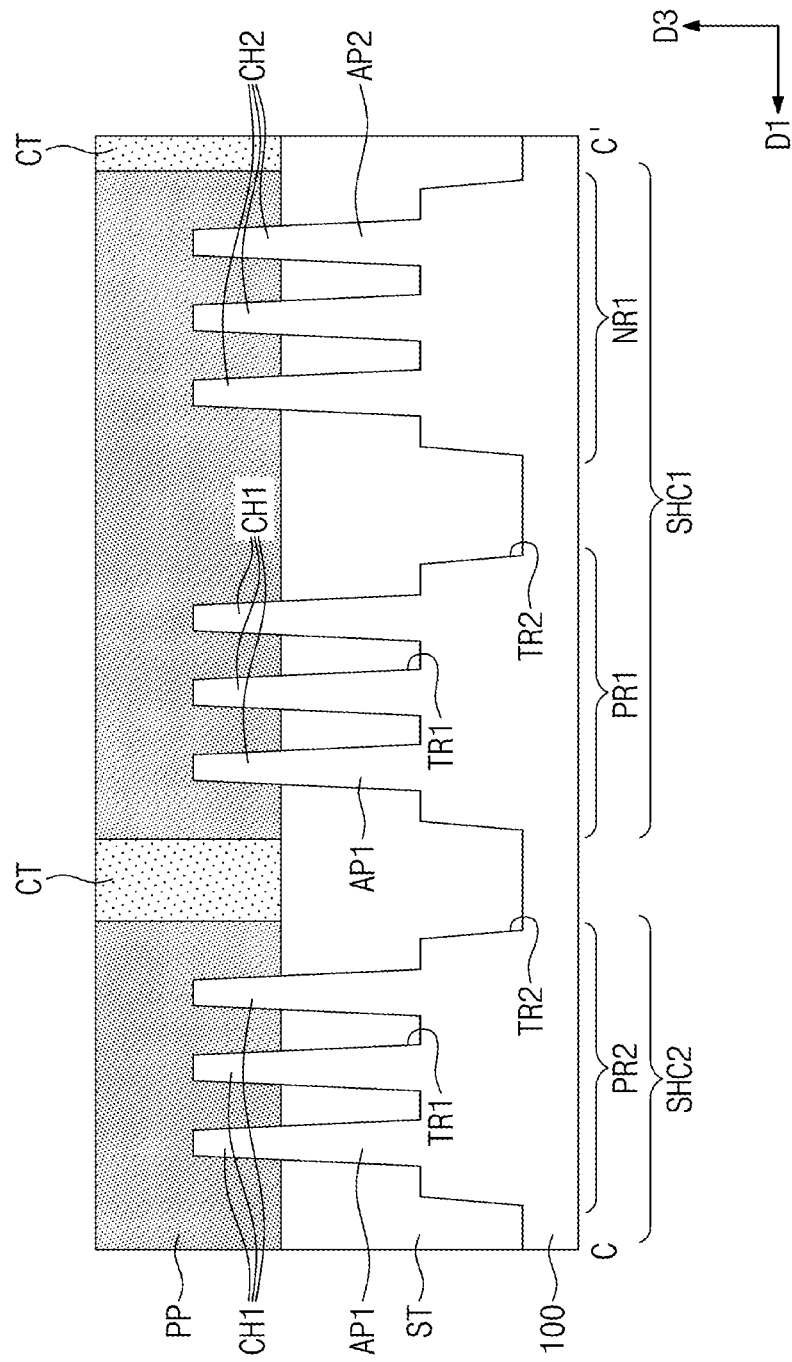
FIG. 20C is a sectional view taken along a line C-C' of FIG. 19.
Figure 21:
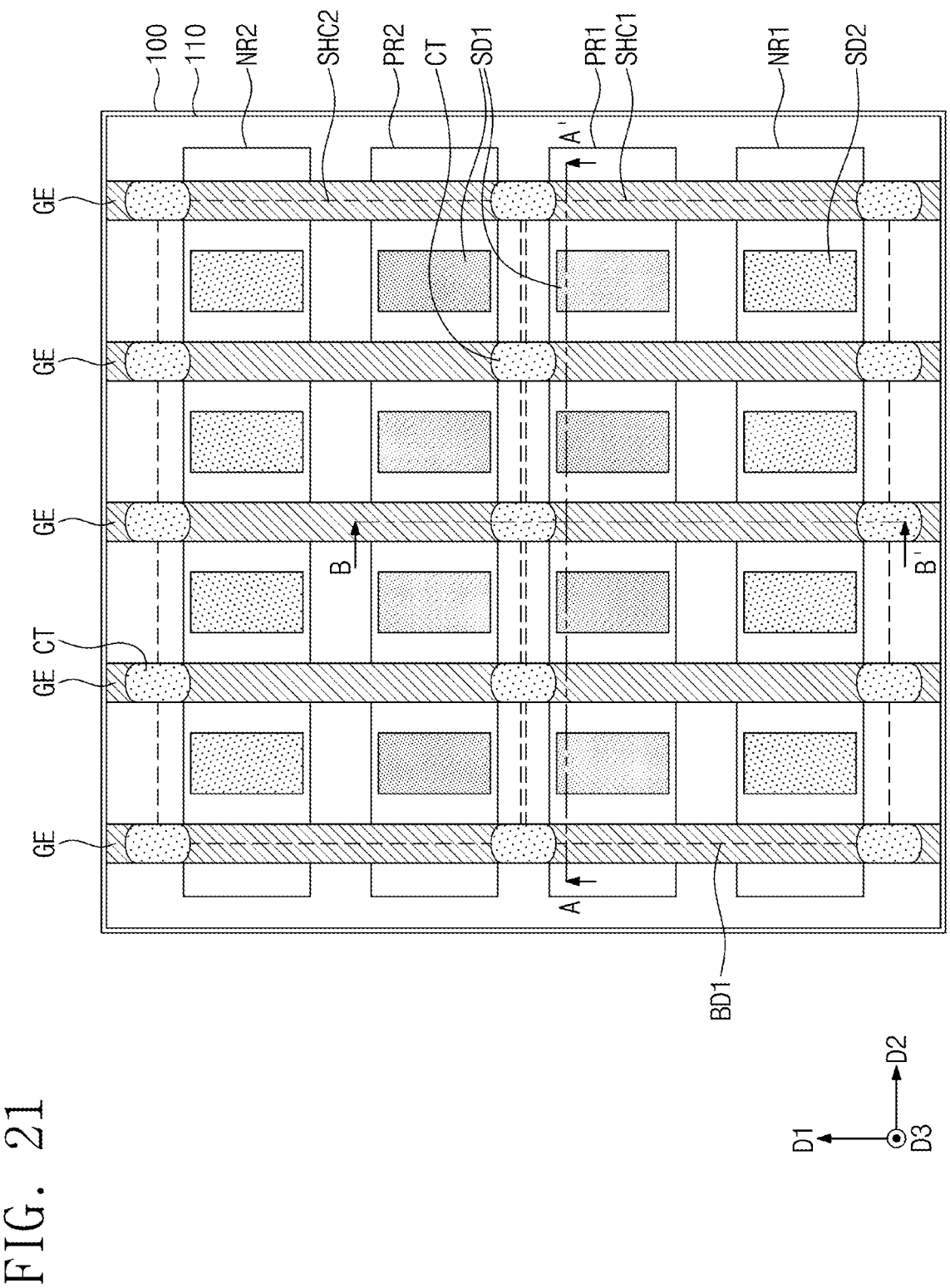
Figure 22A:
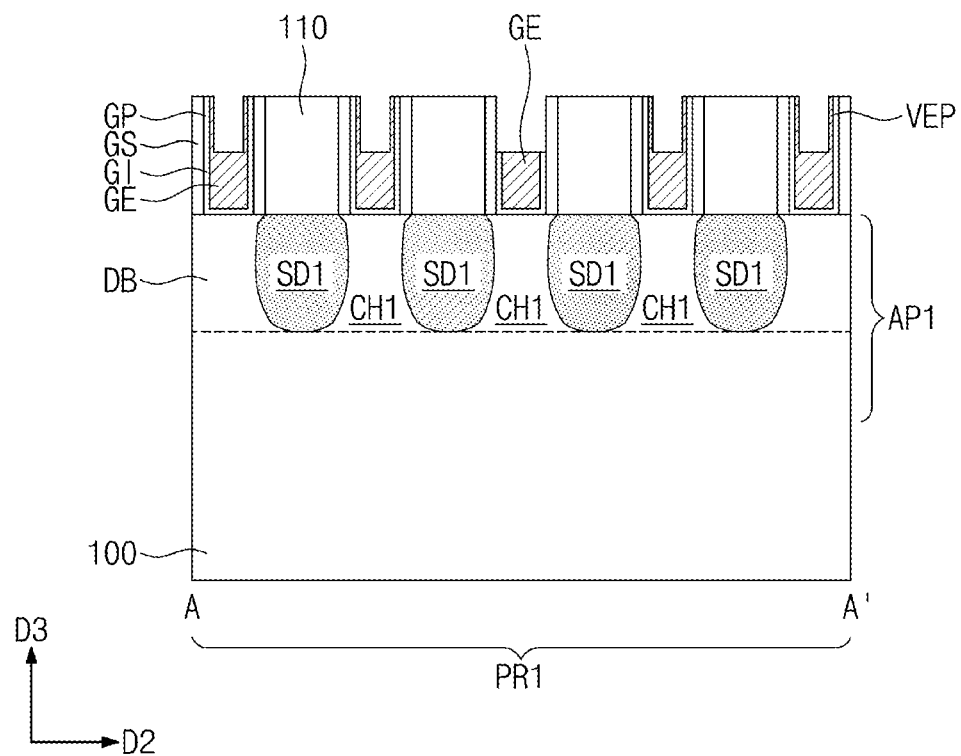
Figure 22B:
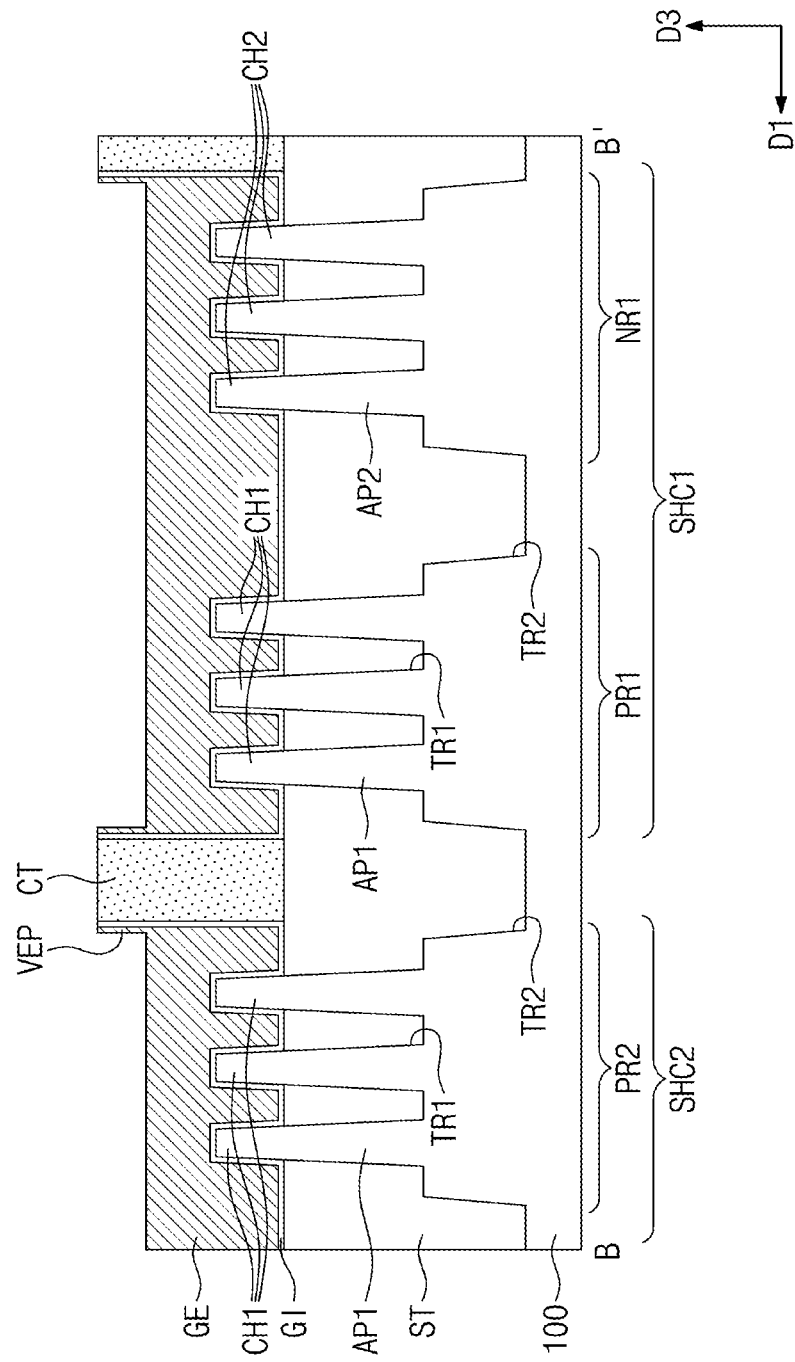
Figure 23:
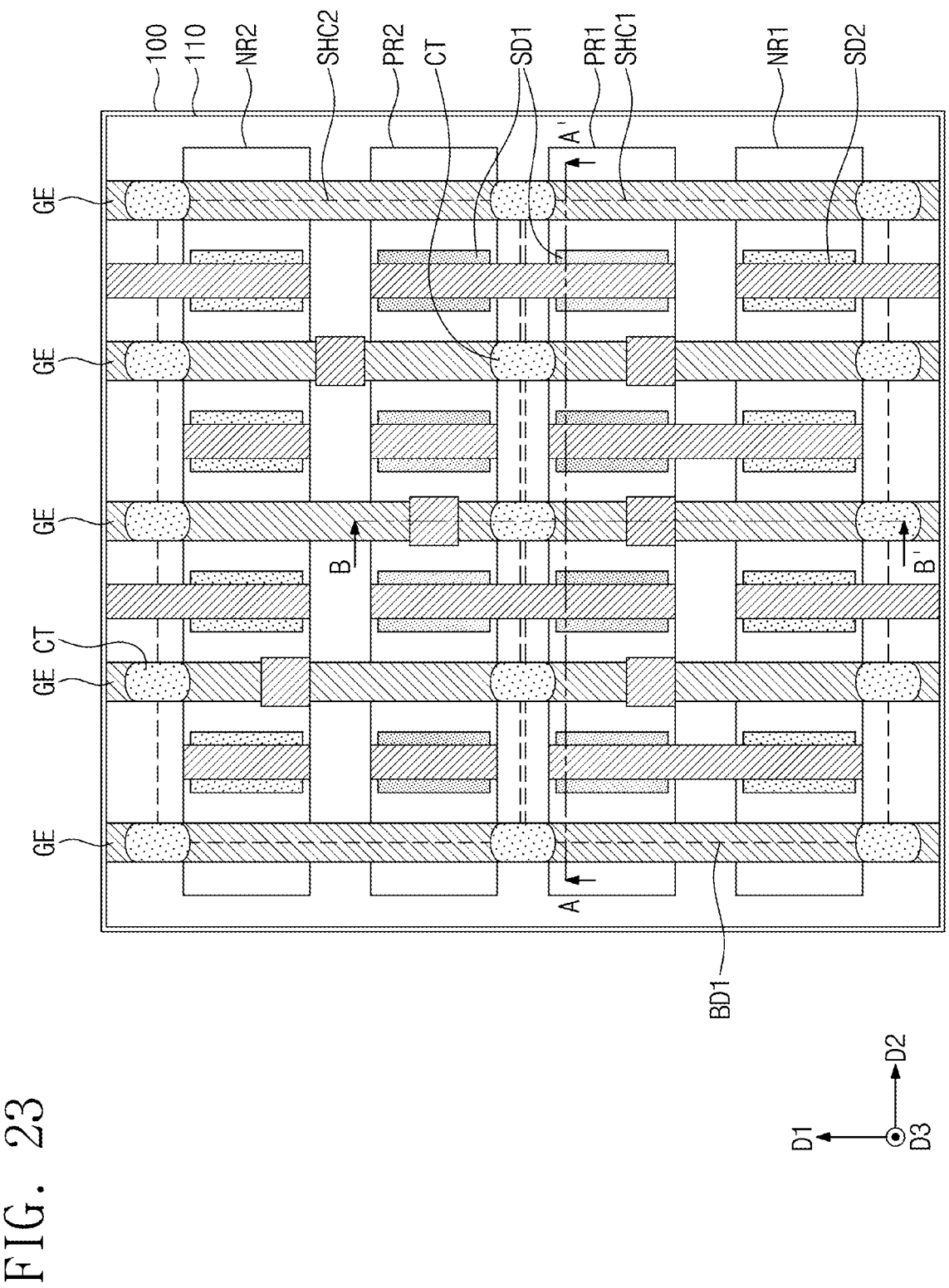
Figure 24:
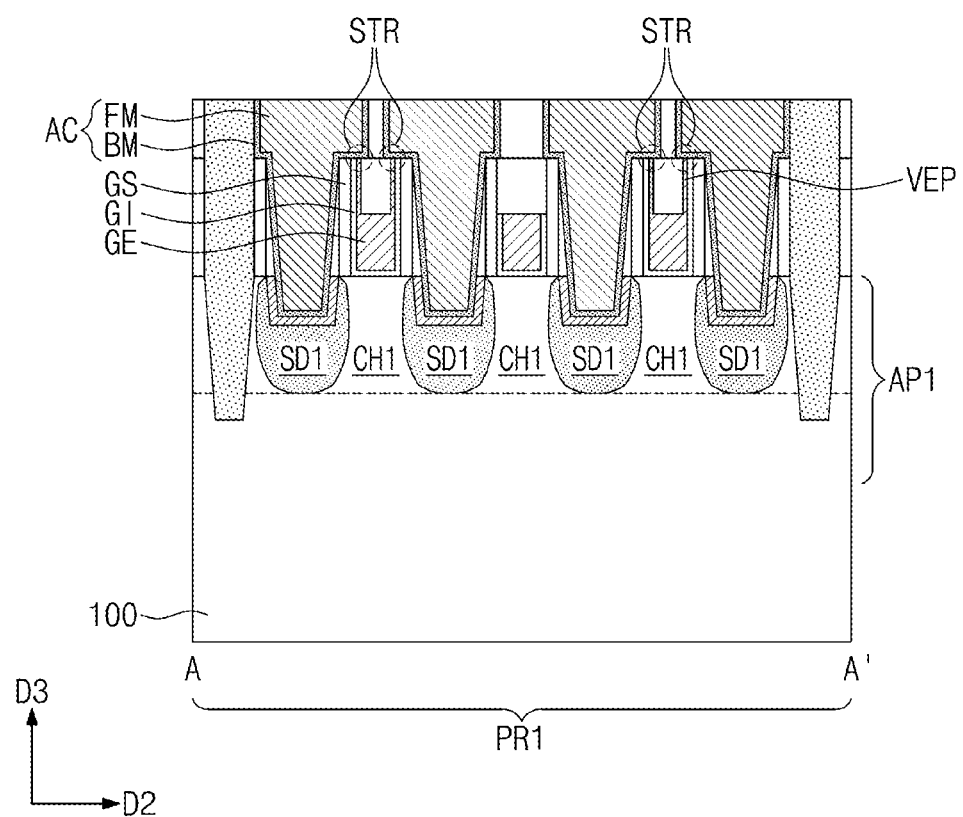

FIGS. 19, 21, and 23 are plan views illustrating a method of fabricating a semiconductor device, according to a comparative example. FIGS. 20A, 22A, and 24 are sectional views which are respectively taken along lines A-A' of FIGS. 19, 21, and 23. FIGS. 20B and 22B are sectional views which are respectively taken along lines B-B' of FIGS. 19 and 21. FIG. 20C is a sectional view taken along a line C-C' of FIG. 19.

Referring to FIGS. 19 and 20A to 20C, the gate cutting patterns CT may be formed on the structure described with reference to FIGS. 11 and 12A to 12E. Unlike the afore-described fabrication method according to an embodiment of the inventive concept, the process of recessing the gate spacers GS may be omitted in the comparative example.

Referring to FIGS. 21, 22A, and 22B, the sacrificial patterns PP may be replaced with the gate electrodes GE, respectively. Next, each of the gate electrodes GE may be recessed. Meanwhile, a portion of the gate electrode GE, which is formed in a space between the gate cutting pattern CT and the gate spacer GS, may not be removed during the recess process and may be left or may remain after the recess process. The left or remaining portion of the gate electrode GE may constitute a vertical extended portion VEP. That is, the gate electrode GE adjacent to the gate cutting pattern CT may include the vertical extended portion VEP, which is extended along the gate spacer GS and in the third direction D3.

Referring to FIGS. 23 and 24, the vertical extended portion VEP of the gate electrode GE may be left or may remain as it is, even when the formation of the gate capping pattern GP is finished. The vertical extended portion VEP may be exposed externally or to the outside, between the gate capping pattern GP and the first interlayer insulating layer 110.

Thereafter, the active contacts AC may be formed. Since the active contact AC are formed in a self-aligned manner, an upper portion of the active contact AC may have a structure expanded to the vertical extended portion VEP. Accordingly, the exposed vertical extended portion VEP of the gate electrode GE may be in contact with the active contact AC; that is, a short region STR may be formed. The short region STR may lead to an unintended electrical connection (i.e., an electrical short failure) between the gate electrode GE and the active contact AC and consequently serious deterioration in reliability of the semiconductor device.

By contrast, in the afore-described fabrication method according to an embodiment of the inventive concept, the first gate spacer GS1 may be previously recessed before the formation of the gate electrode GE. In addition, both of the second gate spacer GS2 and the gate cutting pattern CT may be recessed to a level similar to the top surface of the gate electrode GE. Thus, it may be possible to prevent the vertical extended portion VEP (e.g., see FIGS. 22A and 22B) of the gate electrode GE, which is extended along the gate spacer GS and the gate cutting pattern CT and in the third direction D3, from being formed. As a result, it may be possible to prevent an electrical short failure from occurring between the gate electrode GE and the active contact AC and thereby to improve reliability of the semiconductor device.

Figure 25:
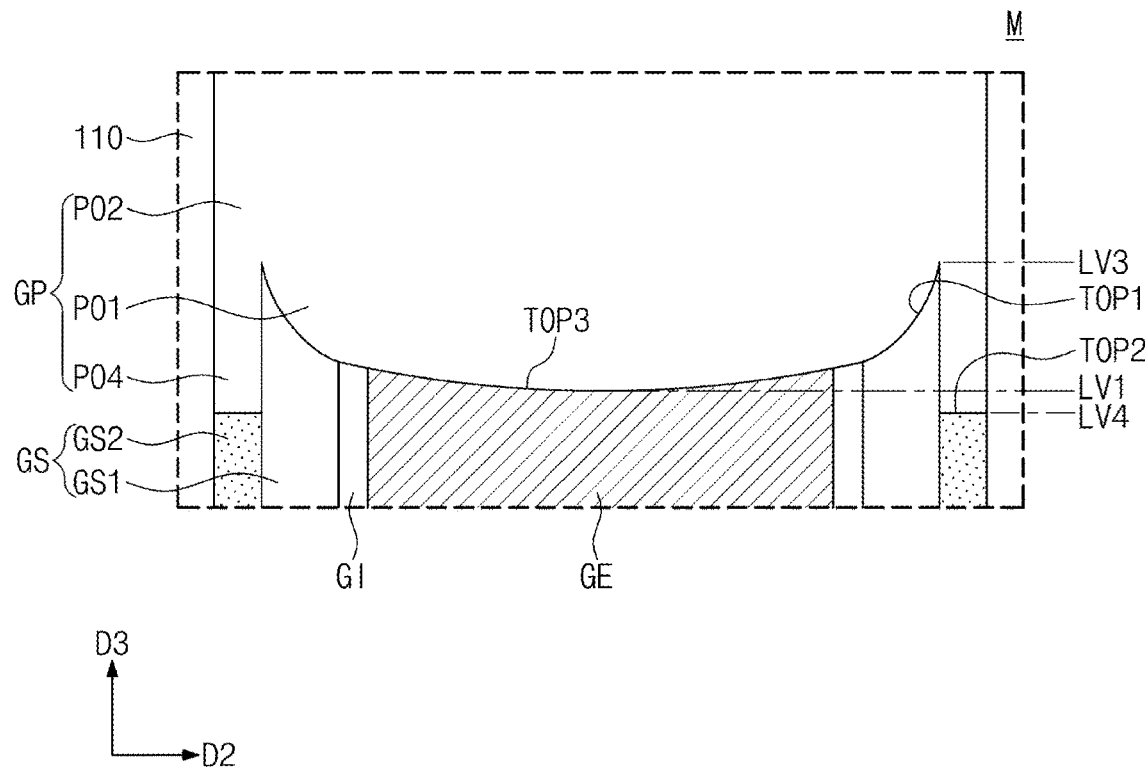
FIGS. 25 and 26 are enlarged sectional views, each of which illustrates a portion (e.g., a portion M of FIG. 5B) of a semiconductor device according to an embodiment of the inventive concept.
Figure 26:
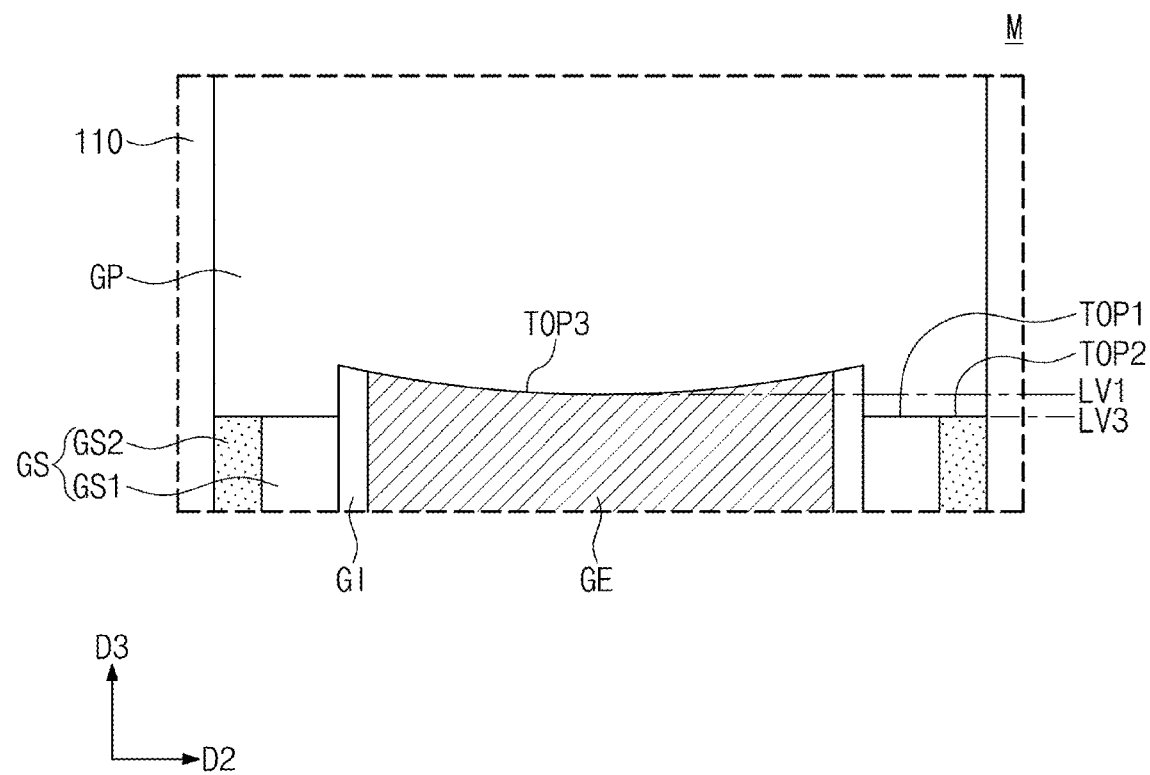
Figure 27A:
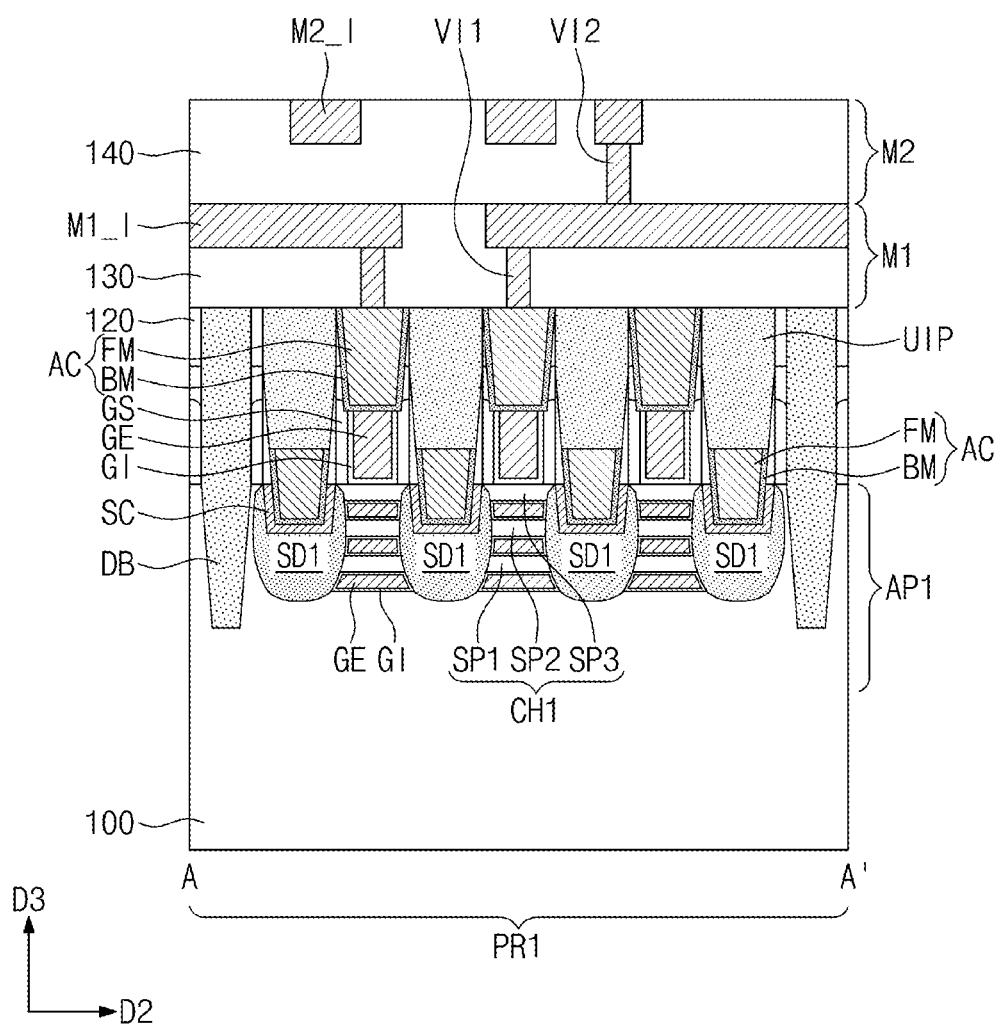
FIGS. 27A, 27B, 27C, 27D, and 27E are sectional views, which are respectively taken along the lines A-A', B-B', C-C', D-D', and E-E' of FIG. 4 to illustrate a semiconductor device according to an embodiment of the inventive concept.
Figure 27B:
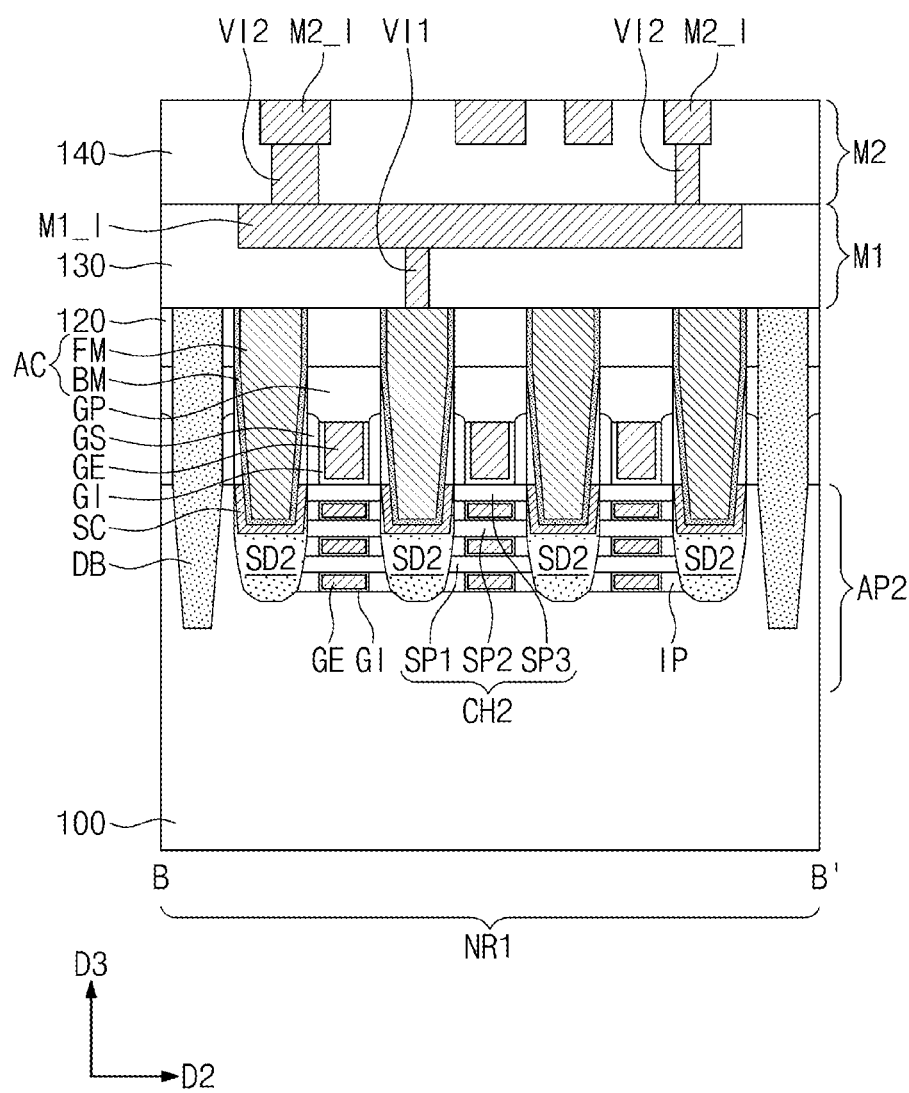
Figure 27C:
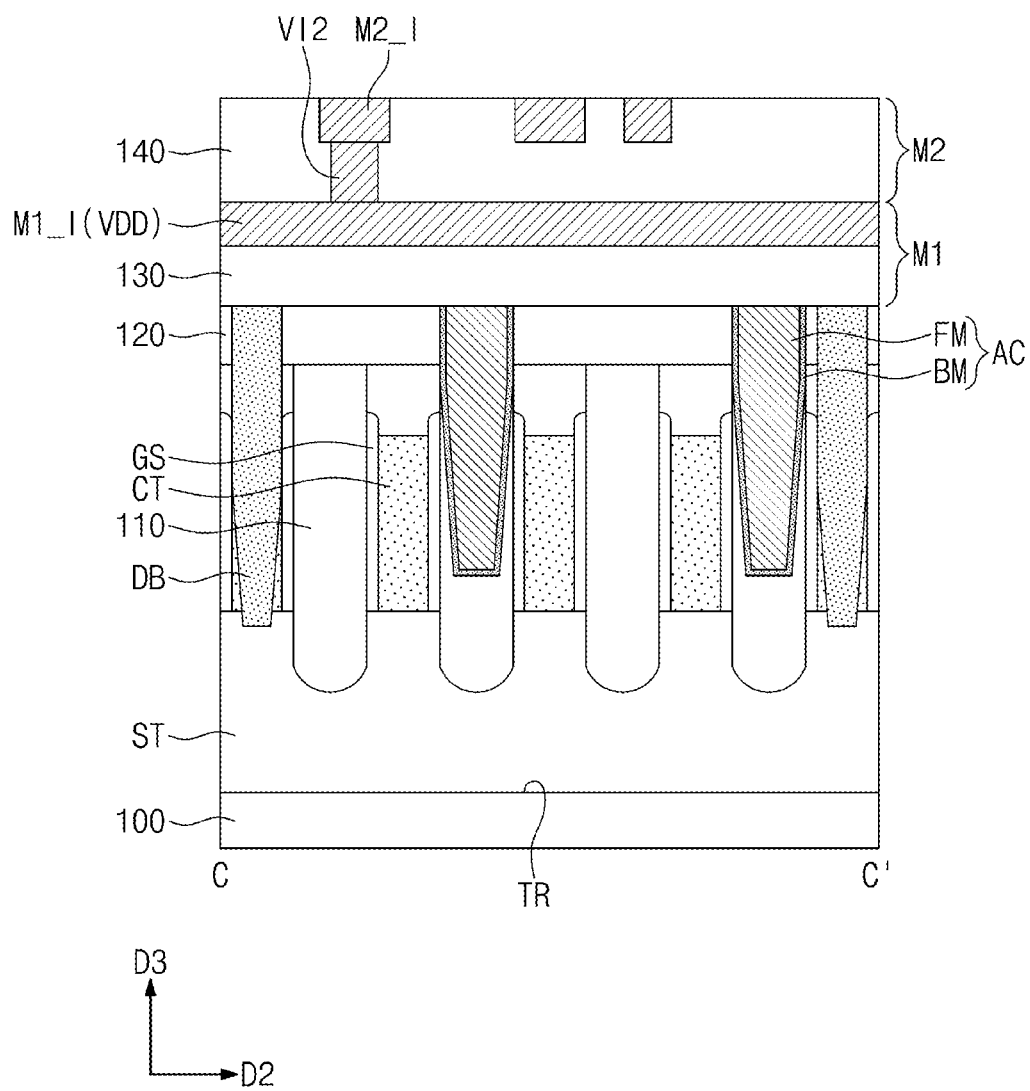
Figure 27D:
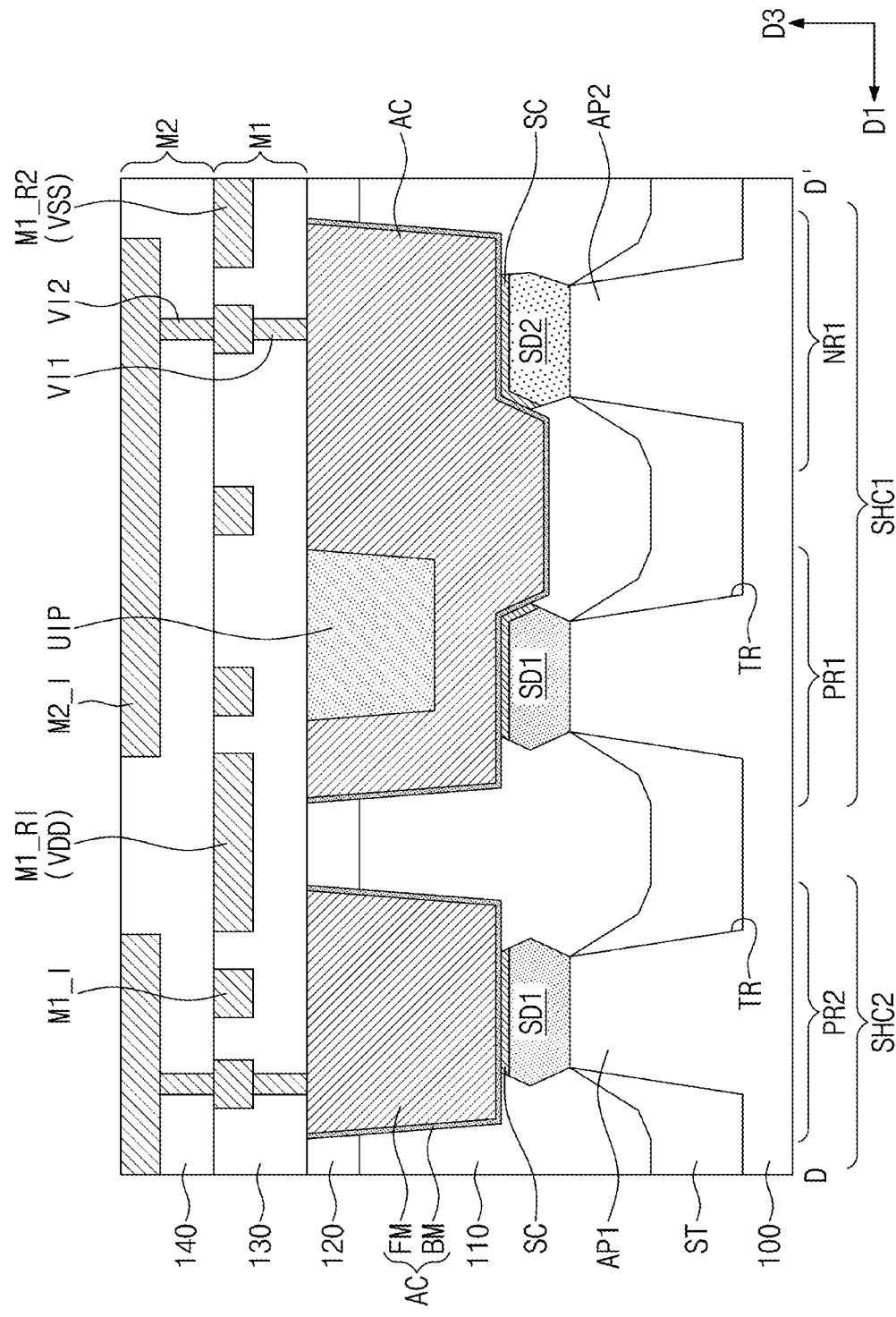
Figure 27E:
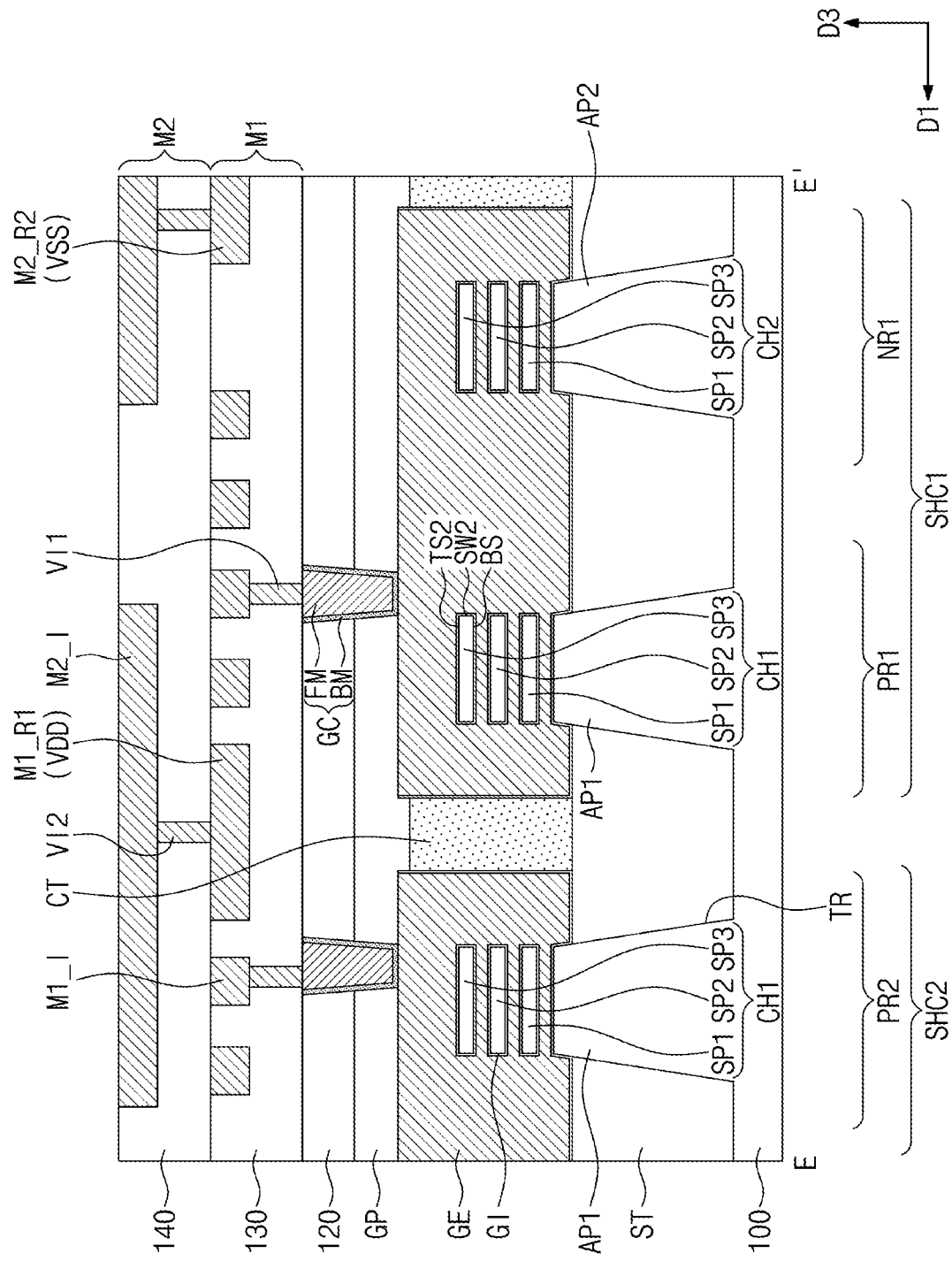

FIGS. 25 and 26 are enlarged sectional views, each of which illustrates a portion (e.g., a portion M of FIG. 5B) of a semiconductor device according to an embodiment of the inventive concept. In the following description, an element previously described with reference to FIGS. 5B and 6A may be identified by the same reference number without repeating an overlapping description thereof, for conciseness.

Referring to FIG. 25, the first top surface TOP1 of the first gate spacer GS1 may be located at a level different from (e.g., further from the substrate 100 than) the second top surface TOP2 of the second gate spacer GS2. In an embodiment, the second top surface TOP2 of the second gate spacer GS2 may be lower (i.e., closer to the substrate 100) than the first top surface TOP1 of the first gate spacer GS1.

For example, the uppermost point of the first top surface TOP1 of the first gate spacer GS1 may be located at a third level LV3, and the second top surface TOP2 of the second gate spacer GS2 may be located at a fourth level LV4. The lowermost point of the third top surface TOP3 of the gate electrode GE may be located at the first level LV1. The fourth level LV4 may be lower than the first level LV1. The third level LV3 may be higher than the first level LV1.

The gate capping pattern GP may further include a fourth portion PO4, which is in contact with the second top surface TOP2 of the second gate spacer GS2. The fourth portion PO4 may be interposed between the first interlayer insulating layer 110 and the first gate spacer GS1. The fourth portion PO4 may be vertically extended from the second portion PO2 toward the second top surface TOP2 of the second gate spacer GS2. The fourth portion PO4 of the gate capping pattern GP may be used as a mask, instead of the second gate spacer GS2, in a process of forming the active contact AC in a self-aligned manner.

Referring to FIG. 26, the first top surface TOP1 of the first gate spacer GS1 and the second top surface TOP2 of the second gate spacer GS2 may be located at the third level LV3. The lowermost point of the third top surface TOP3 of the gate electrode GE may be located at the first level LV1. Here, the third level LV3 may be lower (i.e., closer to the substrate 100) than the first level LV1. In other words, according to the present embodiment, both of the first and second gate spacers GS1 and GS2 may be recessed to a level that is lower than the top surface of the gate electrode GE, relative to the substrate 100. The gate capping pattern GP may be provided to cover each of the first top surface TOP1, the second top surface TOP2, and the third top surface TOP3.

FIGS. 27A to 27E are sectional views, which are respectively taken along the lines A-A', B-B', C-C', D-D', and E-E' of FIG. 4 to illustrate a semiconductor device according to an embodiment of the inventive concept. In the following description, an element previously described with reference to FIGS. 4 and 5A to 5E may be identified by the same reference number without repeating an overlapping description thereof, for conciseness.

Referring to FIGS. 4 and 27A to 27E, the substrate 100 including the first PMOSFET region PR1, the second PMOSFET region PR2, the first NMOSFET region NR1, and the second NMOSFET region NR2 may be provided. The device isolation layer ST may be provided on the substrate 100. The device isolation layer ST may define the first and second active patterns AP1 and AP2 in an upper portion of the substrate 100. In detail, a trench TR may be formed in an upper portion of the substrate 100 to define the first and second active patterns AP1 and AP2, and the device isolation layer ST may be formed to fill the trench TR. The first active pattern AP1 may be provided on each of the first and second PMOSFET regions PR1 and PR2, and the second active pattern AP2 may be provided on each of the first and second NMOSFET regions NR1 and NR2.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include at least one of silicon (Si), germanium (Ge), or silicon-germanium (SiGe). In an embodiment, each of the first to third semiconductor patterns SP1, SP2, and SP3 may be formed of or include crystalline silicon.

The first source/drain patterns SD1 may be provided on the first active pattern AP1. The stacked first to third semiconductor patterns SP1, SP2, and SP3 of the first channel pattern CH1 may be interposed between each adjacent pair of the first source/drain patterns SD1. The stacked first to third semiconductor patterns SP1, SP2, and SP3 may connect each adjacent pair of the first source/drain patterns SD1 to each other.

The second source/drain patterns SD2 may be provided on the second active pattern AP2. The stacked first to third semiconductor patterns SP1, SP2, and SP3 of the second channel pattern CH2 may be interposed between each adjacent pair of the second source/drain patterns SD2. The stacked first to third semiconductor patterns SP1, SP2, and SP3 may connect each adjacent pair of the second source/drain patterns SD2 to each other.

The gate electrodes GE may be provided to cross the first and second channel patterns CH1 and CH2 and to extend in the first direction D1. The gate electrode GE may be vertically overlapped with the first and second channel patterns CH1 and CH2. A pair of the gate spacers GS may be disposed on opposing side surfaces of the gate electrode GE. The gate capping pattern GP may be provided on the gate electrode GE.

The gate electrode GE, the gate spacer GS, the gate cutting pattern CT, and the gate capping pattern GP according to the present embodiment may be configured to have substantially the same features as those in the previous embodiment described with reference to FIGS. 6A to 6C.

Referring back to FIG. 27E, the gate electrode GE may be provided to surround the first to third semiconductor patterns SP1, SP2, and SP3 of each of the first and second channel patterns CH1 and CH2. The transistor according to the present embodiment may be a three-dimensional field effect transistor (e.g., MBCFET or GAAFET) in which the gate electrode GE is provided to three-dimensionally surround the channel pattern CH1 or CH2. In detail, each of the first to third semiconductor patterns SP1, SP2, and SP3 may include a second top surface TS2, second side surfaces SW2, and a bottom surface BS. The gate electrode GE may be provided to face each of the second top surface TS2, the second side surfaces SW2, and the bottom surface BS.

The gate insulating layer GI may be provided between each of the first to third semiconductor patterns SP1, SP2, and SP3 and the gate electrode GE. The gate insulating layer GI may be provided to surround each of the first and second channel patterns CH1 and CH2. The gate insulating layer GI may cover the second top surface TS2, the second side surfaces SW2, and the bottom surface BS of each of the first to third semiconductor patterns SP1, SP2, and SP3.

An inner spacer IP, which is interposed between the gate insulating layer GI and the second source/drain pattern SD2, may be provided on each of the first and second NMOSFET regions NR1 and NR2. The gate electrode GE may be spaced apart from the second source/drain pattern SD2 by the gate insulating layer GI and the inner spacer IP. By contrast, the inner spacer IP may be omitted on the first and second PMOSFET regions PR1 and PR2.

The first interlayer insulating layer 110 and the second interlayer insulating layer 120 may be provided on the substrate 100. The active contacts AC may be provided to penetrate the first and second interlayer insulating layers 110 and 120 and may be connected to the first and second source/drain patterns SD1 and SD2, respectively. The gate contacts GC may be provided to penetrate the second interlayer insulating layer 120 and the gate capping pattern GP and may be respectively connected to the gate electrodes GE. The active contacts AC and gate contacts GC may be substantially the same as those in the previous embodiment described with reference to FIGS. 4 and 5A to 5E.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first and second metal layers M1 and M2 may be configured to have substantially the same features as those in the embodiments previously described with reference to FIGS. 4 and 5A to 5E.

In a semiconductor device according to an embodiment of the inventive concept, a gate capping pattern may have an expanded structure fully covering respective top surfaces of a gate cutting pattern and a gate spacer. The gate capping pattern may effectively reduce or prevent an etching material from infiltrating into a gate electrode adjacent thereto, when an active contact is formed. As a result, it may be possible to form a self-aligned contact structure, without a process defect, and thereby to improve reliability of the semiconductor device.

In a method of fabricating a semiconductor device according to an embodiment of the inventive concept, the gate spacer may be previously recessed, and then, the gate cutting pattern and the gate electrode may be formed. Furthermore, the gate cutting pattern may be recessed, and the gate capping pattern may be formed thereon. Thus, it may be possible to minimize or prevent a vertical extended portion of the gate electrode from being left or remaining along the gate spacer and the gate cutting pattern. It may be possible to reduce or prevent an electrical short circuit failure from occurring between the gate electrode and the active contact and thereby to improve reliability of the semiconductor device.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

While example embodiments of the inventive concept have been particularly shown and described, it will be understood by one of ordinary skill in the art that variations in form and detail may be made therein without departing from the scope of the attached claims.

What is claimed is:

1. A semiconductor device, comprising:
   a substrate comprising a first active pattern and a second active pattern;
   a gate electrode extending in a first direction crossing the first and second active patterns, the gate electrode comprising a first gate electrode on the first active pattern and a second gate electrode on the second active pattern;
   a gate cutting pattern extending between the first and second gate electrodes;
   gate spacers on opposing side surfaces of the gate electrode; and
   a gate capping pattern on a top surface of the gate electrode, a top surface of the gate cutting pattern that is between the first and second gate electrodes in the first direction, and top surfaces of the gate spacers and extending in the first direction,
   wherein the gate cutting pattern comprises first and second side surfaces that are opposite to each other in a second direction crossing the first direction, and are in contact with respective ones of the gate spacers, and
   wherein the top surface of the gate cutting pattern, which is between the first and second gate electrodes in the first direction, is closer to the substrate than the top surfaces of the gate spacers.

2. The semiconductor device of claim 1, wherein the gate cutting pattern further comprises a third side surface and a fourth side surface, which are opposite to each other in the first direction,
   the third side surface is convex toward the first gate electrode, and
   the fourth side surface is convex toward the second gate electrode.

3. The semiconductor device of claim 2, further comprising:
   a gate insulating layer between the gate electrode and the first and second active patterns and between the gate electrode and the gate cutting pattern,
   wherein the gate insulating layer extends on the third and fourth side surfaces.

4. The semiconductor device of claim 1, wherein the gate cutting pattern comprises a first side portion comprising the first side surface and having a first width, a second side portion comprising the second side surface and having a second width, and a center portion between the first and second side portions and having a third width, wherein the first, second, and third widths are in the first direction and the third width is greater than each of the first and second widths.

5. The semiconductor device of claim 1, wherein each of the gate spacers comprises a first gate spacer and a second gate spacer that are sequentially stacked on each of the first and second side surfaces,
   a dielectric constant of the first gate spacer is lower than a dielectric constant of the second gate spacer, and
   a level of a first top surface of the first gate spacer is different from a level of a second top surface of the second gate spacer, relative to the substrate.

6. The semiconductor device of claim 5, wherein the gate capping pattern extends on the first top surface and the second top surface.

7. The semiconductor device of claim 5, wherein the second top surface is closer to the substrate than the first top surface and/or the top surface of the gate electrode.

8. The semiconductor device of claim 1, wherein the top surface of the gate cutting pattern is closer to the substrate than the top surface of the gate electrode.

9. The semiconductor device of claim 1, wherein the gate capping pattern comprises:
a first portion between the gate spacers;
a second portion on the first portion and on the top surfaces of the gate spacers; and
a third portion below the first portion and on the top surface of the gate cutting pattern,
wherein a width of the first portion is greater than a width of the third portion but is less than a width of the second portion.

10. The semiconductor device of claim 1, wherein a greatest width of the gate cutting pattern in the second direction is substantially equal to a distance between the gate spacers.

11. A semiconductor device, comprising:
a substrate comprising a first logic cell and a second logic cell adjacent to each other in a first direction;
a first active pattern on the first logic cell and a second active pattern on the second logic cell;
a first gate electrode on the first active pattern and a second gate electrode on the second active pattern, the second gate electrode being aligned with the first gate electrode in the first direction;
a gate cutting pattern adjacent a boundary between the first and second logic cells and extending between the first and second gate electrodes;
gate spacers extending in the first direction; and
a gate capping pattern on the first and second gate electrodes and the gate cutting pattern, and extending in the first direction,
wherein the gate spacers extend on opposing side surfaces of the first gate electrode, opposing side surfaces of the second gate electrode, and opposing side surfaces of the gate cutting pattern,
wherein the gate capping pattern extends on a top surface of the first gate electrode, a top surface of the second gate electrode, and a top surface of the gate cutting pattern that is between the first and second gate electrodes in the first direction,
wherein each of the gate spacers comprises a first gate spacer and a second gate spacer having a dielectric constant higher than the first gate spacer,
wherein the first gate spacer is between the gate cutting pattern and the second gate spacer and the top surface of the gate cutting pattern is closer to the substrate than the top surface of the first gate spacer, and
wherein the gate capping pattern is on a top surface of the first gate spacer and a top surface of the second gate spacer.

12. The semiconductor device of claim 11, wherein portions of the gate capping pattern on the top surface of the first and/or second gate spacers extend toward the substrate beyond the top surfaces of the first and second gate electrodes.

13. The semiconductor device of claim 11, wherein the top surface of the first gate spacer is farther from the substrate than each of the top surface of the first gate electrode and the top surface of the second gate spacer.

14. The semiconductor device of claim 11, further comprising:
a first metal layer on the gate capping pattern,
wherein the first metal layer comprises a power line adjacent a boundary between the first and second logic cells, and
the gate cutting pattern is vertically overlapped with the power line.

15. A semiconductor device, comprising:
a substrate comprising a logic cell having a PMOSFET region and an NMOSFET region separated from each other in a first direction, a periphery of the logic cell comprising first and second boundaries opposite to each other in a second direction crossing the first direction, and third and fourth boundaries opposite to each other in the first direction;
a device isolation layer on the substrate and defining a first active pattern on the PMOSFET region and a second active pattern on the NMOSFET region, the first and second active patterns extending in the second direction, an upper portion of each of the first and second active patterns protruding away from the substrate and beyond the device isolation layer;
a gate electrode extending in the first direction and crossing the first and second active patterns;
first and second source/drain patterns on the first and second active patterns, respectively;
gate spacers on opposing side surfaces of the gate electrode and extending in the first direction;
a division structure adjacent at least one of the first or second boundaries;
a gate cutting pattern adjacent at least one of the third or fourth boundaries, wherein the gate cutting pattern extends between the gate spacers;
a gate insulating layer between the gate electrode and the first and second active patterns and between the gate electrode and the gate cutting pattern;
a gate capping pattern on a top surface of the gate electrode, a top surface of the gate cutting pattern, and top surfaces of the gate spacers and extending in the first direction;
an interlayer insulating layer on the gate capping pattern;
an active contact that penetrates the interlayer insulating layer and is electrically connected to at least one of the first or second source/drain patterns;
a gate contact that penetrates the interlayer insulating layer and the gate capping pattern and is electrically connected to the gate electrode;
a first metal layer on the interlayer insulating layer, the first metal layer comprising a power line vertically overlapping the gate cutting pattern, and first interconnection lines electrically connected to the active and gate contacts, respectively; and
a second metal layer on the first metal layer,
wherein the second metal layer comprises second interconnection lines electrically connected to the first metal layer,
wherein the gate cutting pattern comprises a first side surface and a second side surface, which are opposite to each other in the second direction and are in contact with respective ones of the gate spacers, and
wherein the top surface of the gate cutting pattern is closer to the substrate than the top surfaces of the gate spacers.

16. The semiconductor device of claim 15, wherein each of the gate spacers comprises a first gate spacer and a second gate spacer having a dielectric constant higher than the first gate spacer,
the first gate spacer is between the gate cutting pattern and the second gate spacer, and
a bottom of the gate capping pattern extends on a top surface of the first gate spacer and a top surface of the second gate spacer, and a sidewall of the active contact extends along a sidewall of the gate capping pattern.

17. The semiconductor device of claim 15, wherein the gate cutting pattern comprises a first side portion comprising the first side surface and having a first width, a second side portion comprising the second side surface and having a second width, and a center portion between the first and second side portions and having a third width, wherein the first, second, and third widths are in the first direction and the third width is greater than each of the first width and the second width.

18. The semiconductor device of claim 15, wherein the top surface of the gate cutting pattern is closer to the substrate than the top surface of the gate electrode.

19. The semiconductor device of claim 15, wherein the gate capping pattern comprises:
- a first portion between the gate spacers;
- a second portion on the first portion and on the top surfaces of the gate spacers; and
- a third portion below the first portion and on the top surface of the gate cutting pattern,
- wherein a width of the first portion is greater than a width of the third portion but is less than a width of the second portion.

* * * * *